(12) United States Patent
Yohannes et al.

(10) Patent No.: US 12,317,757 B2
(45) Date of Patent: May 27, 2025

(54) SYSTEM AND METHOD FOR SUPERCONDUCTING MULTI-CHIP MODULE

(71) Applicant: SeeQC, Inc., Elmsford, NY (US)

(72) Inventors: Daniel Yohannes, Stamford, CT (US); Denis Amparo, White Plains (PH); Oleksandr Chernyashevskyy, White Plains, NY (US); Oleg Mukhanov, Putnam Valley, NY (US); Mario Renzullo, Yonkers, NY (US); Andrei Talalaeskii, Mahopac, NY (US); Igor Vernik, Yorktown Heights, NY (US); John Vivalda, Poughkeepsie, NY (US); Jason Walter, Trumbull, CT (US)

(73) Assignee: SeeQC, Inc., Elmsford, NY (US)

( * ) Notice: Subject to any disclaimer, the term of this patent is extended or adjusted under 35 U.S.C. 154(b) by 0 days.

(21) Appl. No.: 18/357,814

(22) Filed: Jul. 24, 2023

(65) Prior Publication Data

US 2023/0380302 A1    Nov. 23, 2023

Related U.S. Application Data

(63) Continuation of application No. 17/472,821, filed on Sep. 13, 2021, now Pat. No. 11,711,985, which is a
(Continued)

(51) Int. Cl.
*H01L 29/06* (2006.01)
*H01L 23/00* (2006.01)
(Continued)

(52) U.S. Cl.
CPC ........... *H10N 60/815* (2023.02); *H01L 24/05* (2013.01); *H01L 24/13* (2013.01); *H01L 24/81* (2013.01);
(Continued)

(58) Field of Classification Search
CPC ....... H01L 39/045; H01L 24/05; H01L 24/13; H01L 24/81; H01L 39/223;
(Continued)

(56) References Cited

U.S. PATENT DOCUMENTS

| | | |
|---|---|---|
| 4,039,833 A | 8/1977 | Thom |
| 4,354,109 A | 10/1982 | White |

(Continued)

*Primary Examiner* — Niki H Nguyen
(74) *Attorney, Agent, or Firm* — Hoffberg & Associates; Steven M. Hoffberg

(57) ABSTRACT

A method for bonding two superconducting integrated circuits ("chips"), such that the bonds electrically interconnect the chips. A plurality of indium-coated metallic posts may be deposited on each chip. The indium bumps are aligned and compressed with moderate pressure at a temperature at which the indium is deformable but not molten, forming fully superconducting connections between the two chips when the indium is cooled down to the superconducting state. An anti-diffusion layer may be applied below the indium bumps to block reaction with underlying layers. The method is scalable to a large number of small contacts on the wafer scale, and may be used to manufacture a multi-chip module comprising a plurality of chips on a common carrier. Superconducting classical and quantum computers and superconducting sensor arrays may be packaged.

22 Claims, 17 Drawing Sheets

Related U.S. Application Data continuation of application No. 16/599,985, filed on Oct. 11, 2019, now Pat. No. 11,121,302.

(60) Provisional application No. 62/744,494, filed on Oct. 11, 2018.

(51) Int. Cl.
*H01L 29/08* (2006.01)
*H01L 31/0256* (2006.01)
*H10N 60/01* (2023.01)
*H10N 60/12* (2023.01)
*H10N 60/81* (2023.01)

(52) U.S. Cl.
CPC ......... *H10N 60/0912* (2023.02); *H10N 60/12* (2023.02); *H01L 2224/0401* (2013.01); *H01L 2224/05179* (2013.01); *H01L 2224/13083* (2013.01); *H01L 2224/13109* (2013.01); *H01L 2224/13147* (2013.01); *H01L 2224/13166* (2013.01); *H01L 2224/13179* (2013.01); *H01L 2224/8109* (2013.01); *H01L 2224/8112* (2013.01); *H01L 2224/81203* (2013.01); *H01L 2924/04941* (2013.01); *H01L 2924/0495* (2013.01)

(58) Field of Classification Search
CPC ......... H01L 39/2493; H01L 2224/0401; H01L 2224/05179; H01L 2224/13083; H01L 2224/13109; H01L 2224/13147; H01L 2224/13166; H01L 2224/13179; H01L 2224/8109; H01L 2224/8112; H01L 2224/81203; H01L 2924/04941; H01L 2924/0495; H01L 2924/014; H01L 2224/131; H01L 2924/01029; H01L 2924/01049; H01L 24/11; H01L 24/16; H01L 2224/81201; H01L 25/0753; H01L 27/14636; H01L 2224/13609; H01L 2224/292; H01L 2224/0558; H01L 2224/1134; H01L 25/0657; H01L 2224/16238; H01L 2224/49174; H01L 2224/73253; H01L 2224/83801
See application file for complete search history.

(56) References Cited

U.S. PATENT DOCUMENTS

| | | | |
|---|---|---|---|
| 4,447,291 A | 5/1984 | Schulte | |
| 4,479,139 A | 10/1984 | Parrish | |
| 4,551,629 A | 11/1985 | Carson | |
| 4,573,627 A | 3/1986 | Miller | |
| 4,614,960 A | 9/1986 | Bluzer | |
| 4,672,737 A | 6/1987 | Carson | |
| 4,706,166 A | 11/1987 | Go | |
| 4,718,028 A | 1/1988 | Gussin | |
| 4,740,700 A | 4/1988 | Shaham | |
| 4,782,028 A | 11/1988 | Farrier | |
| 4,803,363 A | 2/1989 | Gaalema | |
| 4,804,132 A | 2/1989 | DiFrancesco | |
| 4,807,000 A | 2/1989 | Gurnee | |
| 4,817,850 A | 4/1989 | Wiener-Avnear | |
| 4,833,515 A | 5/1989 | Baker | |
| 4,845,540 A | 7/1989 | Baker | |
| 4,865,245 A | 9/1989 | Schulte | |
| 4,868,902 A | 9/1989 | Sato | |
| 4,905,265 A | 2/1990 | Cox | |
| 4,910,154 A | 3/1990 | Zanio | |
| 4,912,545 A | 3/1990 | Go | |
| 4,929,913 A | 5/1990 | Sato | |
| 4,930,001 A * | 5/1990 | Williams | H01L 24/11 228/123.1 |
| 4,935,627 A | 6/1990 | Zimmermann | |
| 4,956,695 A | 9/1990 | Robinson | |
| 4,964,701 A | 10/1990 | Dorschner | |
| 4,965,649 A | 10/1990 | Zanio | |
| 4,980,555 A | 12/1990 | Hartley | |
| 4,998,688 A | 3/1991 | Longerich | |
| 4,999,486 A | 3/1991 | Falk | |
| 5,001,532 A | 3/1991 | Petroff | |
| 5,015,858 A | 5/1991 | Augustine | |
| 5,021,854 A | 6/1991 | Huth | |
| 5,043,582 A | 8/1991 | Cox | |
| 5,045,681 A | 9/1991 | Elrod | |
| 5,070,241 A | 12/1991 | Jack | |
| 5,075,201 A | 12/1991 | Koh | |
| 5,075,553 A | 12/1991 | Noble | |
| 5,091,288 A | 2/1992 | Zappella | |
| 5,092,036 A | 3/1992 | Hu | |
| 5,111,050 A | 5/1992 | Maassen | |
| 5,113,076 A | 5/1992 | Schulte | |
| 5,120,960 A | 6/1992 | Halvis | |
| 5,128,534 A | 7/1992 | Wyles | |
| 5,132,763 A | 7/1992 | Maserjian | |
| 5,140,324 A | 8/1992 | Przybysz | |
| 5,141,334 A | 8/1992 | Castles | |
| 5,146,302 A | 9/1992 | Kumada | |
| 5,149,671 A | 9/1992 | Koh | |
| 5,149,954 A | 9/1992 | Pettijohn | |
| 5,168,338 A | 12/1992 | Kumada | |
| 5,170,080 A | 12/1992 | Murphy | |
| 5,185,613 A | 2/1993 | Whatmore | |
| 5,186,379 A | 2/1993 | Helber, Jr. | |
| 5,198,815 A | 3/1993 | Przybysz | |
| 5,201,582 A | 4/1993 | Lesniak | |
| 5,227,656 A | 7/1993 | Timlin | |
| 5,233,242 A | 8/1993 | Murphy | |
| 5,233,243 A | 8/1993 | Murphy | |
| 5,235,176 A | 8/1993 | Noble | |
| 5,236,871 A | 8/1993 | Fossum | |
| 5,245,191 A | 9/1993 | Barber | |
| 5,256,636 A | 10/1993 | Wellstood | |
| 5,264,699 A | 11/1993 | Barton | |
| 5,269,453 A | 12/1993 | Melton | |
| 5,279,974 A | 1/1994 | Walsh | |
| 5,289,400 A | 2/1994 | Przybysz | |
| 5,290,423 A | 3/1994 | Helber, Jr. | |
| 5,291,035 A | 3/1994 | Wellstood | |
| 5,293,036 A | 3/1994 | Norton | |
| 5,294,789 A | 3/1994 | Kruger | |
| 5,296,384 A | 3/1994 | Cockrum | |
| 5,300,777 A | 4/1994 | Goodwin | |
| 5,304,500 A | 4/1994 | Timlin | |
| 5,306,386 A | 4/1994 | de Lyon | |
| 5,308,980 A | 5/1994 | Barton | |
| 5,311,010 A | 5/1994 | Kruger | |
| 5,322,816 A | 6/1994 | Pinter | |
| 5,327,005 A | 7/1994 | Granneman | |
| 5,327,130 A | 7/1994 | Kang | |
| 5,336,879 A | 8/1994 | Sauer | |
| 5,340,984 A | 8/1994 | Evans | |
| 5,341,136 A | 8/1994 | Przybysz | |
| 5,347,086 A | 9/1994 | Potter | |
| 5,365,088 A | 11/1994 | Myrosznyk | |
| 5,376,558 A | 12/1994 | Sudo | |
| 5,376,793 A | 12/1994 | Lesniak | |
| 5,379,336 A | 1/1995 | Kramer | |
| 5,380,669 A | 1/1995 | Norton | |
| 5,381,784 A | 1/1995 | Adair | |
| 5,382,542 A | 1/1995 | Zinck | |
| 5,382,977 A | 1/1995 | Kozlowski | |
| 5,384,267 A | 1/1995 | Hutchins | |
| 5,386,128 A | 1/1995 | Fossum | |
| 5,388,068 A | 2/1995 | Ghoshal | |
| 5,389,792 A | 2/1995 | DiMarzio | |
| 5,389,837 A | 2/1995 | Hietala | |
| 5,391,868 A | 2/1995 | Vampola | |
| 5,393,696 A | 2/1995 | Koh | |
| 5,399,206 A | 3/1995 | de Lyon | |
| 5,401,986 A | 3/1995 | Cockrum | |
| 5,404,006 A | 4/1995 | Schaffner | |

(56) References Cited

U.S. PATENT DOCUMENTS

| | | |
|---|---|---|
| 5,406,701 A | 4/1995 | Pepe |
| 5,414,294 A | 5/1995 | Granneman |
| 5,426,072 A | 6/1995 | Finnila |
| 5,426,303 A | 6/1995 | Owen |
| 5,426,304 A | 6/1995 | Belcher |
| 5,432,374 A | 7/1995 | Norton |
| 5,436,450 A | 7/1995 | Belcher |
| 5,440,130 A | 8/1995 | Cox |
| 5,444,280 A | 8/1995 | Blouke |
| 5,446,529 A | 8/1995 | Stettner |
| 5,449,908 A | 9/1995 | Wadsworth |
| 5,449,944 A | 9/1995 | Sudo |
| 5,457,318 A | 10/1995 | Robinson |
| 5,475,224 A | 12/1995 | Koh |
| 5,477,173 A | 12/1995 | Schlesselmann |
| 5,483,088 A | 1/1996 | Chen |
| 5,485,010 A | 1/1996 | Owen |
| 5,488,504 A | 1/1996 | Worchesky |
| 5,489,776 A | 2/1996 | Lung |
| 5,494,483 A | 2/1996 | Adair |
| 5,495,114 A | 2/1996 | Adair |
| 5,502,300 A | 3/1996 | McKeag |
| 5,512,750 A | 4/1996 | Yanka |
| 5,519,529 A | 5/1996 | Ahearn |
| 5,523,570 A | 6/1996 | Hairston |
| 5,523,628 A | 6/1996 | Williams |
| 5,525,867 A | 6/1996 | Williams |
| 5,539,206 A | 7/1996 | Schimert |
| 5,541,914 A | 7/1996 | Krishnamoorthy |
| 5,543,641 A | 8/1996 | Wadsworth |
| 5,559,332 A | 9/1996 | Meissner |
| 5,559,336 A | 9/1996 | Kosai |
| 5,561,593 A | 10/1996 | Rotolante |
| 5,567,942 A | 10/1996 | Lee |
| 5,567,975 A | 10/1996 | Walsh |
| 5,568,574 A | 10/1996 | Tanguay, Jr. |
| 5,572,029 A | 11/1996 | Walker |
| 5,574,282 A | 11/1996 | Walker |
| 5,578,826 A | 11/1996 | Walker |
| 5,581,084 A | 12/1996 | Chapman |
| 5,582,485 A | 12/1996 | Lesniak |
| 5,591,678 A | 1/1997 | Bendik |
| 5,598,105 A | 1/1997 | Kurosawa |
| 5,604,977 A | 2/1997 | Robinson |
| 5,608,208 A | 3/1997 | Nemirovsky |
| 5,621,227 A | 4/1997 | Joshi |
| 5,627,112 A | 5/1997 | Tennant |
| 5,629,524 A | 5/1997 | Stettner |
| 5,629,889 A | 5/1997 | Chandra |
| 5,633,203 A | 5/1997 | Adair |
| 5,646,426 A | 7/1997 | Cockrum |
| 5,652,150 A | 7/1997 | Wadsworth |
| 5,661,267 A | 8/1997 | Isaak |
| 5,661,590 A | 8/1997 | Almogy |
| 5,672,545 A | 9/1997 | Trautt |
| 5,696,577 A | 12/1997 | Stettner |
| 5,701,010 A | 12/1997 | Martin |
| 5,708,269 A | 1/1998 | Meissner |
| 5,721,429 A | 2/1998 | Radford |
| 5,731,621 A | 3/1998 | Kosai |
| 5,732,706 A | 3/1998 | White |
| 5,734,156 A | 3/1998 | Dahlin |
| 5,742,060 A | 4/1998 | Ashburn |
| 5,742,089 A | 4/1998 | Rajavel |
| 5,751,049 A | 5/1998 | Goodwin |
| 5,754,009 A | 5/1998 | Hayes |
| 5,773,831 A | 6/1998 | Brouns |
| 5,781,009 A | 7/1998 | Lee |
| 5,786,597 A | 7/1998 | Lingren |
| 5,793,055 A | 8/1998 | Kastalsky |
| 5,794,331 A | 8/1998 | Ravetto |
| 5,801,681 A | 9/1998 | Sayag |
| 5,808,329 A | 9/1998 | Jack |
| 5,811,808 A | 9/1998 | Cannata |
| 5,818,373 A | 10/1998 | Semenov |
| 5,825,033 A | 10/1998 | Barrett |
| 5,827,771 A | 10/1998 | Ginn |
| 5,832,599 A | 11/1998 | Isaak |
| 5,847,396 A | 12/1998 | Lingren |
| 5,880,010 A | 3/1999 | Davidson |
| 5,880,510 A | 3/1999 | Cockrum |
| 5,900,630 A | 5/1999 | Tang |
| 5,900,799 A | 5/1999 | Morris |
| 5,904,495 A | 5/1999 | Burke |
| 5,912,942 A | 6/1999 | Schick |
| 5,917,322 A | 6/1999 | Gershenfeld |
| 5,920,464 A | 7/1999 | Yokoyama |
| 5,930,330 A | 7/1999 | Wolfe |
| 5,936,268 A | 8/1999 | Cockrum |
| 5,936,458 A | 8/1999 | Rylov |
| 5,949,081 A | 9/1999 | Ashley |
| 5,952,646 A | 9/1999 | Spartiotis |
| 5,959,339 A | 9/1999 | Chapman |
| 5,963,351 A | 10/1999 | Kaplounenko |
| 5,965,899 A | 10/1999 | Little, Jr. |
| 5,982,219 A | 11/1999 | Kirichenko |
| 5,985,692 A | 11/1999 | Poenisch |
| 6,023,161 A | 2/2000 | Dantsker |
| 6,045,614 A | 4/2000 | de Lyon |
| 6,054,718 A | 4/2000 | Dodd |
| 6,057,552 A | 5/2000 | Stettner |
| 6,068,818 A | 5/2000 | Ackley |
| 6,069,935 A | 5/2000 | Schick |
| 6,080,984 A | 6/2000 | Friesenhahn |
| 6,091,070 A | 7/2000 | Lingren |
| 6,104,046 A | 8/2000 | Borenstain |
| 6,107,619 A | 8/2000 | Cunningham |
| 6,115,789 A | 9/2000 | Durham |
| 6,121,618 A | 9/2000 | Morris |
| 6,133,989 A | 10/2000 | Stettner |
| 6,157,042 A | 12/2000 | Dodd |
| 6,159,149 A | 12/2000 | Erikson |
| 6,166,370 A | 12/2000 | Sayag |
| 6,166,438 A | 12/2000 | Davidson |
| 6,172,362 B1 | 1/2001 | Lingren |
| 6,175,611 B1 | 1/2001 | Melen |
| 6,175,749 B1 | 1/2001 | Wordenweber |
| 6,184,538 B1 | 2/2001 | Bandara |
| 6,188,236 B1 | 2/2001 | Wikborg |
| 6,194,715 B1 | 2/2001 | Lingren |
| 6,194,726 B1 | 2/2001 | Pi |
| 6,198,101 B1 | 3/2001 | Brown |
| 6,211,529 B1 | 4/2001 | Gunapala |
| 6,216,941 B1 | 4/2001 | Yokoyama |
| 6,225,059 B1 | 5/2001 | Ackley |
| 6,242,939 B1 | 6/2001 | Nagasawa |
| 6,254,827 B1 | 7/2001 | Ackley |
| 6,255,643 B1 | 7/2001 | Sayag |
| 6,315,953 B1 | 11/2001 | Ackley |
| 6,320,177 B1 | 11/2001 | Sayag |
| 6,325,757 B1 | 12/2001 | Erikson |
| 6,328,421 B1 | 12/2001 | Kojima |
| 6,331,274 B1 | 12/2001 | Ackley |
| 6,331,805 B1 | 12/2001 | Gupta |
| 6,335,622 B1 | 1/2002 | James |
| 6,342,700 B1 | 1/2002 | Izumi |
| 6,345,189 B1 | 2/2002 | Wördenweber |
| 6,345,190 B1 | 2/2002 | Wördenweber |
| 6,346,700 B1 | 2/2002 | Cunningham |
| 6,353,330 B1 | 3/2002 | Kanda |
| 6,355,939 B1 | 3/2002 | Dodd |
| 6,369,404 B1 | 4/2002 | Kane |
| 6,388,600 B1 | 5/2002 | Johnson |
| 6,393,327 B1 | 5/2002 | Scribner |
| 6,410,917 B1 | 6/2002 | Choi |
| 6,417,514 B1 | 7/2002 | Eneim |
| 6,420,895 B1 | 7/2002 | Herr |
| 6,437,413 B1 | 8/2002 | Yamaguchi |
| 6,450,615 B2 | 9/2002 | Kojima |
| 6,455,908 B1 | 9/2002 | Johnson |
| 6,459,097 B1 | 10/2002 | Zagoskin |
| 6,465,344 B1 | 10/2002 | Barton |
| 6,472,681 B1 | 10/2002 | Kane |
| 6,479,139 B1 | 11/2002 | Claeson |

(56) References Cited

U.S. PATENT DOCUMENTS

| | | |
|---|---|---|
| 6,486,694 B1 | 11/2002 | Kirichenko |
| 6,486,756 B2 | 11/2002 | Tarutani |
| 6,495,854 B1 | 12/2002 | Newns |
| 6,501,092 B1 | 12/2002 | Nikonov |
| 6,504,172 B2 | 1/2003 | Zagoskin |
| 6,507,234 B1 | 1/2003 | Johnson |
| 6,509,853 B2 | 1/2003 | Gupta |
| 6,518,786 B2 | 2/2003 | Herr |
| 6,525,387 B2 | 2/2003 | Bauer |
| 6,526,491 B2 | 2/2003 | Suzuoki |
| 6,531,700 B1 | 3/2003 | Brown |
| 6,537,847 B2 | 3/2003 | Zagoskin |
| 6,538,445 B2 | 3/2003 | James |
| 6,540,961 B1 | 4/2003 | Ackley |
| 6,541,763 B2 | 4/2003 | Lingren |
| 6,545,289 B1 | 4/2003 | Gunapala |
| 6,549,059 B1 | 4/2003 | Johnson |
| 6,550,665 B1 | 4/2003 | Parrish |
| 6,552,343 B1 | 4/2003 | Linder |
| 6,555,890 B2 | 4/2003 | Dries |
| 6,563,310 B2 | 5/2003 | Zagoskin |
| 6,563,311 B2 | 5/2003 | Zagoskin |
| 6,566,679 B2 | 5/2003 | Nikonov |
| 6,573,202 B2 | 6/2003 | Ivanov |
| 6,576,951 B2 | 6/2003 | Ivanov |
| 6,580,102 B2 | 6/2003 | Ivanov |
| 6,605,822 B1 | 8/2003 | Blais |
| 6,608,581 B1 | 8/2003 | Semenov |
| 6,614,047 B2 | 9/2003 | Tzalenchuk |
| 6,621,097 B2 | 9/2003 | Nikonov |
| 6,626,995 B2 | 9/2003 | Kim |
| 6,627,915 B1 | 9/2003 | Ustinov |
| 6,627,916 B2 | 9/2003 | Amin |
| 6,630,426 B1 | 10/2003 | Ference |
| 6,630,735 B1 | 10/2003 | Carlson |
| 6,642,537 B1 | 11/2003 | Gunapala |
| 6,647,297 B2 | 11/2003 | Scribner |
| 6,649,929 B2 | 11/2003 | Newns |
| 6,657,194 B2 | 12/2003 | Ashokan |
| 6,670,630 B2 | 12/2003 | Blais |
| 6,689,628 B1 | 2/2004 | DePaulis |
| 6,703,857 B2 | 3/2004 | Kameda |
| 6,715,118 B2 | 3/2004 | Kaiser |
| 6,724,216 B2 | 4/2004 | Suzuki |
| 6,725,248 B1 | 4/2004 | Hasegawa |
| 6,727,702 B2 | 4/2004 | Hammond |
| 6,728,131 B2 | 4/2004 | Ustinov |
| 6,734,452 B2 | 5/2004 | Gunapala |
| 6,734,454 B2 | 5/2004 | Van Duzer |
| 6,734,699 B1 | 5/2004 | Herr |
| 6,740,864 B1 | 5/2004 | Dries |
| 6,743,657 B2 | 6/2004 | Dries |
| 6,753,546 B2 | 6/2004 | Tzalenchuk |
| 6,754,823 B1 | 6/2004 | Kurzweil |
| 6,756,925 B1 | 6/2004 | Leung |
| 6,759,974 B1 | 7/2004 | Herr |
| 6,763,363 B1 | 7/2004 | Driscoll |
| 6,773,836 B2 | 8/2004 | Kim |
| 6,777,312 B2 | 8/2004 | Yang |
| 6,781,435 B1 | 8/2004 | Gupta |
| 6,784,451 B2 | 8/2004 | Amin |
| 6,791,109 B2 | 9/2004 | Tzalenchuk |
| 6,797,341 B2 | 9/2004 | Zeng |
| 6,800,837 B1 | 10/2004 | Ichimura |
| 6,803,557 B1 | 10/2004 | Taylor |
| 6,803,599 B2 | 10/2004 | Amin |
| 6,809,734 B2 | 10/2004 | Suzuoki |
| 6,812,464 B1 | 11/2004 | Sobolewski |
| 6,812,484 B2 | 11/2004 | Tzalenchuk |
| 6,813,056 B2 | 11/2004 | Cottrell |
| 6,819,463 B2 | 11/2004 | Noonan |
| 6,821,729 B2 | 11/2004 | Ackley |
| 6,822,255 B2 | 11/2004 | Tzalenchuk |
| 6,826,662 B2 | 11/2004 | Suzuoki |
| 6,838,694 B2 | 1/2005 | Esteve |
| 6,838,749 B2 | 1/2005 | Ference |
| 6,852,976 B2 | 2/2005 | Barton |
| 6,864,552 B2 | 3/2005 | Razeghi |
| 6,865,639 B2 | 3/2005 | Herr |
| 6,875,975 B2 | 4/2005 | Faska |
| 6,879,012 B2 | 4/2005 | Tang |
| 6,885,002 B1 | 4/2005 | Finch |
| 6,885,325 B2 | 4/2005 | Omelyanchouk |
| 6,897,447 B2 | 5/2005 | Mitra |
| 6,897,468 B2 | 5/2005 | Blais |
| 6,900,454 B2 | 5/2005 | Blais |
| 6,900,456 B2 | 5/2005 | Blais |
| 6,905,887 B2 | 6/2005 | Amin |
| 6,909,109 B2 | 6/2005 | Herr |
| 6,910,382 B2 | 6/2005 | Tang |
| 6,911,664 B2 | 6/2005 | Il'ichev et al. |
| 6,917,216 B2 | 7/2005 | Herr |
| 6,917,537 B2 | 7/2005 | Bunyk |
| 6,919,579 B2 | 7/2005 | Amin |
| 6,926,190 B2 | 8/2005 | Jiang |
| 6,926,921 B2 | 8/2005 | Stasiak |
| 6,927,383 B2 | 8/2005 | Toth |
| 6,930,318 B2 | 8/2005 | Vion |
| 6,930,319 B2 | 8/2005 | DePaulis |
| 6,930,320 B2 | 8/2005 | Blais |
| 6,936,841 B2 | 8/2005 | Amin |
| 6,943,368 B2 | 9/2005 | Amin |
| 6,946,428 B2 | 9/2005 | Rey |
| 6,949,748 B2 | 9/2005 | Ziock |
| 6,960,780 B2 | 11/2005 | Blais |
| 6,967,345 B1 | 11/2005 | Gunapala |
| 6,970,745 B2 | 11/2005 | Scribner |
| 6,979,836 B2 | 12/2005 | Zagoskin |
| 6,984,846 B2 | 1/2006 | Newns |
| 6,987,282 B2 | 1/2006 | Amin |
| 6,988,058 B1 | 1/2006 | Sherwin |
| 7,001,794 B2 | 2/2006 | Razeghi |
| 7,002,174 B2 | 2/2006 | Il'ichev et al. |
| 7,002,366 B2 | 2/2006 | Eaton |
| 7,015,499 B1 | 3/2006 | Zagoskin |
| 7,015,715 B2 | 3/2006 | Parrish |
| 7,018,852 B2 | 3/2006 | Wu |
| 7,042,005 B2 | 5/2006 | Il'ichev et al. |
| 7,049,593 B2 | 5/2006 | Sobolewski |
| 7,052,927 B1 | 5/2006 | Fletcher |
| 7,054,410 B2 | 5/2006 | Zentai |
| 7,069,282 B2 | 6/2006 | Rizzotto |
| 7,073,087 B2 | 7/2006 | Horie |
| 7,078,694 B2 | 7/2006 | Polonsky |
| 7,090,889 B2 | 8/2006 | Liu |
| 7,093,104 B2 | 8/2006 | Suzuoki |
| 7,095,028 B2 | 8/2006 | Mollov |
| 7,095,227 B2 | 8/2006 | Tarutani |
| 7,109,593 B2 | 9/2006 | Freedman |
| 7,113,967 B2 | 9/2006 | Cleve |
| 7,122,837 B2 | 10/2006 | Linares |
| 7,124,259 B2 | 10/2006 | Yasue |
| 7,129,104 B2 | 10/2006 | Gunapala |
| 7,129,489 B2 | 10/2006 | Pham |
| 7,129,869 B2 | 10/2006 | Furuta |
| 7,129,870 B2 | 10/2006 | Hirano |
| 7,135,697 B2 | 11/2006 | Friesen |
| 7,135,698 B2 | 11/2006 | Mitra |
| 7,135,701 B2 | 11/2006 | Amin |
| 7,139,882 B2 | 11/2006 | Suzuoki |
| 7,145,170 B2 | 12/2006 | Yamamoto |
| 7,145,721 B2 | 12/2006 | Banish |
| 7,164,702 B1 | 1/2007 | Liu |
| 7,170,960 B2 | 1/2007 | Herr |
| 7,180,066 B2 | 2/2007 | Qiu |
| 7,180,087 B1 | 2/2007 | Loss |
| 7,180,579 B1 | 2/2007 | Ludwig |
| 7,180,645 B2 | 2/2007 | Azuma |
| 7,184,555 B2 | 2/2007 | Whaley |
| 7,190,165 B2 | 3/2007 | Hammond |
| 7,203,715 B2 | 4/2007 | Rizzotto |
| 7,206,062 B2 | 4/2007 | Asbrock |
| 7,217,926 B1 | 5/2007 | Choi |
| 7,217,982 B2 | 5/2007 | Taylor |

(56) References Cited

U.S. PATENT DOCUMENTS

| | | | |
|---|---|---|---|
| 7,218,184 B2 | 5/2007 | Yamanaka |
| 7,223,981 B1 | 5/2007 | Capote |
| 7,227,480 B2 | 6/2007 | Furuta |
| 7,230,266 B2 | 6/2007 | Hilton |
| 7,231,500 B2 | 6/2007 | Suzuoki |
| 7,233,998 B2 | 6/2007 | Suzuoki |
| 7,236,998 B2 | 6/2007 | Nutter |
| 7,241,419 B2 | 7/2007 | Ackley |
| 7,249,518 B2 | 7/2007 | Tang |
| 7,250,624 B1 | 7/2007 | Freedman |
| 7,253,654 B2 | 8/2007 | Amin |
| 7,268,081 B2 | 9/2007 | Yang |
| 7,268,576 B2 | 9/2007 | Amin |
| 7,268,713 B2 | 9/2007 | Suzuki |
| 7,280,623 B2 | 10/2007 | Gupta |
| 7,304,646 B2 | 12/2007 | Iwata |
| 7,307,275 B2 | 12/2007 | Lidar |
| 7,310,623 B2 | 12/2007 | Beausoleil |
| 7,312,562 B2 | 12/2007 | Dahl |
| 7,313,199 B2 | 12/2007 | Gupta |
| 7,321,884 B2 | 1/2008 | Burkard |
| 7,321,958 B2 | 1/2008 | Hofstee |
| 7,332,738 B2 | 2/2008 | Blais |
| 7,333,181 B1 | 2/2008 | Scott |
| 7,334,008 B2 | 2/2008 | Branciforte |
| 7,335,909 B2 | 2/2008 | Amin |
| 7,339,246 B2 | 3/2008 | Nascetti |
| 7,351,972 B2 | 4/2008 | D'Souza et al. |
| 7,359,928 B2 | 4/2008 | Porto |
| 7,360,102 B2 | 4/2008 | Inoue |
| 7,362,125 B2 | 4/2008 | Gupta |
| 7,364,923 B2 | 4/2008 | Lidar |
| 7,365,663 B2 | 4/2008 | Rylov |
| 7,386,687 B2 | 6/2008 | Inoue |
| 7,389,508 B2 | 6/2008 | Aguilar, Jr. |
| 7,392,511 B2 | 6/2008 | Brokenshire |
| 7,394,092 B2 | 7/2008 | Freedman |
| 7,395,411 B2 | 7/2008 | Kasahara |
| 7,400,282 B2 | 7/2008 | Tanaka |
| 7,402,835 B2 | 7/2008 | Liu |
| 7,408,572 B2 | 8/2008 | Baxter |
| 7,409,570 B2 | 8/2008 | Suzuoki |
| 7,410,763 B2 | 8/2008 | Su |
| 7,415,703 B2 | 8/2008 | Aguilar, Jr. |
| 7,418,283 B2 | 8/2008 | Amin |
| 7,425,308 B2 | 9/2008 | Ackley |
| 7,426,444 B2 | 9/2008 | Beausoleil |
| 7,428,562 B2 | 9/2008 | Beausoleil |
| 7,428,619 B2 | 9/2008 | Yasue |
| 7,436,494 B1 | 10/2008 | Kennedy |
| 7,437,533 B2 | 10/2008 | Ichimura |
| 7,437,536 B2 | 10/2008 | Iwamoto |
| 7,439,208 B2 | 10/2008 | Moeckly |
| 7,440,490 B2 | 10/2008 | Kidiyarova-Shevchenko |
| 7,443,719 B2 | 10/2008 | Kirichenko |
| 7,443,720 B2 | 10/2008 | Astafiev |
| 7,444,525 B2 | 10/2008 | Yoshihara |
| 7,444,632 B2 | 10/2008 | Minor |
| 7,453,129 B2 | 11/2008 | King |
| 7,453,162 B2 | 11/2008 | Freedman |
| 7,456,702 B2 | 11/2008 | Keefe |
| 7,457,939 B2 | 11/2008 | Suzuoki |
| 7,460,669 B2 | 12/2008 | Foden |
| 7,465,661 B2 | 12/2008 | Merritt |
| 7,468,504 B2 | 12/2008 | Halvis |
| 7,468,630 B2 | 12/2008 | Inamdar |
| 7,474,005 B2 | 1/2009 | Aksyuk |
| 7,474,010 B2 | 1/2009 | Freedman |
| 7,474,095 B2 | 1/2009 | Levitt |
| 7,475,257 B2 | 1/2009 | Aguilar, Jr. |
| 7,478,390 B2 | 1/2009 | Brokenshire |
| 7,479,652 B2 | 1/2009 | Greentree |
| 7,492,399 B1 | 2/2009 | Gulbransen |
| 7,496,673 B2 | 2/2009 | Gschwind |
| 7,496,917 B2 | 2/2009 | Brokenshire |
| 7,498,832 B2 | 3/2009 | Baumgardner |
| 7,501,877 B2 | 3/2009 | Furuta |
| 7,502,928 B2 | 3/2009 | Suzuoki |
| 7,505,310 B2 | 3/2009 | Nagasawa |
| 7,508,230 B2 | 3/2009 | Kirichenko |
| 7,509,457 B2 | 3/2009 | Altman |
| 7,511,753 B2 | 3/2009 | Hollier |
| 7,512,297 B2 | 3/2009 | Farah |
| 7,516,334 B2 | 4/2009 | Suzuoki |
| 7,516,456 B2 | 4/2009 | Aguilar, Jr. |
| 7,518,138 B2 | 4/2009 | Freedman |
| 7,521,224 B2 | 4/2009 | Johnson |
| 7,523,157 B2 | 4/2009 | Aguilar, Jr. |
| 7,525,202 B2 | 4/2009 | Freedman |
| 7,526,608 B2 | 4/2009 | Yasue |
| 7,529,717 B2 | 5/2009 | Vala |
| 7,531,809 B2 | 5/2009 | Capote |
| 7,532,242 B1 | 5/2009 | Chen |
| 7,533,068 B2 | 5/2009 | Maassen van den Brink |
| 7,541,584 B2 | 6/2009 | Antoszewski |
| 7,544,532 B2 | 6/2009 | Ginn |
| 7,546,405 B2 | 6/2009 | Terakawa |
| 7,547,932 B2 | 6/2009 | Zhang |
| 7,549,145 B2 | 6/2009 | Aguilar, Jr. |
| 7,550,759 B2 | 6/2009 | Hakonen |
| 7,551,059 B2 | 6/2009 | Farrier |
| 7,554,369 B2 | 6/2009 | Kirichenko |
| 7,565,653 B2 | 7/2009 | Inoue |
| 7,566,896 B2 | 7/2009 | Freedman |
| 7,570,075 B2 | 8/2009 | Gupta |
| 7,576,782 B2 | 8/2009 | Nakasuji |
| 7,579,424 B2 | 8/2009 | Keller |
| 7,579,594 B2 | 8/2009 | D'Souza et al. |
| 7,579,699 B2 | 8/2009 | Freedman |
| 7,586,074 B2 | 9/2009 | Gulbransen |
| 7,589,326 B2 | 9/2009 | Mollov |
| 7,592,593 B2 | 9/2009 | Kauffman |
| 7,598,514 B2 | 10/2009 | Freedman |
| 7,598,897 B2 | 10/2009 | Kirichenko |
| 7,605,050 B2 | 10/2009 | Bureau |
| 7,605,600 B2 | 10/2009 | Harris |
| 7,608,824 B2 | 10/2009 | Korsah |
| 7,608,906 B2 | 10/2009 | Tennant |
| 7,613,764 B1 | 11/2009 | Hilton |
| 7,613,765 B1 | 11/2009 | Hilton |
| 7,613,886 B2 | 11/2009 | Yamazaki |
| 7,614,053 B2 | 11/2009 | Inoue |
| 7,615,385 B2 | 11/2009 | Tolpygo |
| 7,619,437 B2 | 11/2009 | Thom |
| 7,624,088 B2 | 11/2009 | Johnson |
| 7,626,460 B2 | 12/2009 | Liu |
| 7,634,061 B1 | 12/2009 | Tümer |
| 7,639,035 B2 | 12/2009 | Berkley |
| 7,644,255 B2 | 1/2010 | Totsuka |
| 7,652,252 B1 | 1/2010 | Rajavel |
| 7,653,908 B2 | 1/2010 | Aguilar, Jr. |
| 7,671,341 B2 | 3/2010 | Jones |
| 7,676,683 B2 | 3/2010 | Tsuji |
| 7,680,474 B2 | 3/2010 | Kirichenko |
| 7,680,972 B2 | 3/2010 | Inoue |
| 7,685,601 B2 | 3/2010 | Iwamoto |
| 7,687,938 B2 | 3/2010 | Bunyk |
| 7,689,783 B2 | 3/2010 | Hofstee |
| 7,689,784 B2 | 3/2010 | Suzuoki |
| 7,689,814 B2 | 3/2010 | Okawa |
| 7,693,053 B2 | 4/2010 | Terakawa |
| 7,694,306 B2 | 4/2010 | Minor |
| 7,698,473 B2 | 4/2010 | Yamazaki |
| 7,700,710 B2 | 4/2010 | Keller |
| 7,701,286 B2 | 4/2010 | Gupta |
| 7,707,385 B2 | 4/2010 | Yamazaki |
| 7,714,605 B2 | 5/2010 | Baumgardner |
| 7,719,453 B2 | 5/2010 | Kim |
| 7,720,982 B2 | 5/2010 | Suzuoki |
| 7,723,815 B1 | 5/2010 | Peterson |
| 7,724,020 B2 | 5/2010 | Herr |
| 7,724,083 B2 | 5/2010 | Herring |
| 7,728,748 B1 | 6/2010 | Kirichenko |
| 7,730,456 B2 | 6/2010 | Okawa |

(56) References Cited

U.S. PATENT DOCUMENTS

| | | |
|---|---|---|
| 7,732,804 B2 | 6/2010 | Hollenberg |
| 7,733,253 B2 | 6/2010 | Kirichenko |
| 7,748,006 B2 | 6/2010 | Aguilar, Jr. |
| 7,749,922 B2 | 7/2010 | Bezryadin |
| 7,750,664 B2 | 7/2010 | Kirichenko |
| 7,755,023 B1 | 7/2010 | Rajavel |
| 7,764,568 B2 | 7/2010 | Lloyd |
| 7,767,976 B2 | 8/2010 | Allen |
| 7,768,287 B2 | 8/2010 | Hayashi |
| 7,772,871 B2 | 8/2010 | Herr |
| 7,774,512 B2 | 8/2010 | Suzuoki |
| 7,777,186 B2 | 8/2010 | Endres |
| 7,779,228 B2 | 8/2010 | Ichimura |
| 7,782,077 B2 | 8/2010 | Herr |
| 7,783,584 B1 | 8/2010 | Hoppensteadt |
| 7,786,748 B1 | 8/2010 | Herr |
| 7,786,786 B2 | 8/2010 | Kirichenko |
| 7,788,192 B2 | 8/2010 | Amin |
| 7,788,467 B2 | 8/2010 | Hatakeyama |
| 7,791,430 B2 | 9/2010 | Keefe |
| 7,795,640 B2 | 9/2010 | Klipstein |
| 7,795,650 B2 | 9/2010 | Eminoglu |
| 7,800,067 B1 | 9/2010 | Rajavel |
| 7,800,395 B2 | 9/2010 | Johnson |
| 7,802,023 B2 | 9/2010 | Yamazaki |
| 7,808,528 B2 | 10/2010 | Massie |
| 7,811,855 B2 | 10/2010 | Pitault |
| 7,814,166 B2 | 10/2010 | Suzuoki |
| 7,816,940 B1 | 10/2010 | Gupta |
| 7,818,507 B2 | 10/2010 | Yamazaki |
| 7,818,724 B2 | 10/2010 | Suzuoki |
| 7,820,971 B2 | 10/2010 | Velicu |
| 7,836,007 B2 | 11/2010 | Beausoleil |
| 7,843,209 B2 | 11/2010 | Berkley |
| 7,844,656 B2 | 11/2010 | Macready |
| 7,847,615 B2 | 12/2010 | Yorozu |
| 7,852,106 B2 | 12/2010 | Herr |
| 7,858,034 B2 | 12/2010 | Ackley |
| 7,858,966 B2 | 12/2010 | Kitaev |
| 7,863,741 B2 | 1/2011 | Ozaki |
| 7,863,892 B2 | 1/2011 | Morley |
| 7,868,645 B2 | 1/2011 | Herr |
| 7,868,665 B2 | 1/2011 | Tumer |
| 7,870,087 B2 | 1/2011 | Macready |
| 7,875,876 B1 | 1/2011 | Wandzura |
| 7,876,145 B2 | 1/2011 | Koch |
| 7,876,248 B2 | 1/2011 | Berkley |
| 7,876,869 B1 | 1/2011 | Gupta |
| 7,877,333 B2 | 1/2011 | Macready |
| 7,880,529 B2 | 2/2011 | Amin |
| 7,882,310 B2 | 2/2011 | Inoue |
| 7,882,379 B2 | 2/2011 | Kanakogi |
| 7,886,112 B2 | 2/2011 | Ohtsuka |
| 7,889,992 B1 | 2/2011 | DiVincenzo |
| 7,893,708 B2 | 2/2011 | Baumgardner |
| 7,895,142 B2 | 2/2011 | Neigovzen |
| 7,898,282 B2 | 3/2011 | Harris |
| 7,899,852 B2 | 3/2011 | Amin |
| 7,903,456 B2 | 3/2011 | Kirichenko |
| 7,911,265 B2 | 3/2011 | Dzurak |
| 7,912,656 B2 | 3/2011 | Berns |
| 7,917,667 B2 | 3/2011 | Hayashi |
| 7,917,798 B2 | 3/2011 | Inamdar |
| 7,919,762 B2 | 4/2011 | Trupke |
| 7,920,598 B2 | 4/2011 | Luo |
| 7,921,151 B2 | 4/2011 | Aguilar, Jr. |
| 7,925,614 B2 | 4/2011 | Burkard |
| 7,926,023 B2 | 4/2011 | Okawa |
| 7,928,473 B2 | 4/2011 | Klipstein |
| 7,928,875 B2 | 4/2011 | Kirichenko |
| 7,932,514 B2 | 4/2011 | Farinelli |
| 7,932,515 B2 | 4/2011 | Bunyk |
| 7,944,253 B1 | 5/2011 | Kirichenko |
| 7,956,640 B2 | 6/2011 | Gupta |
| 7,958,371 B2 | 6/2011 | Hatakeyama |
| 7,966,549 B2 | 6/2011 | Hollenberg |
| 7,969,178 B2 | 6/2011 | Przybysz |
| 7,969,805 B2 | 6/2011 | Thom |
| 7,972,885 B1 | 7/2011 | Dutta |
| 7,973,377 B2 | 7/2011 | King |
| 7,977,668 B2 | 7/2011 | Nevirkovets |
| 7,982,646 B2 | 7/2011 | Herr |
| 7,984,012 B2 | 7/2011 | Coury |
| 7,990,662 B2 | 8/2011 | Berkley |
| 7,991,013 B2 | 8/2011 | Gupta |
| 7,991,814 B2 | 8/2011 | Filippov |
| 7,999,813 B2 | 8/2011 | Suzuoki |
| 7,999,869 B2 | 8/2011 | Hollier |
| 8,001,294 B2 | 8/2011 | Inoue |
| 8,001,377 B2 | 8/2011 | Suzuoki |
| 8,001,390 B2 | 8/2011 | Hatakeyama |
| 8,001,592 B2 | 8/2011 | Hatakeyama |
| 8,004,012 B2 | 8/2011 | Klipstein |
| 8,008,942 B2 | 8/2011 | van den Brink |
| 8,008,991 B2 | 8/2011 | Tcaciuc |
| 8,009,420 B1 | 8/2011 | Hill |
| 8,010,716 B2 | 8/2011 | Yamazaki |
| 8,014,424 B2 | 9/2011 | Luo |
| 8,018,244 B2 | 9/2011 | Berkley |
| 8,021,914 B2 | 9/2011 | Hails |
| 8,022,012 B2 | 9/2011 | Moeckly |
| 8,022,349 B2 | 9/2011 | Baiko |
| 8,022,703 B1 | 9/2011 | Huang |
| 8,022,722 B1 | 9/2011 | Pesetski |
| 8,028,288 B2 | 9/2011 | Suzuoki |
| 8,028,292 B2 | 9/2011 | Inoue |
| 8,030,925 B2 | 10/2011 | Hammond |
| 8,032,474 B2 | 10/2011 | Macready |
| 8,035,184 B1 | 10/2011 | Dutta |
| 8,035,540 B2 | 10/2011 | Berkley |
| 8,044,435 B2 | 10/2011 | Scott |
| 8,045,660 B1 | 10/2011 | Gupta |
| 8,050,648 B1 | 11/2011 | Kirichenko |
| 8,053,754 B2 | 11/2011 | Freedman |
| 8,055,235 B1 | 11/2011 | Gupta |
| 8,055,318 B1 | 11/2011 | Kadin |
| 8,058,085 B2 | 11/2011 | Linares |
| 8,058,638 B2 | 11/2011 | Freedman |
| 8,062,841 B2 | 11/2011 | Su |
| 8,063,657 B2 | 11/2011 | Rose |
| 8,073,631 B2 | 12/2011 | Wilber |
| 8,073,795 B2 | 12/2011 | Honisch |
| 8,073,808 B2 | 12/2011 | Rose |
| 8,089,286 B2 | 1/2012 | Silva |
| 8,091,078 B2 | 1/2012 | Brokenshire |
| 8,097,857 B2 | 1/2012 | Cochran |
| 8,097,904 B2 | 1/2012 | Eminoglu |
| 8,098,179 B2 | 1/2012 | Bunyk |
| 8,102,185 B2 | 1/2012 | Johansson |
| 8,103,172 B2 | 1/2012 | Peters |
| 8,107,777 B2 | 1/2012 | Farah |
| 8,108,564 B2 | 1/2012 | Hofstee |
| 8,111,083 B1 | 2/2012 | Pesetski |
| 8,115,152 B1 | 2/2012 | Martin |
| 8,117,000 B2 | 2/2012 | DiVincenzo |
| 8,120,683 B1 | 2/2012 | Tumer |
| 8,125,367 B2 | 2/2012 | Ludwig |
| 8,130,880 B1 | 3/2012 | Gupta |
| 8,138,756 B2 | 3/2012 | Barclay |
| 8,138,784 B2 | 3/2012 | Przybysz |
| 8,138,880 B2 | 3/2012 | Keefe |
| 8,142,754 B2 | 3/2012 | Lanzara |
| 8,143,687 B2 | 3/2012 | Wehner |
| 8,144,589 B2 | 3/2012 | Meylan |
| 8,148,715 B2 | 4/2012 | Hollenberg |
| 8,154,099 B2 | 4/2012 | Hampp |
| 8,159,313 B2 | 4/2012 | Uchaykin |
| 8,159,825 B1 | 4/2012 | Dotsenko |
| 8,163,094 B1 | 4/2012 | Greer |
| 8,163,644 B2 | 4/2012 | Markunas |
| 8,164,082 B2 | 4/2012 | Friesen |
| 8,169,231 B2 | 5/2012 | Berkley |
| 8,174,305 B2 | 5/2012 | Harris |
| 8,175,995 B2 | 5/2012 | Amin |

(56) References Cited

U.S. PATENT DOCUMENTS

| | | |
|---|---|---|
| 8,176,481 B2 | 5/2012 | Kasahara |
| 8,179,133 B1 | 5/2012 | Kornev |
| 8,179,296 B2 | 5/2012 | Kelly |
| 8,184,986 B2 | 5/2012 | Cornwall |
| 8,188,901 B1 | 5/2012 | Inamdar |
| 8,190,548 B2 | 5/2012 | Choi |
| 8,193,808 B2 | 6/2012 | Fu |
| 8,195,596 B2 | 6/2012 | Rose |
| 8,195,726 B2 | 6/2012 | Macready |
| 8,198,576 B2 | 6/2012 | Kennedy |
| 8,208,288 B2 | 6/2012 | Bulzacchelli |
| 8,219,871 B2 | 7/2012 | Roetteler |
| 8,219,981 B2 | 7/2012 | Aguilar, Jr. |
| 8,222,629 B2 | 7/2012 | Pioro-Ladriere |
| 8,222,899 B2 | 7/2012 | Horng |
| 8,223,625 B2 | 7/2012 | Malladi |
| 8,224,639 B2 | 7/2012 | Inoue |
| 8,228,688 B2 | 7/2012 | Uchaykin |
| 8,229,863 B2 | 7/2012 | Amin |
| 8,234,103 B2 | 7/2012 | Biamonte |
| 8,242,799 B2 | 8/2012 | Pesetski |
| 8,243,876 B2 | 8/2012 | Morton |
| 8,244,650 B2 | 8/2012 | Rose |
| 8,244,662 B2 | 8/2012 | Coury |
| 8,247,799 B2 | 8/2012 | Bunyk |
| 8,249,540 B1 | 8/2012 | Gupta |
| 8,254,079 B2 | 8/2012 | Jefferson |
| 8,259,848 B2 | 9/2012 | Malladi |
| 8,260,143 B2 | 9/2012 | Gupta |
| 8,260,144 B2 | 9/2012 | Gupta |
| 8,260,145 B2 | 9/2012 | Gupta |
| 8,270,209 B2 | 9/2012 | Herr |
| 8,271,043 B2 | 9/2012 | Kim |
| 8,271,805 B2 | 9/2012 | Yasue |
| 8,275,428 B2 | 9/2012 | Bonderson |
| 8,279,022 B2 | 10/2012 | Thom |
| 8,283,632 B2 | 10/2012 | Joshi |
| 8,283,943 B2 | 10/2012 | van den Brink |
| 8,284,585 B2 | 10/2012 | Maekawa |
| 8,290,553 B2 | 10/2012 | Moeckly |
| 8,294,138 B2 | 10/2012 | Farinelli |
| 8,296,940 B2 | 10/2012 | Woychik |
| 8,301,104 B1 | 10/2012 | Gupta |
| 8,301,214 B1 | 10/2012 | Tolpygo |
| 8,304,758 B2 | 11/2012 | Fang |
| 8,310,230 B2 | 11/2012 | Haensch |
| 8,314,446 B2 | 11/2012 | Yao |
| 8,315,969 B2 | 11/2012 | Roetteler |
| 8,321,866 B2 | 11/2012 | Suzuoki |
| 8,343,807 B2 | 1/2013 | Aksyuk |
| 8,347,165 B2 | 1/2013 | Johnson |
| 8,355,765 B2 | 1/2013 | Uchaykin |
| 8,359,186 B2 | 1/2013 | Ganesan |
| 8,362,220 B2 | 1/2013 | Girolami |
| 8,362,520 B2 | 1/2013 | Scott |
| 8,363,606 B2 | 1/2013 | Montojo |
| 8,374,072 B2 | 2/2013 | Gaal |
| 8,383,426 B1 | 2/2013 | Tolpygo |
| 8,386,554 B2 | 2/2013 | Macready |
| 8,399,910 B2 | 3/2013 | Scott |
| 8,401,509 B1 | 3/2013 | Gupta |
| 8,401,600 B1 | 3/2013 | Filippov |
| 8,405,468 B2 | 3/2013 | Uchaykin |
| 8,416,109 B2 | 4/2013 | Kirichenko |
| 8,421,015 B1 | 4/2013 | Scott |
| 8,421,053 B2 | 4/2013 | Bunyk |
| 8,423,297 B2 | 4/2013 | Wilber |
| 8,434,091 B2 | 4/2013 | Suzuoki |
| 8,437,168 B2 | 5/2013 | Maekawa |
| 8,437,818 B1 | 5/2013 | Tolpygo |
| 8,441,089 B2 | 5/2013 | Gravrand |
| 8,441,329 B2 | 5/2013 | Thom |
| 8,455,278 B2 | 6/2013 | Linares |
| 8,456,004 B2 | 6/2013 | Markunas |
| 8,457,093 B2 | 6/2013 | Tenny |
| 8,461,862 B2 | 6/2013 | Pesetski |
| 8,462,889 B2 | 6/2013 | Gupta |
| 8,464,542 B2 | 6/2013 | Hilton |
| 8,471,204 B2 | 6/2013 | Bornfreund |
| 8,477,888 B2 | 7/2013 | Lu |
| 8,485,427 B2 | 7/2013 | Gavinsky |
| 8,488,487 B2 | 7/2013 | Borran |
| 8,491,190 B2 | 7/2013 | Glasser |
| 8,494,993 B2 | 7/2013 | Harris |
| 8,498,639 B2 | 7/2013 | Chen |
| 8,504,497 B2 | 8/2013 | Amin |
| 8,507,894 B2 | 8/2013 | Morello |
| 8,508,280 B2 | 8/2013 | Naaman |
| 8,510,618 B1 | 8/2013 | Pesetski |
| 8,513,647 B1 | 8/2013 | Bacon |
| 8,514,284 B2 | 8/2013 | Byren |
| 8,514,986 B2 | 8/2013 | Gupta |
| 8,521,117 B1 | 8/2013 | Gupta |
| 8,530,264 B2 | 9/2013 | De Munck |
| 8,536,566 B2 | 9/2013 | Johansson |
| 8,547,090 B2 | 10/2013 | Lukin |
| 8,547,170 B1 | 10/2013 | Stobie |
| 8,547,732 B2 | 10/2013 | Bulzacchelli |
| 8,549,521 B2 | 10/2013 | Brokenshire |
| 8,552,479 B2 | 10/2013 | Bornfreund |
| 8,552,480 B2 | 10/2013 | Bornfreund |
| 8,553,795 B2 | 10/2013 | Xu |
| 8,555,127 B2 | 10/2013 | Johnson |
| 8,560,282 B2 | 10/2013 | Macready |
| 8,560,470 B2 | 10/2013 | Amin |
| 8,565,345 B2 | 10/2013 | Gupta |
| 8,567,658 B2 | 10/2013 | Schulte |
| 8,569,874 B2 | 10/2013 | Colgan |
| 8,571,614 B1 | 10/2013 | Mukhanov |
| 8,581,227 B2 | 11/2013 | Freedman |
| 8,582,687 B2 | 11/2013 | Terry |
| 8,583,903 B2 | 11/2013 | Freedman |
| 8,586,936 B2 | 11/2013 | Yang |
| 8,592,301 B2 | 11/2013 | Markunas |
| 8,593,141 B1 | 11/2013 | Radparvar |
| 8,604,944 B2 | 12/2013 | Berkley |
| 8,605,288 B2 | 12/2013 | Bennett |
| 8,606,341 B2 | 12/2013 | Bonderson |
| 8,610,171 B2 | 12/2013 | Bois |
| 8,611,974 B2 | 12/2013 | Maibaum |
| 8,618,799 B1 | 12/2013 | Radparvar |
| 8,620,835 B2 | 12/2013 | Freedman |
| 8,624,968 B1 | 1/2014 | Hersee |
| 8,629,726 B1 | 1/2014 | Madison |
| 8,629,729 B2 | 1/2014 | Hoppensteadt |
| 8,630,256 B2 | 1/2014 | Tinnakornsrisuphap |
| 8,631,367 B2 | 1/2014 | Pesetski |
| 8,637,824 B2 | 1/2014 | Mullins |
| 8,642,998 B2 | 2/2014 | Gambetta |
| 8,648,331 B2 | 2/2014 | Bonderson |
| 8,653,461 B1 | 2/2014 | Benson |
| 8,654,578 B2 | 2/2014 | Lewis |
| 8,655,828 B2 | 2/2014 | Rose |
| 8,659,007 B2 | 2/2014 | Bonderson |
| 8,659,664 B2 | 2/2014 | Benson |
| 8,664,739 B2 | 3/2014 | King |
| 8,669,325 B1 | 3/2014 | Hyman |
| 8,670,777 B2 | 3/2014 | Borran |
| 8,670,807 B2 | 3/2014 | Rose |
| 8,675,768 B2 | 3/2014 | Xu |
| 8,676,223 B2 | 3/2014 | Montojo |
| 8,686,751 B2 | 4/2014 | van den Brink |
| 8,687,489 B2 | 4/2014 | Chaponniere |
| 8,692,176 B2 | 4/2014 | Kelly |
| 8,700,689 B2 | 4/2014 | Macready |
| 8,709,949 B2 | 4/2014 | Hampp |
| 8,712,424 B2 | 4/2014 | Luo |
| 8,726,041 B2 | 5/2014 | Hatakeyama |
| 8,735,326 B2 | 5/2014 | Folk |
| 8,738,105 B2 | 5/2014 | Berkley |
| 8,744,075 B2 | 6/2014 | Tanaka |
| 8,744,541 B1 | 6/2014 | Filippov |
| 8,745,850 B2 | 6/2014 | Farinelli |
| 8,748,196 B2 | 6/2014 | Bonderson |

(56) References Cited

U.S. PATENT DOCUMENTS

| | | |
|---|---|---|
| 8,748,950 B2 | 6/2014 | Levy |
| 8,751,212 B2 | 6/2014 | Inoue |
| 8,755,220 B2 | 6/2014 | Bulzacchelli |
| 8,759,873 B2 | 6/2014 | Gravrand |
| 8,769,495 B1 | 7/2014 | Gupta |
| 8,772,729 B1 | 7/2014 | Brown |
| 8,772,759 B2 | 7/2014 | Bunyk |
| 8,780,418 B1 | 7/2014 | Bluzer |
| 8,780,420 B1 | 7/2014 | Bluzer |
| 8,781,129 B2 | 7/2014 | Bush |
| 8,786,476 B2 | 7/2014 | Bunyk |
| 8,787,873 B1 | 7/2014 | Hitt |
| 8,804,358 B1 | 8/2014 | Dotsenko |
| 8,806,316 B2 | 8/2014 | Hwang |
| 8,811,536 B2 | 8/2014 | Gupta |
| 8,812,066 B2 | 8/2014 | Lanting |
| 8,816,268 B1 | 8/2014 | Stobie |
| 8,816,325 B2 | 8/2014 | Schenkel |
| 8,824,601 B2 | 9/2014 | Malladi |
| 8,829,452 B1 | 9/2014 | Brown |
| 8,830,818 B2 | 9/2014 | Damnjanovic |
| 8,835,851 B2 | 9/2014 | Lee |
| 8,841,764 B2 | 9/2014 | Poletto |
| 8,847,202 B1 | 9/2014 | Nosho |
| 8,847,409 B1 | 9/2014 | DeNatale |
| 8,849,580 B2 | 9/2014 | Kauffman |
| 8,854,074 B2 | 10/2014 | Berkley |
| 8,861,619 B2 | 10/2014 | McDermott |
| 8,865,537 B2 | 10/2014 | Abraham |
| 8,867,931 B2 | 10/2014 | Gupta |
| 8,872,159 B2 | 10/2014 | Kub |
| 8,872,360 B2 | 10/2014 | Chow |
| 8,872,690 B1 | 10/2014 | Inamdar |
| 8,874,629 B2 | 10/2014 | Macready |
| 8,891,489 B2 | 11/2014 | Attar |
| 8,892,857 B2 | 11/2014 | Ozols |
| 8,897,057 B2 | 11/2014 | Skold |
| 8,900,986 B2 | 12/2014 | Huang |
| 8,921,473 B1 | 12/2014 | Hyman |
| 8,922,239 B2 | 12/2014 | Pesetski |
| 8,923,073 B2 | 12/2014 | Brooks |
| 8,928,391 B2 | 1/2015 | Naaman |
| 8,930,786 B2 | 1/2015 | Johnson |
| 8,933,695 B1 | 1/2015 | Kornev |
| 8,933,832 B2 | 1/2015 | Kelly |
| 8,937,255 B1 | 1/2015 | Dotsenko |
| 8,946,638 B2 | 2/2015 | Scott |
| 8,947,080 B2 | 2/2015 | Lukin |
| 8,951,808 B2 | 2/2015 | Ladizinsky |
| 8,954,125 B2 | 2/2015 | Corcoles Gonzalez |
| 8,969,851 B2 | 3/2015 | Inada |
| 8,970,217 B1 | 3/2015 | Kadin |
| 8,970,706 B2 | 3/2015 | Scott |
| 8,971,977 B2 | 3/2015 | Mukhanov |
| 8,972,921 B2 | 3/2015 | Abraham |
| 8,975,912 B2 | 3/2015 | Chow |
| 8,977,223 B1 | 3/2015 | Gupta |
| 8,977,576 B2 | 3/2015 | Macready |
| 8,983,303 B2 | 3/2015 | Meyers |
| 8,995,797 B2 | 3/2015 | Smith |
| 9,015,215 B2 | 4/2015 | Berkley |
| 9,020,079 B2 | 4/2015 | Gupta |
| 9,020,095 B2 | 4/2015 | Morton |
| 9,020,362 B2 | 4/2015 | Gupta |
| 9,024,359 B2 | 5/2015 | Scott |
| 9,026,574 B2 | 5/2015 | Macready |
| 9,029,259 B2 | 5/2015 | Stupar |
| 9,029,833 B2 | 5/2015 | Kub |
| 9,040,959 B2 | 5/2015 | Lutchyn |
| 9,041,427 B2 | 5/2015 | Gambetta |
| 9,054,247 B2 | 6/2015 | Mohseni |
| 9,058,164 B2 | 6/2015 | Kanakogi |
| 9,059,305 B2 | 6/2015 | Abraham |
| 9,059,674 B2 | 6/2015 | Chow |
| 9,059,707 B2 | 6/2015 | Gambetta |
| 9,064,992 B1 | 6/2015 | Nosho |
| 9,065,452 B1 | 6/2015 | Inamdar |
| 9,069,080 B2 | 6/2015 | Stettner |
| 9,069,928 B2 | 6/2015 | van den Brink |
| 9,094,969 B2 | 7/2015 | Montojo |
| 9,097,751 B1 | 8/2015 | Longhini |
| 9,105,548 B2 | 8/2015 | Cunningham |
| 9,106,056 B1 | 8/2015 | Hersee |
| 9,110,169 B2 | 8/2015 | Stettner |
| 9,110,771 B2 | 8/2015 | Hoppensteadt |
| 9,111,230 B2 | 8/2015 | Gambetta |
| 9,121,953 B2 | 9/2015 | Bolotnikov |
| 9,123,607 B1 | 9/2015 | Hatcher |
| 9,129,224 B2 | 9/2015 | Lanting |
| 9,130,116 B1 | 9/2015 | Tolpygo |
| 9,130,598 B2 | 9/2015 | Goto |
| 9,134,047 B2 | 9/2015 | Black |
| 9,134,439 B2 | 9/2015 | Bolotnikov |
| 9,136,457 B2 | 9/2015 | Tolpygo |
| 9,142,585 B2 | 9/2015 | King |
| 9,143,266 B2 | 9/2015 | Mower |
| 9,146,157 B1 | 9/2015 | Rajavel |
| 9,152,923 B2 | 10/2015 | Harris |
| 9,152,924 B2 | 10/2015 | Bonderson |
| 9,159,033 B2 | 10/2015 | Abraham |
| 9,160,593 B2 | 10/2015 | Terry |
| 9,162,881 B2 | 10/2015 | Biamonte |
| 9,166,625 B2 | 10/2015 | Hwang |
| 9,170,278 B2 | 10/2015 | Neufeld |
| 9,177,814 B2 | 11/2015 | Chang |
| 9,178,154 B2 | 11/2015 | Bunyk |
| 9,183,051 B2 | 11/2015 | Inoue |
| 9,183,508 B2 | 11/2015 | King |
| 9,184,194 B2 | 11/2015 | Cellek |
| 9,190,377 B2 | 11/2015 | Chen |
| 9,192,085 B2 | 11/2015 | Chavez |
| 9,203,466 B2 | 12/2015 | Gorokhov |
| 9,203,654 B2 | 12/2015 | Terry |
| 9,207,672 B2 | 12/2015 | Williams |
| 9,208,446 B2 | 12/2015 | Pesetski |
| 9,218,567 B2 | 12/2015 | Macready |
| 9,218,571 B2 | 12/2015 | Abraham |
| 9,219,298 B2 | 12/2015 | Abraham |
| 9,219,605 B2 | 12/2015 | Niskanen |
| 9,224,783 B2 | 12/2015 | Greer |
| 9,225,920 B2 | 12/2015 | Bluzer |
| 9,231,181 B2 | 1/2016 | Thom |
| 9,235,811 B2 | 1/2016 | Stoltz |
| 9,240,773 B1 | 1/2016 | Mukhanov |
| 9,252,825 B2 | 2/2016 | Gupta |
| 9,256,834 B2 | 2/2016 | Bonderson |
| 9,260,289 B2 | 2/2016 | Park |
| 9,261,573 B1 | 2/2016 | Radparvar |
| 9,270,071 B2 | 2/2016 | Abraham |
| 9,270,385 B2 | 2/2016 | Meyers |
| 9,276,030 B2 | 3/2016 | Dixon |
| 9,276,161 B2 | 3/2016 | Benson |
| 9,276,615 B1 | 3/2016 | Filippov |
| 9,277,204 B2 | 3/2016 | Gilliland |
| 9,282,645 B2 | 3/2016 | Ciou |
| 9,294,690 B1 | 3/2016 | Caulfield |
| 9,296,609 B2 | 3/2016 | Park |
| 9,306,739 B1 | 4/2016 | Troupe |
| 9,312,878 B1 | 4/2016 | Inamdar |
| 9,312,895 B1 | 4/2016 | Gupta |
| 9,318,517 B1 | 4/2016 | Montoya |
| 9,324,745 B2 | 4/2016 | Yazici |
| 9,331,020 B2 | 5/2016 | Yazdani |
| 9,332,475 B2 | 5/2016 | Attar |
| 9,335,385 B2 | 5/2016 | Lanting |
| 9,344,069 B1 | 5/2016 | Inamdar |
| 9,344,092 B2 | 5/2016 | Abraham |
| 9,349,889 B2 | 5/2016 | Rihani |
| 9,350,460 B2 | 5/2016 | Paik |
| 9,354,039 B2 | 5/2016 | Mower |
| 9,355,362 B2 | 5/2016 | Shea |
| 9,355,364 B2 | 5/2016 | Miller |
| 9,355,365 B2 | 5/2016 | Berkley |
| 9,361,169 B2 | 6/2016 | Berkley |

(56) References Cited

U.S. PATENT DOCUMENTS

| | | |
|---|---|---|
| 9,363,766 B2 | 6/2016 | Zhou |
| 9,363,790 B2 | 6/2016 | Tenny |
| 9,367,288 B2 | 6/2016 | Wilber |
| 9,369,133 B2 | 6/2016 | Naaman |
| 9,379,303 B2 | 6/2016 | Gambetta |
| 9,384,827 B1 | 7/2016 | Reohr |
| 9,385,293 B1 | 7/2016 | Nayfeh |
| 9,385,294 B2 | 7/2016 | Rigetti |
| 9,385,738 B2 | 7/2016 | Kelly |
| 9,396,440 B2 | 7/2016 | Macready |
| 9,397,283 B2 | 7/2016 | Abraham |
| 9,400,499 B2 | 7/2016 | Williams |
| 9,401,766 B2 | 7/2016 | Yuan |
| 9,401,823 B2 | 7/2016 | Terry |
| 9,405,876 B2 | 8/2016 | Macready |
| 9,406,026 B2 | 8/2016 | Bunyk |
| 9,420,264 B2 | 8/2016 | Gilliland |
| 9,420,603 B2 | 8/2016 | Ji |
| 9,424,526 B2 | 8/2016 | Ranjbar |
| 9,425,377 B2 | 8/2016 | Moyerman |
| 9,425,804 B2 | 8/2016 | McDermott, III |
| 9,425,838 B1 | 8/2016 | Gupta |
| 9,426,397 B2 | 8/2016 | Wein |
| 9,432,024 B2 | 8/2016 | Chow |
| 9,437,800 B1 | 9/2016 | McDermott, III |
| 9,438,245 B2 | 9/2016 | Bronn |
| 9,438,246 B1 | 9/2016 | Naaman |
| 9,443,200 B2 | 9/2016 | Schroff |
| 9,443,576 B1 | 9/2016 | Miller |
| 9,444,430 B1 | 9/2016 | Abdo |
| 9,453,914 B2 | 9/2016 | Stettner |
| 9,454,061 B1 | 9/2016 | Abdo |
| 9,455,391 B1 | 9/2016 | Nayfeh |
| 9,455,392 B2 | 9/2016 | Abraham |
| 9,455,707 B2 | 9/2016 | Herr |
| 9,460,397 B2 | 10/2016 | Apalkov |
| 9,461,588 B1 | 10/2016 | Naaman |
| 9,471,279 B2 | 10/2016 | Shi |
| 9,471,280 B2 | 10/2016 | Shi |
| 9,471,880 B2 | 10/2016 | Williams |
| 9,473,124 B1 | 10/2016 | Mukhanov |
| 9,476,950 B2 | 10/2016 | Faley |
| 9,477,796 B2 | 10/2016 | Garcia-Ramirez |
| 9,489,634 B2 | 11/2016 | Bonderson |
| 9,490,296 B2 | 11/2016 | Ladizinsky |
| 9,491,389 B2 | 11/2016 | Kelly |
| 9,495,644 B2 | 11/2016 | Chudak |
| 9,501,747 B2 | 11/2016 | Roy |
| 9,501,748 B2 | 11/2016 | Naaman |
| 9,503,063 B1 | 11/2016 | Abraham |
| 9,509,274 B2 | 11/2016 | Naaman |
| 9,509,280 B1 | 11/2016 | Abdo |
| 9,509,315 B2 | 11/2016 | McCaughan |
| 9,509,478 B2 | 11/2016 | Montojo |
| 9,514,812 B2 | 12/2016 | Brooks |
| 9,515,247 B1 | 12/2016 | Chang |
| 9,518,336 B2 | 12/2016 | Markham |
| 9,520,180 B1 | 12/2016 | Mukhanov |
| 9,520,547 B2 | 12/2016 | Abraham |
| 9,524,470 B1 | 12/2016 | Chow |
| 9,525,831 B2 | 12/2016 | Scott |
| 9,530,535 B2 | 12/2016 | Liu |
| 9,530,820 B1 | 12/2016 | Douglas |
| 9,530,873 B1 | 12/2016 | Carroll |
| 9,531,055 B2 | 12/2016 | Abraham |
| 9,537,027 B2 | 1/2017 | Lu |
| 9,537,953 B1 | 1/2017 | Dadashikelayeh |
| 9,547,826 B2 | 1/2017 | King |
| 9,548,742 B1 | 1/2017 | Abdo |
| 9,548,878 B2 | 1/2017 | Gupta |
| 9,549,158 B2 | 1/2017 | Grauer |
| 9,552,862 B2 | 1/2017 | Ohki |
| 9,554,303 B1 | 1/2017 | Hitt |
| 9,559,284 B2 | 1/2017 | Chang |
| 9,564,573 B1 | 2/2017 | Chang |
| 9,565,045 B2 | 2/2017 | Terry |
| 9,575,184 B2 | 2/2017 | Gilliland |
| 9,577,690 B2 | 2/2017 | Gupta |
| 9,582,695 B2 | 2/2017 | Hoppensteadt |
| 9,588,191 B1 | 3/2017 | Kornev |
| 9,588,940 B2 | 3/2017 | Hamze |
| 9,589,236 B1 | 3/2017 | Abdo |
| 9,593,907 B2 | 3/2017 | Regan |
| 9,594,726 B2 | 3/2017 | Macready |
| 9,595,656 B2 | 3/2017 | Tolpygo |
| 9,595,969 B2 | 3/2017 | Miller |
| 9,596,421 B1 | 3/2017 | Itzler |
| 9,607,270 B2 | 3/2017 | Harris |
| 9,613,905 B2 | 4/2017 | Yazdani |
| 9,613,924 B2 | 4/2017 | Aliane |
| 9,613,999 B2 | 4/2017 | Klipstein |
| 9,614,270 B2 | 4/2017 | Chang |
| 9,614,532 B1 | 4/2017 | Bulzacchelli |
| 9,618,591 B1 | 4/2017 | Radparvar |
| 9,618,648 B2 | 4/2017 | Morton |
| 9,622,188 B2 | 4/2017 | Luo |
| 9,627,045 B1 | 4/2017 | Mukhanov |
| 9,627,563 B2 | 4/2017 | Klipstein |
| 9,633,314 B2 | 4/2017 | Kwon |
| 9,634,224 B2 | 4/2017 | Ladizinsky |
| 9,634,835 B2 | 4/2017 | Legré |
| 9,635,284 B2 | 4/2017 | Benson |
| 9,640,680 B1 | 5/2017 | Son |
| 9,641,372 B2 | 5/2017 | Terry |
| 9,646,259 B2 | 5/2017 | Shea |
| 9,647,194 B1 | 5/2017 | Dotsenko |
| 9,647,662 B1 | 5/2017 | Abutaleb |
| 9,660,859 B1 | 5/2017 | Dadashikelayeh |
| 9,661,596 B2 | 5/2017 | Gupta |
| 9,663,358 B1 | 5/2017 | Cory |
| 9,664,562 B1 | 5/2017 | Goodnough |
| 9,664,751 B1 | 5/2017 | Berggren |
| 9,665,539 B1 | 5/2017 | Macready |
| 9,680,452 B1 | 6/2017 | Abdo |
| 9,683,766 B1 | 6/2017 | Kreider |
| 9,685,477 B2 | 6/2017 | Tennant |
| 9,685,935 B2 | 6/2017 | Strand |
| 9,686,112 B2 | 6/2017 | Terry |
| 9,691,962 B2 | 6/2017 | Abdo |
| 9,692,423 B2 | 6/2017 | McDermott, III |
| 9,692,595 B2 | 6/2017 | Lowans |
| 9,697,473 B2 | 7/2017 | Abdo |
| 9,698,134 B2 | 7/2017 | Li |
| 9,699,266 B2 | 7/2017 | Rose |
| 9,703,516 B2 | 7/2017 | Hofstee |
| 9,705,063 B2 | 7/2017 | Chang |
| 9,710,586 B2 | 7/2017 | Muller |
| 9,710,758 B2 | 7/2017 | Bunyk |
| 9,712,172 B2 | 7/2017 | Shauck |
| 9,712,771 B2 | 7/2017 | Kelly |
| 9,713,199 B2 | 7/2017 | Freedman |
| 9,716,085 B2 | 7/2017 | Li |
| 9,716,219 B2 | 7/2017 | Chang |
| 9,720,055 B1 | 8/2017 | Hahn |
| 9,721,209 B2 | 8/2017 | Kliuchnikov |
| 9,722,589 B1 | 8/2017 | Talanov |
| 9,723,233 B2 | 8/2017 | Grauer |
| 9,727,527 B2 | 8/2017 | van den Brink |
| 9,727,823 B2 | 8/2017 | Amin |
| 9,727,824 B2 | 8/2017 | Rose |
| 9,729,152 B2 | 8/2017 | Bronn |
| 9,733,327 B2 | 8/2017 | Sasaki |
| 9,735,776 B1 | 8/2017 | Abdo |
| 9,739,851 B2 | 8/2017 | Hoppensteadt |
| 9,741,918 B2 | 8/2017 | Yohannes |
| 9,741,920 B1 | 8/2017 | Tolpygo |
| 9,741,921 B2 | 8/2017 | Liu |
| 9,742,429 B1 | 8/2017 | Inamdar |
| 9,743,024 B2 | 8/2017 | Tyrrell |
| 9,746,376 B2 | 8/2017 | Wein |
| 9,747,968 B2 | 8/2017 | Ohki |
| 9,748,214 B2 | 8/2017 | LaVeigne |
| 9,748,937 B1 | 8/2017 | Inamdar |
| 9,748,976 B2 | 8/2017 | Naaman |

(56) References Cited

U.S. PATENT DOCUMENTS

| | | |
|---|---|---|
| 9,749,893 B2 | 8/2017 | Zhou |
| 9,753,102 B1 | 9/2017 | Karaiskaj |
| 9,754,214 B1 | 9/2017 | Glaser |
| 9,755,133 B1 | 9/2017 | Nayfeh |
| 9,761,305 B2 | 9/2017 | Reohr |
| 9,761,751 B2 | 9/2017 | Klipstein |
| 9,762,200 B2 | 9/2017 | Thom |
| 9,767,238 B2 | 9/2017 | Oberg |
| 9,768,371 B2 | 9/2017 | Ladizinsky |
| 9,768,771 B2 | 9/2017 | Naaman |
| 9,773,208 B2 | 9/2017 | Betz |
| 9,774,795 B2 | 9/2017 | Thorne |
| 9,779,359 B2 | 10/2017 | Svore |
| 9,779,360 B2 | 10/2017 | Bunyk |
| 9,780,240 B2 | 10/2017 | Lu |
| 9,780,764 B2 | 10/2017 | Pesetski |
| 9,780,765 B2 | 10/2017 | Naaman |
| 9,786,194 B2 | 10/2017 | Hyman |
| 9,787,278 B1 | 10/2017 | Abdo |
| 9,787,312 B2 | 10/2017 | Herr |
| 9,791,258 B2 | 10/2017 | Mower |
| 9,793,913 B2 | 10/2017 | Bulzacchelli |
| 9,793,933 B1 | 10/2017 | Gupta |
| 9,797,995 B2 | 10/2017 | Gilliland |
| 9,798,083 B2 | 10/2017 | Mahmoodian |
| 9,798,219 B2 | 10/2017 | Pant |
| 9,799,817 B2 | 10/2017 | Fong |
| 9,800,399 B2 | 10/2017 | Tanzilli |
| 9,806,711 B1 | 10/2017 | Abdo |
| 9,812,836 B1 | 11/2017 | Osborn |
| 9,817,081 B2 | 11/2017 | Hahn |
| 9,818,064 B1 | 11/2017 | Abdo |
| 9,818,796 B2 | 11/2017 | Abraham |
| 9,823,313 B2 | 11/2017 | Hahn |
| 9,823,314 B2 | 11/2017 | Hahn |
| 9,823,381 B2 | 11/2017 | Meyer |
| 9,824,597 B2 | 11/2017 | Sekelsky |
| 9,829,545 B2 | 11/2017 | Stetson, Jr. |
| 9,834,209 B2 | 12/2017 | Stettner |
| 9,835,693 B2 | 12/2017 | Coar |
| 9,835,694 B2 | 12/2017 | Coar |
| 9,836,699 B1 | 12/2017 | Rigetti |
| 9,838,051 B1 | 12/2017 | Gupta |
| 9,841,484 B2 | 12/2017 | Mohebbi |
| 9,843,312 B2 | 12/2017 | Abdo |
| 9,843,741 B2 | 12/2017 | French |
| 9,845,153 B2 | 12/2017 | Sekelsky |
| 9,847,121 B2 | 12/2017 | Frank |
| 9,847,441 B2 | 12/2017 | Huntington |
| 9,853,645 B1 | 12/2017 | Mukhanov |
| 9,853,837 B2 | 12/2017 | Krause |
| 9,857,509 B2 | 1/2018 | Abdo |
| 9,857,609 B2 | 1/2018 | Bishop |
| 9,858,531 B1 | 1/2018 | Monroe |
| 9,858,532 B2 | 1/2018 | Abdo |
| 9,865,648 B2 | 1/2018 | Bunyk |
| 9,866,773 B2 | 1/2018 | Caulfield |
| 9,870,273 B2 | 1/2018 | Dadashikelayeh |
| 9,870,277 B2 | 1/2018 | Berkley |
| 9,870,536 B1 | 1/2018 | Abdo |
| 9,875,215 B2 | 1/2018 | Macready |
| 9,875,444 B2 | 1/2018 | King |
| 9,880,365 B2 | 1/2018 | Goutzoulis |
| 9,881,256 B2 | 1/2018 | Hamze |
| 9,882,112 B2 | 1/2018 | Kwon |
| 9,885,888 B2 | 2/2018 | Bishop |
| 9,887,000 B1 | 2/2018 | Mukhanov |
| 9,891,297 B2 | 2/2018 | Sushkov |
| 9,892,365 B2 | 2/2018 | Rigetti |
| 9,893,262 B2 | 2/2018 | Thompson |
| 9,906,191 B1 | 2/2018 | Filippov |
| 9,906,248 B2 | 2/2018 | Gupta |
| 9,909,460 B2 | 3/2018 | Allen |
| 9,910,104 B2 | 3/2018 | Boesch |
| 9,910,105 B2 | 3/2018 | Boesch |
| 9,911,774 B2 | 3/2018 | Grzesik |
| 9,913,414 B2 | 3/2018 | Sadleir |
| 9,917,580 B2 | 3/2018 | Naaman |
| 9,922,289 B2 | 3/2018 | Abdo |
| 9,923,013 B1 | 3/2018 | Yamashita |
| 9,923,538 B2 | 3/2018 | Abdo |
| 9,927,636 B2 | 3/2018 | Bishop |
| 9,928,948 B2 | 3/2018 | Naaman |
| 9,929,334 B2 | 3/2018 | Chang |
| 9,929,978 B2 | 3/2018 | Naaman |
| 9,934,468 B2 | 4/2018 | Mohseni |
| 9,935,138 B2 | 4/2018 | Piccione |
| 9,935,151 B2 | 4/2018 | Ettenberg |
| 9,935,252 B2 | 4/2018 | Abraham |
| 9,940,212 B2 | 4/2018 | Kelly |
| 9,940,586 B1 | 4/2018 | Epstein |
| 9,941,459 B2 | 4/2018 | Abdo |
| 9,945,917 B2 | 4/2018 | Drake |
| 9,946,973 B2 | 4/2018 | Biercuk |
| 9,947,856 B2 | 4/2018 | Abdo |
| 9,947,861 B2 | 4/2018 | Newman |
| 9,948,050 B2 | 4/2018 | Abraham |
| 9,948,254 B2 | 4/2018 | Narla |
| 9,952,830 B2 | 4/2018 | Tomaru |
| 9,953,268 B2 | 4/2018 | Abdo |
| 9,953,269 B2 | 4/2018 | Chow |
| 9,966,720 B2 | 5/2018 | Liu |
| 9,966,926 B2 | 5/2018 | Abdo |
| 9,971,970 B1 | 5/2018 | Rigetti |
| 9,978,020 B1 | 5/2018 | Gambetta |
| 9,978,809 B2 | 5/2018 | Ladizinsky |
| 9,979,400 B1 | 5/2018 | Sete |
| 9,982,935 B2 | 5/2018 | Webber |
| 9,983,336 B2 | 5/2018 | Abdo |
| 9,984,333 B2 | 5/2018 | Biamonte |
| 9,985,193 B2 | 5/2018 | Dial |
| 9,985,614 B2 | 5/2018 | Abdo |
| 9,991,864 B2 | 6/2018 | Strong |
| 9,994,956 B2 | 6/2018 | Wu |
| 9,996,801 B2 | 6/2018 | Shim |
| 9,998,122 B2 | 6/2018 | Hamilton |
| 11,121,302 B2 * | 9/2021 | Yohannes ............... H01L 24/02 |
| 11,711,985 B2 * | 7/2023 | Yohannes ............... H10N 69/00 |
| | | 257/31 |
| 2001/0020701 A1 | 9/2001 | Zagoskin |
| 2001/0023943 A1 | 9/2001 | Zagoskin |
| 2001/0025928 A1 | 10/2001 | Lingren |
| 2001/0026778 A1 | 10/2001 | Ackley |
| 2001/0026935 A1 | 10/2001 | Ackley |
| 2001/0029061 A1 | 10/2001 | Carlson |
| 2002/0001015 A1 | 1/2002 | Kojima |
| 2002/0008191 A1 | 1/2002 | Faska |
| 2002/0011640 A1 | 1/2002 | Bauer |
| 2002/0011642 A1 | 1/2002 | Dries |
| 2002/0028503 A1 | 3/2002 | Ackley |
| 2002/0060635 A1 | 5/2002 | Gupta |
| 2002/0097874 A1 | 7/2002 | Foden |
| 2002/0105948 A1 | 8/2002 | Glomb |
| 2002/0106867 A1 | 8/2002 | Yang |
| 2002/0111655 A1 | 8/2002 | Scribner |
| 2002/0117656 A1 | 8/2002 | Amin |
| 2002/0117738 A1 | 8/2002 | Amin |
| 2002/0118903 A1 | 8/2002 | Cottrell |
| 2002/0119805 A1 | 8/2002 | Smith |
| 2002/0121636 A1 | 9/2002 | Amin |
| 2002/0125472 A1 | 9/2002 | Johnson |
| 2002/0130313 A1 | 9/2002 | Zagoskin |
| 2002/0130315 A1 | 9/2002 | Zagoskin |
| 2002/0135373 A1 | 9/2002 | James |
| 2002/0135582 A1 | 9/2002 | Suzuoki |
| 2002/0135869 A1 | 9/2002 | Banish |
| 2002/0138637 A1 | 9/2002 | Suzuoki |
| 2002/0138701 A1 | 9/2002 | Suzuoki |
| 2002/0138707 A1 | 9/2002 | Suzuoki |
| 2002/0144548 A1 | 10/2002 | Cohn |
| 2002/0146919 A1 | 10/2002 | Cohn |
| 2002/0148957 A1 | 10/2002 | Lingren |
| 2002/0156993 A1 | 10/2002 | Suzuoki |
| 2002/0161417 A1 | 10/2002 | Scribner |

(56) References Cited

U.S. PATENT DOCUMENTS

| | | |
|---|---|---|
| 2002/0169079 A1 | 11/2002 | Suzuki |
| 2002/0177529 A1 | 11/2002 | Ustinov |
| 2002/0179921 A1 | 12/2002 | Cohn |
| 2002/0179937 A1 | 12/2002 | Ivanov |
| 2002/0179939 A1 | 12/2002 | Ivanov |
| 2002/0180006 A1 | 12/2002 | Franz |
| 2002/0188578 A1 | 12/2002 | Amin |
| 2002/0189533 A1 | 12/2002 | Kim |
| 2003/0000454 A1 | 1/2003 | Suh |
| 2003/0005010 A1 | 1/2003 | Cleve |
| 2003/0011398 A1 | 1/2003 | Herr |
| 2003/0015737 A1 | 1/2003 | Nikonov |
| 2003/0020075 A1 | 1/2003 | Nikonov |
| 2003/0021518 A1 | 1/2003 | Smirnov |
| 2003/0023651 A1 | 1/2003 | Whaley |
| 2003/0027724 A1 | 2/2003 | Rose |
| 2003/0034794 A1 | 2/2003 | Kameda |
| 2003/0038285 A1 | 2/2003 | Amin |
| 2003/0042481 A1 | 3/2003 | Tzalenchuk |
| 2003/0057441 A1 | 3/2003 | Ivanov |
| 2003/0068832 A1 | 4/2003 | Koval |
| 2003/0071258 A1 | 4/2003 | Zagoskin |
| 2003/0094606 A1 | 5/2003 | Newns |
| 2003/0098455 A1 | 5/2003 | Amin |
| 2003/0102432 A1 | 6/2003 | Boieriu |
| 2003/0102470 A1 | 6/2003 | Il'ichev et al. |
| 2003/0107033 A1 | 6/2003 | Tzalenchuk |
| 2003/0111659 A1 | 6/2003 | Tzalenchuk |
| 2003/0111661 A1 | 6/2003 | Tzalenchuk |
| 2003/0115401 A1 | 6/2003 | Herr |
| 2003/0121028 A1 | 6/2003 | Coury |
| 2003/0146429 A1 | 8/2003 | Tzalenchuk |
| 2003/0146430 A1 | 8/2003 | Tzalenchuk |
| 2003/0160172 A1 | 8/2003 | Ashokan |
| 2003/0164490 A1 | 9/2003 | Blais |
| 2003/0169041 A1 | 9/2003 | Coury |
| 2003/0173498 A1 | 9/2003 | Blais |
| 2003/0173997 A1 | 9/2003 | Blais |
| 2003/0178474 A1 | 9/2003 | Jiang |
| 2003/0179831 A1 | 9/2003 | Gupta |
| 2003/0183855 A1 | 10/2003 | Dries |
| 2003/0193097 A1 | 10/2003 | Il'ichev et al. |
| 2003/0194054 A1 | 10/2003 | Ziock |
| 2003/0199113 A1 | 10/2003 | Gunapala |
| 2003/0205704 A1 | 11/2003 | Gunapala |
| 2003/0207766 A1 | 11/2003 | Esteve |
| 2003/0207767 A1 | 11/2003 | Kim |
| 2003/0219911 A1 | 11/2003 | Zeng |
| 2003/0224944 A1 | 12/2003 | Il'ichev et al. |
| 2003/0229765 A1 | 12/2003 | Suzuoki |
| 2004/0000666 A1 | 1/2004 | Lidar |
| 2004/0008397 A1 | 1/2004 | Noonan |
| 2004/0012407 A1 | 1/2004 | Amin |
| 2004/0016872 A1 | 1/2004 | Toth |
| 2004/0016883 A1 | 1/2004 | Polonsky |
| 2004/0016918 A1 | 1/2004 | Amin |
| 2004/0017224 A1 | 1/2004 | Tumer |
| 2004/0021466 A1 | 2/2004 | Hammond |
| 2004/0022332 A1 | 2/2004 | Gupta |
| 2004/0031968 A1 | 2/2004 | F. DePaulis |
| 2004/0061056 A1 | 4/2004 | Barton |
| 2004/0063322 A1 | 4/2004 | Yang |
| 2004/0077503 A1 | 4/2004 | Blais |
| 2004/0095492 A1 | 5/2004 | Baxter |
| 2004/0095803 A1 | 5/2004 | Ustinov |
| 2004/0098443 A1 | 5/2004 | Omelyanchouk |
| 2004/0106966 A1 | 6/2004 | Scribner |
| 2004/0108461 A1 | 6/2004 | Mitra |
| 2004/0108564 A1 | 6/2004 | Mitra |
| 2004/0119061 A1 | 6/2004 | Wu |
| 2004/0120299 A1 | 6/2004 | Kidiyarova-Shevchenko |
| 2004/0124431 A1 | 7/2004 | DePaulis |
| 2004/0134967 A1 | 7/2004 | Moeckly |
| 2004/0135139 A1 | 7/2004 | Koval |
| 2004/0140537 A1 | 7/2004 | Il'ichev et al. |
| 2004/0142504 A1 | 7/2004 | Razeghi |
| 2004/0144927 A1 | 7/2004 | Auner |
| 2004/0150458 A1 | 8/2004 | Gupta |
| 2004/0165454 A1 | 8/2004 | Amin |
| 2004/0167036 A1 | 8/2004 | Amin |
| 2004/0169753 A1 | 9/2004 | Gulbransen |
| 2004/0170047 A1 | 9/2004 | Amin |
| 2004/0172100 A1 | 9/2004 | Humayun |
| 2004/0173787 A1 | 9/2004 | Blais |
| 2004/0173792 A1 | 9/2004 | Blais |
| 2004/0173793 A1 | 9/2004 | Blais |
| 2004/0188596 A1 | 9/2004 | Ludwig |
| 2004/0189328 A1 | 9/2004 | Parrish |
| 2004/0195516 A1 | 10/2004 | Matthews |
| 2004/0195640 A1 | 10/2004 | Nascetti |
| 2004/0220057 A1 | 11/2004 | Ference |
| 2004/0228436 A1 | 11/2004 | Zentai |
| 2004/0234785 A1 | 11/2004 | Liu |
| 2004/0238813 A1 | 12/2004 | Lidar |
| 2004/0240257 A1 | 12/2004 | Hollier |
| 2004/0241965 A1 | 12/2004 | Merritt |
| 2004/0266627 A1 | 12/2004 | Moeckly |
| 2005/0001209 A1 | 1/2005 | Hilton |
| 2005/0023518 A1 | 2/2005 | Herr |
| 2005/0035368 A1 | 2/2005 | Bunyk |
| 2005/0036055 A1 | 2/2005 | Nakasuji |
| 2005/0044054 A1 | 2/2005 | Helmick |
| 2005/0045872 A1 | 3/2005 | Newns |
| 2005/0045910 A1 | 3/2005 | Taylor |
| 2005/0062072 A1 | 3/2005 | Yamamoto |
| 2005/0070018 A1 | 3/2005 | Johnson |
| 2005/0071404 A1 | 3/2005 | Nutter |
| 2005/0071513 A1 | 3/2005 | Aguilar |
| 2005/0071526 A1 | 3/2005 | Brokenshire |
| 2005/0071578 A1 | 3/2005 | Day |
| 2005/0071651 A1 | 3/2005 | Aguilar |
| 2005/0071828 A1 | 3/2005 | Brokenshire |
| 2005/0074220 A1 | 4/2005 | Rey |
| 2005/0078022 A1 | 4/2005 | Hirano |
| 2005/0078117 A1 | 4/2005 | Suzuoki |
| 2005/0081181 A1 | 4/2005 | Brokenshire |
| 2005/0081182 A1 | 4/2005 | Minor |
| 2005/0081201 A1 | 4/2005 | Aguilar |
| 2005/0081202 A1 | 4/2005 | Brokenshire |
| 2005/0081203 A1 | 4/2005 | Aguilar |
| 2005/0081209 A1 | 4/2005 | Suzuoki |
| 2005/0081213 A1 | 4/2005 | Suzuoki |
| 2005/0082488 A1 | 4/2005 | Mollov |
| 2005/0082519 A1 | 4/2005 | Amin |
| 2005/0086655 A1 | 4/2005 | Aguilar |
| 2005/0091473 A1 | 4/2005 | Aguilar |
| 2005/0095011 A1 | 5/2005 | Cottrell |
| 2005/0097231 A1 | 5/2005 | Hofstee |
| 2005/0097280 A1 | 5/2005 | Hofstee |
| 2005/0097302 A1 | 5/2005 | Suzuoki |
| 2005/0098773 A1 | 5/2005 | Vion |
| 2005/0101489 A1 | 5/2005 | Blais |
| 2005/0107262 A1 | 5/2005 | Tanaka |
| 2005/0116204 A1 | 6/2005 | Moeckly |
| 2005/0116260 A1 | 6/2005 | Razeghi |
| 2005/0120185 A1 | 6/2005 | Yamazaki |
| 2005/0120187 A1 | 6/2005 | Suzuoki |
| 2005/0120254 A1 | 6/2005 | Suzuoki |
| 2005/0123674 A1 | 6/2005 | Stasiak |
| 2005/0131746 A1 | 6/2005 | Beausoleil |
| 2005/0133780 A1 | 6/2005 | Azuma |
| 2005/0138325 A1 | 6/2005 | Hofstee |
| 2005/0143791 A1 | 6/2005 | Hameroff |
| 2005/0160097 A1 | 7/2005 | Gschwind |
| 2005/0162302 A1 | 7/2005 | Omelyanchouk |
| 2005/0167606 A1 | 8/2005 | Harrison |
| 2005/0167772 A1 | 8/2005 | Stoneham |
| 2005/0184284 A1 | 8/2005 | Burkard |
| 2005/0184285 A1 | 8/2005 | Friesen |
| 2005/0188372 A1 | 8/2005 | Inoue |
| 2005/0188373 A1 | 8/2005 | Inoue |
| 2005/0189943 A1 | 9/2005 | Hammond |
| 2005/0197254 A1 | 9/2005 | Stasiak |
| 2005/0205954 A1 | 9/2005 | King |

(56) References Cited

U.S. PATENT DOCUMENTS

| | | |
|---|---|---|
| 2005/0216222 A1 | 9/2005 | Inoue |
| 2005/0216775 A1 | 9/2005 | Inoue |
| 2005/0224784 A1 | 10/2005 | Amin |
| 2005/0228967 A1 | 10/2005 | Hirairi |
| 2005/0231196 A1 | 10/2005 | Tarutani |
| 2005/0243708 A1 | 11/2005 | Bunyk |
| 2005/0250651 A1 | 11/2005 | Amin |
| 2005/0251659 A1 | 11/2005 | Yasue |
| 2005/0251667 A1 | 11/2005 | Iwamoto |
| 2005/0255631 A1 | 11/2005 | Bureau |
| 2005/0256007 A1 | 11/2005 | Amin |
| 2005/0261135 A1 | 11/2005 | Yamanaka |
| 2005/0263888 A1 | 12/2005 | Jiang |
| 2005/0268038 A1 | 12/2005 | Yasue |
| 2005/0268048 A1 | 12/2005 | Hofstee |
| 2005/0273306 A1 | 12/2005 | Hilton |
| 2005/0273652 A1 | 12/2005 | Okawa |
| 2006/0022190 A1 | 2/2006 | Freedman |
| 2006/0033096 A1 | 2/2006 | Astafiev |
| 2006/0033097 A1 | 2/2006 | Freedman |
| 2006/0038128 A1 | 2/2006 | D'Souza et al. |
| 2006/0038821 A1 | 2/2006 | Iwata |
| 2006/0043423 A1 | 3/2006 | Freedman |
| 2006/0045269 A1 | 3/2006 | Freedman |
| 2006/0049891 A1 | 3/2006 | Crete |
| 2006/0056759 A1 | 3/2006 | Farah |
| 2006/0069879 A1 | 3/2006 | Inoue |
| 2006/0075397 A1 | 4/2006 | Kasahara |
| 2006/0091375 A1 | 5/2006 | Freedman |
| 2006/0092957 A1 | 5/2006 | Yamazaki |
| 2006/0093861 A1 | 5/2006 | Pogrebnyakov |
| 2006/0097746 A1 | 5/2006 | Amin |
| 2006/0097747 A1 | 5/2006 | Amin |
| 2006/0107122 A1 | 5/2006 | Kasahara |
| 2006/0108528 A1 | 5/2006 | Qiu |
| 2006/0112213 A1 | 5/2006 | Suzuoki |
| 2006/0115086 A1 | 6/2006 | Beausoleil |
| 2006/0118721 A1 | 6/2006 | Antoszewski |
| 2006/0118722 A1 | 6/2006 | Pham |
| 2006/0123363 A1 | 6/2006 | Williams |
| 2006/0126770 A1 | 6/2006 | Yamazaki |
| 2006/0129786 A1 | 6/2006 | Yamazaki |
| 2006/0129999 A1 | 6/2006 | Hiraoka |
| 2006/0143509 A1 | 6/2006 | Okawa |
| 2006/0147154 A1 | 7/2006 | Thom |
| 2006/0149861 A1 | 7/2006 | Yamazaki |
| 2006/0151775 A1 | 7/2006 | Hollenberg |
| 2006/0155792 A1 | 7/2006 | Inoue |
| 2006/0155955 A1 | 7/2006 | Gschwind |
| 2006/0155964 A1 | 7/2006 | Totsuka |
| 2006/0157713 A1 | 7/2006 | Linares |
| 2006/0161741 A1 | 7/2006 | Yasue |
| 2006/0177122 A1 | 8/2006 | Yasue |
| 2006/0179029 A1 | 8/2006 | Vala |
| 2006/0179179 A1 | 8/2006 | Suzuoki |
| 2006/0179198 A1 | 8/2006 | Inoue |
| 2006/0179255 A1 | 8/2006 | Yamazaki |
| 2006/0179275 A1 | 8/2006 | Yamazaki |
| 2006/0179277 A1 | 8/2006 | Flachs |
| 2006/0179278 A1 | 8/2006 | Suzuoki |
| 2006/0179436 A1 | 8/2006 | Yasue |
| 2006/0181627 A1 | 8/2006 | Farrier |
| 2006/0190614 A1 | 8/2006 | Altman |
| 2006/0190942 A1 | 8/2006 | Inoue |
| 2006/0195824 A1 | 8/2006 | Iwamoto |
| 2006/0206731 A1 | 9/2006 | Kasahara |
| 2006/0206732 A1 | 9/2006 | Kasahara |
| 2006/0212643 A1 | 9/2006 | Suzuoki |
| 2006/0225165 A1 | 10/2006 | van den Brink |
| 2006/0232674 A1 | 10/2006 | Cochran |
| 2006/0232760 A1 | 10/2006 | Asbrock |
| 2006/0248618 A1 | 11/2006 | Berkley |
| 2006/0251070 A1 | 11/2006 | Yamazaki |
| 2006/0255987 A1 | 11/2006 | Nagasawa |
| 2006/0259733 A1 | 11/2006 | Yamazaki |
| 2006/0259743 A1 | 11/2006 | Suzuoki |
| 2006/0260016 A1 | 11/2006 | Greentree |
| 2006/0270173 A1 | 11/2006 | Yoshihara |
| 2007/0001119 A1 | 1/2007 | Mollov |
| 2007/0012948 A1 | 1/2007 | Dries |
| 2007/0025504 A1 | 2/2007 | Tumer |
| 2007/0048746 A1 | 3/2007 | Su |
| 2007/0049097 A1 | 3/2007 | Hirano |
| 2007/0052947 A1 | 3/2007 | Ludwig |
| 2007/0063700 A1 | 3/2007 | Levitt |
| 2007/0073038 A1 | 3/2007 | Keller |
| 2007/0075224 A1 | 4/2007 | Jones |
| 2007/0075729 A1 | 4/2007 | Kirichenko |
| 2007/0075752 A1 | 4/2007 | Kirichenko |
| 2007/0075888 A1 | 4/2007 | Kelly |
| 2007/0077906 A1 | 4/2007 | Kirichenko |
| 2007/0080341 A1 | 4/2007 | MacReady |
| 2007/0083870 A1 | 4/2007 | Kanakogi |
| 2007/0131868 A1 | 6/2007 | Capote |
| 2007/0135676 A1 | 6/2007 | How |
| 2007/0162407 A1 | 7/2007 | Freedman |
| 2007/0168538 A1 | 7/2007 | Suzuoki |
| 2007/0170952 A1 | 7/2007 | Freedman |
| 2007/0174227 A1 | 7/2007 | Johnson |
| 2007/0176625 A1 | 8/2007 | Hayashi |
| 2007/0180041 A1 | 8/2007 | Suzuoki |
| 2007/0180586 A1 | 8/2007 | Amin |
| 2007/0186077 A1 | 8/2007 | Gschwind |
| 2007/0194225 A1 | 8/2007 | Zorn |
| 2007/0194958 A1 | 8/2007 | Kirichenko |
| 2007/0197022 A1 | 8/2007 | Hails |
| 2007/0209437 A1 | 9/2007 | Xue |
| 2007/0210244 A1 | 9/2007 | Halvis |
| 2007/0215862 A1 | 9/2007 | Beausoleil |
| 2007/0224722 A1 | 9/2007 | Matthews |
| 2007/0235656 A1 | 10/2007 | Capote |
| 2007/0235758 A1 | 10/2007 | Klipstein |
| 2007/0239366 A1 | 10/2007 | Hilton |
| 2007/0240013 A1 | 10/2007 | Hayashi |
| 2007/0241747 A1 | 10/2007 | Morley |
| 2007/0250280 A1 | 10/2007 | Beausoleil |
| 2007/0258329 A1 | 11/2007 | Winey |
| 2007/0263432 A1 | 11/2007 | Pertti |
| 2007/0277000 A1 | 11/2007 | Ohtsuka |
| 2007/0283103 A1 | 12/2007 | Hofstee |
| 2007/0287015 A1 | 12/2007 | Naaman |
| 2007/0288701 A1 | 12/2007 | Hofstee |
| 2007/0293160 A1 | 12/2007 | Gupta |
| 2007/0295954 A1 | 12/2007 | Burkard |
| 2008/0019872 A1 | 1/2008 | Ackley |
| 2008/0032895 A1 | 2/2008 | Hammond |
| 2008/0040805 A1 | 2/2008 | Yasue |
| 2008/0048762 A1 | 2/2008 | Inamdar |
| 2008/0048902 A1 | 2/2008 | Rylov |
| 2008/0049885 A1 | 2/2008 | Inamdar |
| 2008/0052055 A1 | 2/2008 | Rose |
| 2008/0052504 A1 | 2/2008 | Tsuji |
| 2008/0065573 A1 | 3/2008 | Macready |
| 2008/0077721 A1 | 3/2008 | Terakawa |
| 2008/0077815 A1 | 3/2008 | Kanakogi |
| 2008/0079704 A1 | 4/2008 | Joshi |
| 2008/0086438 A1 | 4/2008 | Amin |
| 2008/0089282 A1 | 4/2008 | Malladi |
| 2008/0089637 A1 | 4/2008 | Farah |
| 2008/0090319 A1 | 4/2008 | Ginn |
| 2008/0091886 A1 | 4/2008 | Terakawa |
| 2008/0095110 A1 | 4/2008 | Montojo |
| 2008/0098260 A1 | 4/2008 | Okawa |
| 2008/0101444 A1 | 5/2008 | Gupta |
| 2008/0101501 A1 | 5/2008 | Gupta |
| 2008/0101503 A1 | 5/2008 | Gupta |
| 2008/0103708 A1 | 5/2008 | Inoue |
| 2008/0107213 A1 | 5/2008 | Gupta |
| 2008/0109500 A1 | 5/2008 | Macready |
| 2008/0111152 A1 | 5/2008 | Scott |
| 2008/0112313 A1 | 5/2008 | Terakawa |
| 2008/0116448 A1 | 5/2008 | Kitaev |
| 2008/0116449 A1 | 5/2008 | Macready |
| 2008/0117833 A1 | 5/2008 | Borran |

(56) References Cited

U.S. PATENT DOCUMENTS

| | | |
|---|---|---|
| 2008/0120259 A1 | 5/2008 | Freedman |
| 2008/0123520 A1 | 5/2008 | Ji |
| 2008/0126601 A1 | 5/2008 | Hayashi |
| 2008/0129328 A1 | 6/2008 | Freedman |
| 2008/0132281 A1 | 6/2008 | Kim |
| 2008/0135757 A1 | 6/2008 | D'Souza et al. |
| 2008/0146449 A1 | 6/2008 | Lesueur |
| 2008/0155203 A1 | 6/2008 | Aguilar |
| 2008/0162613 A1 | 7/2008 | Amin |
| 2008/0162834 A1 | 7/2008 | Brokenshire |
| 2008/0162877 A1 | 7/2008 | Altman |
| 2008/0168443 A1 | 7/2008 | Brokenshire |
| 2008/0176750 A1 | 7/2008 | Rose |
| 2008/0185576 A1 | 8/2008 | Hollenberg |
| 2008/0186064 A1 | 8/2008 | Kirichenko |
| 2008/0186918 A1 | 8/2008 | Tinnakornsrisuphap |
| 2008/0209156 A1 | 8/2008 | Inoue |
| 2008/0214198 A1 | 9/2008 | Chen |
| 2008/0215850 A1 | 9/2008 | Berkley |
| 2008/0218519 A1 | 9/2008 | Coury |
| 2008/0224726 A1 | 9/2008 | Freedman |
| 2008/0225823 A1 | 9/2008 | Tenny |
| 2008/0227624 A1 | 9/2008 | Keller |
| 2008/0229143 A1 | 9/2008 | Muraki |
| 2008/0231353 A1 | 9/2008 | Filippov |
| 2008/0231719 A1 | 9/2008 | Benson |
| 2008/0233967 A1 | 9/2008 | Montojo |
| 2008/0235679 A1 | 9/2008 | Aguilar |
| 2008/0238531 A1 | 10/2008 | Harris |
| 2008/0250414 A1 | 10/2008 | Brokenshire |
| 2008/0256275 A1 | 10/2008 | Hofstee |
| 2008/0258753 A1 | 10/2008 | Harris |
| 2008/0258849 A1 | 10/2008 | Keefe |
| 2008/0260257 A1 | 10/2008 | Rose |
| 2008/0262989 A1 | 10/2008 | Su |
| 2008/0271003 A1 | 10/2008 | Minor |
| 2008/0274898 A1 | 11/2008 | Johnson |
| 2008/0276232 A1 | 11/2008 | Aguilar |
| 2008/0277784 A1 | 11/2008 | Ozaki |
| 2008/0279370 A1 | 11/2008 | Hatakeyama |
| 2008/0282063 A1 | 11/2008 | Hatakeyama |
| 2008/0282084 A1 | 11/2008 | Hatakeyama |
| 2008/0282093 A1 | 11/2008 | Hatakeyama |
| 2008/0282341 A1 | 11/2008 | Hatakeyama |
| 2008/0282342 A1 | 11/2008 | Hatakeyama |
| 2008/0284545 A1 | 11/2008 | Keefe |
| 2008/0290938 A1 | 11/2008 | Gupta |
| 2008/0291945 A1 | 11/2008 | Luo |
| 2008/0297230 A1 | 12/2008 | Dzurak |
| 2008/0301695 A1 | 12/2008 | Aguilar, Jr. |
| 2008/0310324 A1 | 12/2008 | Chaponniere |
| 2008/0313114 A1 | 12/2008 | Rose |
| 2008/0313430 A1 | 12/2008 | Bunyk |
| 2009/0001278 A1 | 1/2009 | Jones |
| 2009/0002014 A1 | 1/2009 | Gupta |
| 2009/0003282 A1 | 1/2009 | Meylan |
| 2009/0004760 A1 | 1/2009 | Pitault |
| 2009/0005260 A1 | 1/2009 | Su |
| 2009/0008632 A1 | 1/2009 | Bunyk |
| 2009/0010090 A1 | 1/2009 | Lloyd |
| 2009/0014714 A1 | 1/2009 | Koch |
| 2009/0015317 A1 | 1/2009 | DiVincenzo |
| 2009/0028112 A1 | 1/2009 | Attar |
| 2009/0033369 A1 | 2/2009 | Baumgardner |
| 2009/0042511 A1 | 2/2009 | Malladi |
| 2009/0046573 A1 | 2/2009 | Damnjanovic |
| 2009/0050786 A1 | 2/2009 | Baiko |
| 2009/0051796 A1 | 2/2009 | Massie |
| 2009/0057652 A1 | 3/2009 | Nevirkovets |
| 2009/0068355 A1 | 3/2009 | Moeckly |
| 2009/0070402 A1 | 3/2009 | Rose |
| 2009/0072284 A1 | 3/2009 | King |
| 2009/0073017 A1 | 3/2009 | Kim |
| 2009/0075825 A1 | 3/2009 | Rose |
| 2009/0077001 A1 | 3/2009 | Macready |
| 2009/0078872 A1 | 3/2009 | Korsah |
| 2009/0078931 A1 | 3/2009 | Berkley |
| 2009/0078932 A1 | 3/2009 | Amin |
| 2009/0079956 A1 | 3/2009 | Kennedy |
| 2009/0082209 A1 | 3/2009 | Bunyk |
| 2009/0085694 A1 | 4/2009 | Keefe |
| 2009/0086533 A1 | 4/2009 | Kirichenko |
| 2009/0086713 A1 | 4/2009 | Luo |
| 2009/0087084 A1 | 4/2009 | Neigovzen |
| 2009/0097650 A1 | 4/2009 | Cornwall |
| 2009/0097652 A1 | 4/2009 | Freedman |
| 2009/0101919 A1 | 4/2009 | Yao |
| 2009/0102580 A1 | 4/2009 | Uchaykin |
| 2009/0108942 A1 | 4/2009 | Liu |
| 2009/0109582 A1 | 4/2009 | Jack |
| 2009/0121215 A1 | 5/2009 | Choi |
| 2009/0121307 A1 | 5/2009 | Tennant |
| 2009/0122173 A1 | 5/2009 | Tennant |
| 2009/0122508 A1 | 5/2009 | Uchaykin |
| 2009/0125717 A1 | 5/2009 | Suzuoki |
| 2009/0135944 A1 | 5/2009 | Dyer |
| 2009/0153381 A1 | 6/2009 | Kirichenko |
| 2009/0167342 A1 | 7/2009 | van den Brink |
| 2009/0168286 A1 | 7/2009 | Berkley |
| 2009/0173883 A1 | 7/2009 | Kauffman |
| 2009/0173936 A1 | 7/2009 | Bunyk |
| 2009/0177603 A1 | 7/2009 | Honisch |
| 2009/0182542 A9 | 7/2009 | Hilton |
| 2009/0192041 A1 | 7/2009 | Johansson |
| 2009/0206871 A1 | 8/2009 | Baumgardner |
| 2009/0214169 A1 | 8/2009 | Linares |
| 2009/0220082 A1 | 9/2009 | Freedman |
| 2009/0232191 A1 | 9/2009 | Gupta |
| 2009/0232507 A1 | 9/2009 | Gupta |
| 2009/0232510 A1 | 9/2009 | Gupta |
| 2009/0237106 A1 | 9/2009 | Kirichenko |
| 2009/0241013 A1 | 9/2009 | Roetteler |
| 2009/0244342 A1 | 10/2009 | Hollier |
| 2009/0244958 A1 | 10/2009 | Bulzacchelli |
| 2009/0256231 A1 | 10/2009 | Klipstein |
| 2009/0259905 A1 | 10/2009 | Silva |
| 2009/0261319 A1 | 10/2009 | Maekawa |
| 2009/0265112 A1 | 10/2009 | Wilber |
| 2009/0278046 A1 | 11/2009 | Allen |
| 2009/0289638 A1 | 11/2009 | Farinelli |
| 2009/0290680 A1 | 11/2009 | Tumer |
| 2009/0299947 A1 | 12/2009 | Amin |
| 2009/0316842 A1 | 12/2009 | Lu |
| 2009/0317089 A1 | 12/2009 | Peters |
| 2009/0319757 A1 | 12/2009 | Berkley |
| 2009/0321642 A1 | 12/2009 | Velicu |
| 2009/0321720 A1 | 12/2009 | Rose |
| 2009/0322374 A1 | 12/2009 | Przybysz |
| 2010/0025588 A1 | 2/2010 | Trupke |
| 2010/0026447 A1 | 2/2010 | Keefe |
| 2010/0026537 A1 | 2/2010 | Kirichenko |
| 2010/0027486 A1 | 2/2010 | Gorokhov |
| 2010/0035052 A1 | 2/2010 | Farah |
| 2010/0038539 A1 | 2/2010 | Endres |
| 2010/0057653 A1 | 3/2010 | Wilber |
| 2010/0062144 A1 | 3/2010 | Zibrov |
| 2010/0066576 A1 | 3/2010 | Kirichenko |
| 2010/0085678 A1 | 4/2010 | Jefferson |
| 2010/0085827 A1 | 4/2010 | Thom |
| 2010/0094796 A1 | 4/2010 | Roetteler |
| 2010/0101840 A1 | 4/2010 | Hampp |
| 2010/0105406 A1 | 4/2010 | Luo |
| 2010/0109638 A1 | 5/2010 | Berns |
| 2010/0116999 A1 | 5/2010 | Tümer |
| 2010/0133514 A1 | 6/2010 | Bunyk |
| 2010/0140732 A1 | 6/2010 | Eminoglu |
| 2010/0148841 A1 | 6/2010 | Kirichenko |
| 2010/0148853 A1 | 6/2010 | Harris |
| 2010/0149011 A1 | 6/2010 | Kirichenko |
| 2010/0157310 A1 | 6/2010 | Bennett |
| 2010/0157552 A1 | 6/2010 | Thom |
| 2010/0182039 A1 | 7/2010 | Baumgardner |
| 2010/0194466 A1 | 8/2010 | Yorozu |
| 2010/0224912 A1 | 9/2010 | Singh |

(56) References Cited

U.S. PATENT DOCUMENTS

| | | |
|---|---|---|
| 2010/0226495 A1 | 9/2010 | Kelly |
| 2010/0241780 A1 | 9/2010 | Friesen |
| 2010/0246754 A1 | 9/2010 | Morton |
| 2010/0264921 A1 | 10/2010 | Horng |
| 2010/0270534 A1 | 10/2010 | Pioro-Ladriere |
| 2010/0281885 A1 | 11/2010 | Black |
| 2010/0295095 A1 | 11/2010 | Klipstein |
| 2010/0295141 A1 | 11/2010 | Abbott |
| 2010/0296591 A1 | 11/2010 | Xu |
| 2010/0303188 A1 | 12/2010 | Lawandy |
| 2010/0306142 A1 | 12/2010 | Amin |
| 2010/0312969 A1 | 12/2010 | Yamazaki |
| 2010/0315079 A1 | 12/2010 | Lukin |
| 2010/0329401 A1 | 12/2010 | Terry |
| 2011/0009274 A1 | 1/2011 | Uchaykin |
| 2011/0010412 A1 | 1/2011 | Macready |
| 2011/0011531 A1 | 1/2011 | Schulte |
| 2011/0018612 A1 | 1/2011 | Harris |
| 2011/0022340 A1 | 1/2011 | DiVincenzo |
| 2011/0022820 A1 | 1/2011 | Bunyk |
| 2011/0031994 A1 | 2/2011 | Berkley |
| 2011/0032130 A1 | 2/2011 | Ludwig |
| 2011/0042772 A1 | 2/2011 | Hampp |
| 2011/0047201 A1 | 2/2011 | Macready |
| 2011/0049475 A1 | 3/2011 | Hollenberg |
| 2011/0054876 A1 | 3/2011 | Biamonte |
| 2011/0055520 A1 | 3/2011 | Berkley |
| 2011/0057169 A1 | 3/2011 | Harris |
| 2011/0060710 A1 | 3/2011 | Amin |
| 2011/0060711 A1 | 3/2011 | Macready |
| 2011/0060780 A1 | 3/2011 | Berkley |
| 2011/0065585 A1 | 3/2011 | Lanting |
| 2011/0065586 A1 | 3/2011 | Maibaum |
| 2011/0074403 A1 | 3/2011 | Horng |
| 2011/0079894 A1 | 4/2011 | Markunas |
| 2011/0084212 A1 | 4/2011 | Clark |
| 2011/0087909 A1 | 4/2011 | Kanakogi |
| 2011/0089405 A1 | 4/2011 | Ladizinsky |
| 2011/0101483 A1 | 5/2011 | Jones |
| 2011/0114705 A1 | 5/2011 | Matis |
| 2011/0121895 A1 | 5/2011 | Morello |
| 2011/0133770 A1 | 6/2011 | Przybysz |
| 2011/0142242 A1 | 6/2011 | Tanaka |
| 2011/0147707 A1 | 6/2011 | Inada |
| 2011/0147877 A1 | 6/2011 | Wehner |
| 2011/0152104 A1 | 6/2011 | Farinelli |
| 2011/0156008 A1 | 6/2011 | Freedman |
| 2011/0156097 A1 | 6/2011 | Maimon |
| 2011/0161638 A1 | 6/2011 | Freedman |
| 2011/0167241 A1 | 7/2011 | Kirichenko |
| 2011/0169117 A1 | 7/2011 | McIntosh |
| 2011/0169160 A1 | 7/2011 | Greer |
| 2011/0175061 A1 | 7/2011 | Berkley |
| 2011/0175062 A1 | 7/2011 | Farinelli |
| 2011/0176577 A1 | 7/2011 | Bandara |
| 2011/0198719 A1 | 8/2011 | Burgaud |
| 2011/0215222 A1 | 9/2011 | Eminoglu |
| 2011/0218432 A1 | 9/2011 | Tumer |
| 2011/0221024 A1 | 9/2011 | Bornfreund |
| 2011/0221025 A1 | 9/2011 | Bornfreund |
| 2011/0231462 A1 | 9/2011 | Macready |
| 2011/0233394 A1 | 9/2011 | Glasser |
| 2011/0233709 A1 | 9/2011 | Scott |
| 2011/0238607 A1 | 9/2011 | Coury |
| 2011/0248316 A1 | 10/2011 | Bois |
| 2011/0249548 A1 | 10/2011 | Gaal |
| 2011/0253430 A1 | 10/2011 | Woychik |
| 2011/0253906 A1 | 10/2011 | Solano |
| 2011/0261191 A1 | 10/2011 | Byren |
| 2011/0272589 A1 | 11/2011 | Yang |
| 2011/0287941 A1 | 11/2011 | Bonderson |
| 2011/0287944 A1 | 11/2011 | Folk |
| 2011/0288823 A1 | 11/2011 | Gupta |
| 2011/0298489 A1 | 12/2011 | van den Brink |
| 2011/0302591 A1 | 12/2011 | Suzuoki |
| 2011/0303153 A1 | 12/2011 | Moeckly |
| 2011/0315429 A1 | 12/2011 | Chen |
| 2012/0001288 A1 | 1/2012 | Scott |
| 2012/0005456 A1 | 1/2012 | Berkley |
| 2012/0023053 A1 | 1/2012 | Harris |
| 2012/0028401 A1 | 2/2012 | De Munck |
| 2012/0028806 A1 | 2/2012 | Bonderson |
| 2012/0030386 A1 | 2/2012 | Hofstee |
| 2012/0043637 A1 | 2/2012 | King |
| 2012/0045136 A1 | 2/2012 | Rose |
| 2012/0058602 A1 | 3/2012 | Linares |
| 2012/0068225 A1 | 3/2012 | Gravrand |
| 2012/0068295 A1 | 3/2012 | Gravrand |
| 2012/0071333 A1 | 3/2012 | Kauffman |
| 2012/0072191 A1 | 3/2012 | Freedman |
| 2012/0075682 A1 | 3/2012 | Amoroso |
| 2012/0083302 A1 | 4/2012 | Borran |
| 2012/0088674 A1 | 4/2012 | Faley |
| 2012/0091193 A1 | 4/2012 | Gavinsky |
| 2012/0094838 A1 | 4/2012 | Bunyk |
| 2012/0096873 A1 | 4/2012 | Webber |
| 2012/0108434 A1 | 5/2012 | Bulzacchelli |
| 2012/0112168 A1 | 5/2012 | Bonderson |
| 2012/0123693 A1 | 5/2012 | Wilber |
| 2012/0124432 A1 | 5/2012 | Pesetski |
| 2012/0135867 A1 | 5/2012 | Thom |
| 2012/0138774 A1 | 6/2012 | Kelly |
| 2012/0144159 A1 | 6/2012 | Pesetski |
| 2012/0149581 A1 | 6/2012 | Fang |
| 2012/0159272 A1 | 6/2012 | Pesetski |
| 2012/0161001 A1 | 6/2012 | Bornfreund |
| 2012/0161314 A1 | 6/2012 | Markunas |
| 2012/0172233 A1 | 7/2012 | Uchaykin |
| 2012/0184445 A1 | 7/2012 | Mukhanov |
| 2012/0187297 A1 | 7/2012 | Mullins |
| 2012/0187378 A1 | 7/2012 | Bonderson |
| 2012/0205541 A1 | 8/2012 | Lee |
| 2012/0210111 A1 | 8/2012 | Ozols |
| 2012/0212375 A1 | 8/2012 | Depree, Iv |
| 2012/0213371 A1 | 8/2012 | Bush |
| 2012/0215821 A1 | 8/2012 | Macready |
| 2012/0254586 A1 | 10/2012 | Amin |
| 2012/0258861 A1 | 10/2012 | Bonderson |
| 2012/0262322 A1 | 10/2012 | Kelly |
| 2012/0265718 A1 | 10/2012 | Amin |
| 2012/0266174 A1 | 10/2012 | Inoue |
| 2012/0273951 A1 | 11/2012 | Getty |
| 2012/0274494 A1 | 11/2012 | Kirichenko |
| 2012/0278057 A1 | 11/2012 | Biamonte |
| 2012/0285923 A1 | 11/2012 | Hampp |
| 2012/0306039 A1 | 12/2012 | Scott |
| 2012/0319085 A1 | 12/2012 | Gambetta |
| 2012/0319684 A1 | 12/2012 | Gambetta |
| 2012/0320668 A1 | 12/2012 | Lewis |
| 2012/0326130 A1 | 12/2012 | Maekawa |
| 2012/0326720 A1 | 12/2012 | Gambetta |
| 2012/0328290 A1 | 12/2012 | Yuan |
| 2012/0328301 A1 | 12/2012 | Gupta |
| 2013/0000963 A1 | 1/2013 | Woychick |
| 2013/0004180 A1 | 1/2013 | Gupta |
| 2013/0005580 A1 | 1/2013 | Bunyk |
| 2013/0007087 A1 | 1/2013 | van den Brink |
| 2013/0009677 A1 | 1/2013 | Naaman |
| 2013/0016835 A1 | 1/2013 | Zbinden |
| 2013/0028372 A1 | 1/2013 | Morton |
| 2013/0029848 A1 | 1/2013 | Gonzalez |
| 2013/0036078 A9 | 2/2013 | Wilber |
| 2013/0039236 A1 | 2/2013 | Malladi |
| 2013/0043945 A1 | 2/2013 | McDermott |
| 2013/0044248 A1 | 2/2013 | Tumer |
| 2013/0048950 A1 | 2/2013 | Levy |
| 2013/0076910 A1 | 3/2013 | Scott |
| 2013/0079230 A1 | 3/2013 | Poppe |
| 2013/0082241 A1 | 4/2013 | Kub |
| 2013/0087766 A1 | 4/2013 | Schenkel |
| 2013/0107243 A1 | 5/2013 | Ludwig |
| 2013/0107617 A1 | 5/2013 | Skold |
| 2013/0117200 A1 | 5/2013 | Thom |
| 2013/0119351 A1 | 5/2013 | Shea |

(56) References Cited

U.S. PATENT DOCUMENTS

| | | |
|---|---|---|
| 2013/0126746 A1 | 5/2013 | Bolotnikov |
| 2013/0136112 A1 | 5/2013 | Montojo |
| 2013/0144925 A1 | 6/2013 | Macready |
| 2013/0153856 A1 | 6/2013 | Das |
| 2013/0168233 A1 | 7/2013 | Eom |
| 2013/0175430 A1 | 7/2013 | Cunningham |
| 2013/0187028 A1 | 7/2013 | Salvestrini |
| 2013/0190185 A1 | 7/2013 | Chavez |
| 2013/0193308 A1 | 8/2013 | Cellek |
| 2013/0196855 A1 | 8/2013 | Poletto |
| 2013/0214373 A9 | 8/2013 | Scott |
| 2013/0231249 A1 | 9/2013 | Black |
| 2013/0244417 A1 | 9/2013 | Markunas |
| 2013/0246495 A1 | 9/2013 | Svore |
| 2013/0250272 A1 | 9/2013 | Ludwig |
| 2013/0250273 A1 | 9/2013 | Ludwig |
| 2013/0250926 A1 | 9/2013 | Tenny |
| 2013/0251145 A1 | 9/2013 | Lowans |
| 2013/0258595 A1 | 10/2013 | Tuckerman |
| 2013/0258869 A1 | 10/2013 | Zhou |
| 2013/0270329 A1 | 10/2013 | Schulte |
| 2013/0272453 A1 | 10/2013 | Gupta |
| 2013/0273730 A1 | 10/2013 | Huang |
| 2013/0278283 A1 | 10/2013 | Berkley |
| 2013/0279617 A1 | 10/2013 | Xu |
| 2013/0282636 A1 | 10/2013 | Macready |
| 2013/0299783 A1 | 11/2013 | Lutchyn |
| 2013/0303379 A1 | 11/2013 | Bulzacchelli |
| 2013/0308956 A1 | 11/2013 | Meyers |
| 2013/0313526 A1 | 11/2013 | Harris |
| 2013/0322873 A1 | 12/2013 | Stevenson |
| 2013/0341594 A1 | 12/2013 | Mohseni |
| 2014/0025606 A1 | 1/2014 | Macready |
| 2014/0050475 A1 | 2/2014 | Bonderson |
| 2014/0056385 A1 | 2/2014 | Terry |
| 2014/0061472 A1 | 3/2014 | Salvestrini |
| 2014/0061838 A1 | 3/2014 | Stupar |
| 2014/0061911 A1 | 3/2014 | Cooper |
| 2014/0063306 A1 | 3/2014 | Scott |
| 2014/0091218 A1 | 4/2014 | Thorne |
| 2014/0097405 A1 | 4/2014 | Bunyk |
| 2014/0102594 A1 | 4/2014 | Schulte |
| 2014/0113828 A1 | 4/2014 | Gilbert |
| 2014/0119537 A1 | 5/2014 | Legre |
| 2014/0160278 A1 | 6/2014 | Benson |
| 2014/0167811 A1 | 6/2014 | Gambetta |
| 2014/0167836 A1 | 6/2014 | Gambetta |
| 2014/0173926 A1 | 6/2014 | Hampp |
| 2014/0175286 A1 | 6/2014 | Vaillancourt |
| 2014/0175380 A1 | 6/2014 | Suzuki |
| 2014/0187427 A1 | 7/2014 | Macready |
| 2014/0197303 A1 | 7/2014 | Kelly |
| 2014/0203838 A1 | 7/2014 | Pesetski |
| 2014/0214257 A1 | 7/2014 | Williams |
| 2014/0217297 A1 | 8/2014 | Bolotnikov |
| 2014/0221059 A1 | 8/2014 | Freedman |
| 2014/0223224 A1 | 8/2014 | Berkley |
| 2014/0225214 A1 | 8/2014 | King |
| 2014/0228222 A1 | 8/2014 | Berkley |
| 2014/0229705 A1 | 8/2014 | van den Brink |
| 2014/0229722 A1 | 8/2014 | Harris |
| 2014/0235450 A1 | 8/2014 | Chow |
| 2014/0245249 A1 | 8/2014 | Macready |
| 2014/0245314 A1 | 8/2014 | Inoue |
| 2014/0246652 A1 | 9/2014 | Abraham |
| 2014/0246763 A1 | 9/2014 | Bunyk |
| 2014/0250288 A1 | 9/2014 | Roy |
| 2014/0263955 A1 | 9/2014 | Dixon |
| 2014/0264283 A1 | 9/2014 | Gambetta |
| 2014/0264284 A1 | 9/2014 | Abraham |
| 2014/0264285 A1 | 9/2014 | Chow |
| 2014/0264286 A1 | 9/2014 | Chang |
| 2014/0264287 A1 | 9/2014 | Abraham |
| 2014/0266496 A1 | 9/2014 | Abraham |
| 2014/0267852 A1 | 9/2014 | Bluzer |
| 2014/0274725 A1 | 9/2014 | Abraham |
| 2014/0279822 A1 | 9/2014 | Bonderson |
| 2014/0286465 A1 | 9/2014 | Gupta |
| 2014/0289583 A1 | 9/2014 | Goto |
| 2014/0291479 A1 | 10/2014 | Lu |
| 2014/0295907 A1 | 10/2014 | Luo |
| 2014/0312303 A1 | 10/2014 | Klipstein |
| 2014/0314419 A1 | 10/2014 | Paik |
| 2014/0315723 A1 | 10/2014 | Moyerman |
| 2014/0324933 A1 | 10/2014 | Macready |
| 2014/0329687 A1 | 11/2014 | Bunyk |
| 2014/0337612 A1 | 11/2014 | Williams |
| 2014/0340487 A1 | 11/2014 | Gilliland |
| 2014/0344322 A1 | 11/2014 | Ranjbar |
| 2014/0350836 A1 | 11/2014 | Stettner |
| 2014/0354326 A1 | 12/2014 | Bonderson |
| 2014/0355998 A1 | 12/2014 | Tanzilli |
| 2014/0357493 A1 | 12/2014 | Shea |
| 2014/0367824 A1 | 12/2014 | Kub |
| 2014/0368234 A1 | 12/2014 | Chow |
| 2015/0006443 A1 | 1/2015 | Rose |
| 2015/0024964 A1 | 1/2015 | Kauffman |
| 2015/0028970 A1 | 1/2015 | Chow |
| 2015/0032991 A1 | 1/2015 | Lanting |
| 2015/0032993 A1 | 1/2015 | Amin |
| 2015/0032994 A1 | 1/2015 | Chudak |
| 2015/0036967 A1 | 2/2015 | Smith |
| 2015/0046681 A1 | 2/2015 | King |
| 2015/0055630 A1 | 2/2015 | Attar |
| 2015/0055961 A1 | 2/2015 | Meyers |
| 2015/0060756 A1 | 3/2015 | Park |
| 2015/0078290 A1 | 3/2015 | Gupta |
| 2015/0097159 A1 | 4/2015 | Apalkov |
| 2015/0111754 A1 | 4/2015 | Harris |
| 2015/0115132 A1 | 4/2015 | Hirsch |
| 2015/0119252 A1 | 4/2015 | Ladizinsky |
| 2015/0119253 A1 | 4/2015 | Yohannes |
| 2015/0123831 A1 | 5/2015 | Kelly |
| 2015/0125155 A1 | 5/2015 | Gupta |
| 2015/0125829 A1 | 5/2015 | Hyman |
| 2015/0129089 A1 | 5/2015 | Liu |
| 2015/0136954 A1 | 5/2015 | Wein |
| 2015/0136955 A1 | 5/2015 | Wein |
| 2015/0146805 A1 | 5/2015 | Terry |
| 2015/0146806 A1 | 5/2015 | Terry |
| 2015/0155468 A1 | 6/2015 | Abraham |
| 2015/0161524 A1 | 6/2015 | Hamze |
| 2015/0163419 A1 | 6/2015 | Scott |
| 2015/0178432 A1 | 6/2015 | Muller |
| 2015/0179436 A1 | 6/2015 | Greer |
| 2015/0179914 A1 | 6/2015 | Greer |
| 2015/0179915 A1 | 6/2015 | Greer |
| 2015/0186791 A1 | 7/2015 | Pesetski |
| 2015/0187840 A1 | 7/2015 | Ladizinsky |
| 2015/0193692 A1 | 7/2015 | Israel |
| 2015/0199178 A1 | 7/2015 | Shi |
| 2015/0200778 A1 | 7/2015 | Shi |
| 2015/0202939 A1 | 7/2015 | Stettner |
| 2015/0205759 A1 | 7/2015 | Israel |
| 2015/0229343 A1 | 8/2015 | Gupta |
| 2015/0236235 A1 | 8/2015 | Ladizinsky |
| 2015/0241481 A1 | 8/2015 | Narla |
| 2015/0242758 A1 | 8/2015 | Bonderson |
| 2015/0243825 A1 | 8/2015 | Keasler |
| 2015/0254571 A1 | 9/2015 | Miller |
| 2015/0258990 A1 | 9/2015 | Stettner |
| 2015/0260812 A1 | 9/2015 | Drake |
| 2015/0262072 A1 | 9/2015 | Stoltz |
| 2015/0262073 A1 | 9/2015 | Lanting |
| 2015/0263260 A1 | 9/2015 | Thom |
| 2015/0263736 A1 | 9/2015 | Herr |
| 2015/0269124 A1 | 9/2015 | Hamze |
| 2015/0280035 A1 | 10/2015 | Rihani |
| 2015/0287870 A1 | 10/2015 | Mohseni |
| 2015/0288500 A1 | 10/2015 | Montojo |
| 2015/0299894 A1 | 10/2015 | Markham |
| 2015/0300719 A1 | 10/2015 | Strickland |
| 2015/0301180 A1 | 10/2015 | Stettner |
| 2015/0310350 A1 | 10/2015 | Niskanen |

(56) References Cited

U.S. PATENT DOCUMENTS

| | | |
|---|---|---|
| 2015/0311422 A1 | 10/2015 | Chang |
| 2015/0319391 A1 | 11/2015 | Yazici |
| 2015/0324705 A1 | 11/2015 | Biercuk |
| 2015/0325774 A1 | 11/2015 | Abraham |
| 2015/0331113 A1 | 11/2015 | Stettner |
| 2015/0332163 A1 | 11/2015 | Schroff |
| 2015/0332164 A1 | 11/2015 | van den Brink |
| 2015/0339417 A1 | 11/2015 | Garcia-Ramirez |
| 2015/0340584 A1 | 11/2015 | Chang |
| 2015/0346291 A1 | 12/2015 | Lanting |
| 2015/0349780 A1 | 12/2015 | Naaman |
| 2015/0354938 A1 | 12/2015 | Mower |
| 2015/0355369 A1 | 12/2015 | Morton |
| 2015/0357550 A1 | 12/2015 | Schoelkopf, III |
| 2015/0357783 A1 | 12/2015 | Abraham |
| 2015/0358022 A1 | 12/2015 | McDermott, III |
| 2015/0363707 A1 | 12/2015 | Abraham |
| 2015/0363708 A1 | 12/2015 | Amin |
| 2015/0364515 A1 | 12/2015 | King |
| 2015/0372217 A1 | 12/2015 | Schoelkopf, III |
| 2015/0379418 A1 | 12/2015 | Harris |
| 2016/0003946 A1 | 1/2016 | Gilliland |
| 2016/0012346 A1 | 1/2016 | Biamonte |
| 2016/0012347 A1 | 1/2016 | King |
| 2016/0012882 A1 | 1/2016 | Bleloch |
| 2016/0019468 A1 | 1/2016 | Bunyk |
| 2016/0026183 A1 | 1/2016 | Williams |
| 2016/0028402 A1 | 1/2016 | McCaughan |
| 2016/0028403 A1 | 1/2016 | McCaughan |
| 2016/0035404 A1 | 2/2016 | Ohki |
| 2016/0035470 A1 | 2/2016 | Yazdani |
| 2016/0036612 A1 | 2/2016 | Terry |
| 2016/0040288 A1 | 2/2016 | Wu |
| 2016/0042294 A1 | 2/2016 | Macready |
| 2016/0043268 A1 | 2/2016 | Bai |
| 2016/0055421 A1 | 2/2016 | Adachi |
| 2016/0065693 A1 | 3/2016 | Rose |
| 2016/0071021 A1 | 3/2016 | Raymond |
| 2016/0079968 A1 | 3/2016 | Strand |
| 2016/0080189 A1 | 3/2016 | Terry |
| 2016/0085616 A1 | 3/2016 | Berkley |
| 2016/0087001 A1 | 3/2016 | Tennant |
| 2016/0087598 A1 | 3/2016 | Thom |
| 2016/0087599 A1 | 3/2016 | Naaman |
| 2016/0093420 A1 | 3/2016 | Urzhumov |
| 2016/0093790 A1 | 3/2016 | Rigetti |
| 2016/0104073 A1 | 4/2016 | Sandberg |
| 2016/0104696 A1 | 4/2016 | Veigne |
| 2016/0112031 A1 | 4/2016 | Abraham |
| 2016/0125309 A1 | 5/2016 | Naaman |
| 2016/0125310 A1 | 5/2016 | Hollenberg |
| 2016/0132785 A1 | 5/2016 | Amin |
| 2016/0142657 A1 | 5/2016 | Caulfield |
| 2016/0148112 A1 | 5/2016 | Kwon |
| 2016/0148965 A1 | 5/2016 | Clayton |
| 2016/0150165 A1 | 5/2016 | Grauer |
| 2016/0155892 A1 | 6/2016 | Li |
| 2016/0156356 A1 | 6/2016 | Bronn |
| 2016/0156357 A1 | 6/2016 | Miller |
| 2016/0161411 A1 | 6/2016 | Hudson |
| 2016/0181458 A1 | 6/2016 | McIntosh |
| 2016/0191060 A1 | 6/2016 | McDermott, III |
| 2016/0195616 A1 | 7/2016 | Gilliland |
| 2016/0197628 A1 | 7/2016 | Gupta |
| 2016/0204330 A1 | 7/2016 | Abraham |
| 2016/0204331 A1 | 7/2016 | Abraham |
| 2016/0210560 A1 | 7/2016 | Alboszta |
| 2016/0211438 A1 | 7/2016 | Chang |
| 2016/0218139 A1 | 7/2016 | Ettenberg |
| 2016/0220814 A1 | 8/2016 | Chiao |
| 2016/0221825 A1 | 8/2016 | Allen |
| 2016/0231083 A1 | 8/2016 | Regan |
| 2016/0233860 A1 | 8/2016 | Naaman |
| 2016/0233965 A1 | 8/2016 | Medford |
| 2016/0245639 A1 | 8/2016 | Mower |
| 2016/0254434 A1 | 9/2016 | McDermott, III |
| 2016/0255284 A1 | 9/2016 | Benson |
| 2016/0266220 A1 | 9/2016 | Sushkov |
| 2016/0266242 A1 | 9/2016 | Gilliland |
| 2016/0267032 A1 | 9/2016 | Rigetti |
| 2016/0276570 A1 | 9/2016 | Chang |
| 2016/0283197 A1 | 9/2016 | Wilber |
| 2016/0283857 A1 | 9/2016 | Babbush |
| 2016/0292586 A1 | 10/2016 | Rigetti |
| 2016/0292587 A1 | 10/2016 | Rigetti |
| 2016/0295151 A1 | 10/2016 | Kelly |
| 2016/0300155 A1 | 10/2016 | Betz |
| 2016/0307956 A1 | 10/2016 | Klipstein |
| 2016/0308502 A1 | 10/2016 | Abdo |
| 2016/0314407 A1 | 10/2016 | Bunyk |
| 2016/0321559 A1 | 11/2016 | Rose |
| 2016/0322693 A1 | 11/2016 | Chang |
| 2016/0328208 A1 | 11/2016 | Tomaru |
| 2016/0328659 A1 | 11/2016 | Mohseni |
| 2016/0329896 A1 | 11/2016 | Bronn |
| 2016/0335558 A1 | 11/2016 | Bunyk |
| 2016/0335559 A1 | 11/2016 | Pereverzev |
| 2016/0335560 A1 | 11/2016 | Mohseni |
| 2016/0341818 A1 | 11/2016 | Gilliland |
| 2016/0343932 A1 | 11/2016 | Mohseni |
| 2016/0343934 A1 | 11/2016 | Chang |
| 2016/0343935 A1 | 11/2016 | Chang |
| 2016/0344414 A1 | 11/2016 | Naaman |
| 2016/0344965 A1 | 11/2016 | Grauer |
| 2016/0351306 A1 | 12/2016 | Faley |
| 2016/0352515 A1 | 12/2016 | Bunandar |
| 2016/0364653 A1 | 12/2016 | Chow |
| 2016/0371227 A1 | 12/2016 | Macready |
| 2016/0372443 A1 | 12/2016 | Aliane |
| 2016/0380026 A1 | 12/2016 | Abraham |
| 2016/0380636 A1 | 12/2016 | Abdo |
| 2017/0005255 A1 | 1/2017 | Dial |
| 2017/0006236 A1 | 1/2017 | French |
| 2017/0010223 A1 | 1/2017 | Tumer |
| 2017/0011305 A1 | 1/2017 | Williams |
| 2017/0012862 A1 | 1/2017 | Terry |
| 2017/0017742 A1 | 1/2017 | Oberg |
| 2017/0017894 A1 | 1/2017 | Lanting |
| 2017/0018312 A1 | 1/2017 | Benjamin |
| 2017/0025453 A1 | 1/2017 | Bornfreund |
| 2017/0026603 A1 | 1/2017 | Kelly |
| 2017/0033253 A1 | 2/2017 | Huntington |
| 2017/0033273 A1 | 2/2017 | Chang |
| 2017/0038123 A1 | 2/2017 | Strickland |
| 2017/0039481 A1 | 2/2017 | Abdo |
| 2017/0040368 A1 | 2/2017 | Grzesik |
| 2017/0041571 A1 | 2/2017 | Tyrrell |
| 2017/0061317 A1 | 3/2017 | Chow |
| 2017/0062107 A1 | 3/2017 | Naaman |
| 2017/0062228 A1 | 3/2017 | Chang |
| 2017/0062400 A1 | 3/2017 | Li |
| 2017/0062692 A1 | 3/2017 | Dial |
| 2017/0062898 A1 | 3/2017 | Chang |
| 2017/0069367 A1 | 3/2017 | Ohki |
| 2017/0069780 A1 | 3/2017 | Grzesik |
| 2017/0069819 A1 | 3/2017 | Liu |
| 2017/0071082 A1 | 3/2017 | Sadleir |
| 2017/0072504 A1 | 3/2017 | Abraham |
| 2017/0076787 A1 | 3/2017 | Frank |
| 2017/0077329 A1 | 3/2017 | Wichman |
| 2017/0077380 A1 | 3/2017 | Uchaykin |
| 2017/0077381 A1 | 3/2017 | Abdo |
| 2017/0077382 A1 | 3/2017 | Abraham |
| 2017/0077383 A1 | 3/2017 | Chang |
| 2017/0077665 A1 | 3/2017 | Liu |
| 2017/0084764 A1 | 3/2017 | Lu |
| 2017/0084773 A1 | 3/2017 | Piccione |
| 2017/0084813 A1 | 3/2017 | Chang |
| 2017/0085231 A1 | 3/2017 | Abdo |
| 2017/0089961 A1 | 3/2017 | Abdo |
| 2017/0090080 A1 | 3/2017 | Abdo |
| 2017/0091646 A1 | 3/2017 | Abdo |
| 2017/0091647 A1 | 3/2017 | Abdo |
| 2017/0091648 A1 | 3/2017 | Abdo |

(56) References Cited

U.S. PATENT DOCUMENTS

| | | |
|---|---|---|
| 2017/0091649 A1 | 3/2017 | Clarke |
| 2017/0091650 A1 | 3/2017 | King |
| 2017/0092833 A1 | 3/2017 | Abdo |
| 2017/0092834 A1 | 3/2017 | Fong |
| 2017/0093015 A1 | 3/2017 | Abdo |
| 2017/0093381 A1 | 3/2017 | Abdo |
| 2017/0094544 A1 | 3/2017 | Zhou |
| 2017/0098682 A1 | 4/2017 | Ladizinsky |
| 2017/0104546 A1 | 4/2017 | Bitauld |
| 2017/0104695 A1 | 4/2017 | Naaman |
| 2017/0109605 A1 | 4/2017 | Ahn |
| 2017/0116159 A1 | 4/2017 | Hamze |
| 2017/0116542 A1 | 4/2017 | Shim |
| 2017/0123171 A1 | 5/2017 | Goutzoulis |
| 2017/0132524 A1 | 5/2017 | Abdo |
| 2017/0133336 A1 | 5/2017 | Oliver |
| 2017/0133576 A1 | 5/2017 | Marcus |
| 2017/0133577 A1 | 5/2017 | Cybart |
| 2017/0134091 A1 | 5/2017 | Gupta |
| 2017/0138851 A1 | 5/2017 | Ashrafi |
| 2017/0140296 A1 | 5/2017 | Kerman |
| 2017/0141285 A1 | 5/2017 | Krogstrup |
| 2017/0141286 A1 | 5/2017 | Kerman |
| 2017/0141287 A1 | 5/2017 | Barkeshli |
| 2017/0141769 A1 | 5/2017 | Miller |
| 2017/0147303 A1 | 5/2017 | Amy |
| 2017/0148972 A1 | 5/2017 | Thompson |
| 2017/0160474 A1 | 6/2017 | Mahmoodian |
| 2017/0162778 A1 | 6/2017 | Harris |
| 2017/0163301 A1 | 6/2017 | Gupta |
| 2017/0167977 A1 | 6/2017 | Rivera |
| 2017/0170812 A1 | 6/2017 | Abdo |
| 2017/0170813 A1 | 6/2017 | Abdo |
| 2017/0170893 A1 | 6/2017 | Sanguinetti |
| 2017/0177534 A1 | 6/2017 | Mohseni |
| 2017/0177751 A1 | 6/2017 | Macready |
| 2017/0178017 A1 | 6/2017 | Roy |
| 2017/0178018 A1 | 6/2017 | Tcaciuc |
| 2017/0179185 A1 | 6/2017 | Klipstein |
| 2017/0179327 A1 | 6/2017 | Klipstein |
| 2017/0179973 A1 | 6/2017 | Bulzacchelli |
| 2017/0186934 A1 | 6/2017 | Kwon |
| 2017/0186935 A1 | 6/2017 | Bonetti |
| 2017/0193388 A1 | 7/2017 | Filipp |
| 2017/0199036 A1 | 7/2017 | Moxley, III |
| 2017/0201222 A1 | 7/2017 | Abdo |
| 2017/0201224 A1 | 7/2017 | Strong |
| 2017/0206461 A1 | 7/2017 | Friesen |
| 2017/0211200 A1 | 7/2017 | Winn |
| 2017/0212405 A1 | 7/2017 | Pant |
| 2017/0212860 A1 | 7/2017 | Naaman |
| 2017/0213143 A1 | 7/2017 | Chow |
| 2017/0214410 A1 | 7/2017 | Hincks |
| 2017/0220510 A1 | 8/2017 | Hilton |
| 2017/0222116 A1 | 8/2017 | Abdo |
| 2017/0223094 A1 | 8/2017 | Johnson |
| 2017/0223143 A1 | 8/2017 | Johnson |
| 2017/0227795 A1 | 8/2017 | Bishop |
| 2017/0228483 A1 | 8/2017 | Rigetti |
| 2017/0229167 A1 | 8/2017 | Reohr |
| 2017/0229631 A1 | 8/2017 | Abdo |
| 2017/0229632 A1 | 8/2017 | Abdo |
| 2017/0229633 A1 | 8/2017 | Abdo |
| 2017/0230050 A1 | 8/2017 | Rigetti |
| 2017/0237144 A1 | 8/2017 | Tobar |
| 2017/0237594 A1 | 8/2017 | Terry |
| 2017/0248832 A1 | 8/2017 | Kippenberg |
| 2017/0250209 A1 | 8/2017 | Piccione |
| 2017/0255629 A1 | 9/2017 | Thom |
| 2017/0255871 A1 | 9/2017 | Macready |
| 2017/0255872 A1 | 9/2017 | Hamze |
| 2017/0256698 A1 | 9/2017 | Nayfeh |
| 2017/0257074 A1 | 9/2017 | Yeh |
| 2017/0261770 A1 | 9/2017 | Bishop |
| 2017/0261771 A1 | 9/2017 | Bishop |
| 2017/0262765 A1 | 9/2017 | Bourassa |
| 2017/0264373 A1 | 9/2017 | Krovi |
| 2017/0265158 A1 | 9/2017 | Gupta |
| 2017/0270245 A1 | 9/2017 | Van Rooyen |
| 2017/0286858 A1 | 10/2017 | La Cour |
| 2017/0286859 A1 | 10/2017 | Harris |
| 2017/0293854 A1 | 10/2017 | Freedman |
| 2017/0295048 A1 | 10/2017 | Terry |
| 2017/0299763 A1 | 10/2017 | Morton |
| 2017/0300454 A1 | 10/2017 | van den Brink |
| 2017/0300808 A1 | 10/2017 | Ronagh |
| 2017/0300817 A1 | 10/2017 | King |
| 2017/0300827 A1 | 10/2017 | Amin |
| 2017/0308644 A1 | 10/2017 | Van Rooyen |
| 2017/0308804 A1 | 10/2017 | Wabnig |
| 2017/0316713 A1 | 11/2017 | Hyman |
| 2017/0317203 A1 | 11/2017 | Petta |
| 2017/0317262 A1 | 11/2017 | Abraham |
| 2017/0323195 A1 | 11/2017 | Crawford |
| 2017/0323206 A1 | 11/2017 | Alipour Khayer |
| 2017/0324019 A1 | 11/2017 | Ware |
| 2017/0329883 A1 | 11/2017 | Oberg |
| 2017/0330101 A1 | 11/2017 | Hastings |
| 2017/0330986 A1 | 11/2017 | Bedair |
| 2017/0337155 A1 | 11/2017 | Novotny |
| 2017/0344898 A1 | 11/2017 | Karimi |
| 2017/0345990 A1 | 11/2017 | Yohannes |
| 2017/0350929 A1 | 12/2017 | Vampa |
| 2017/0351967 A1 | 12/2017 | Babbush |
| 2017/0351974 A1 | 12/2017 | Rose |
| 2017/0357539 A1 | 12/2017 | Dadashikelayeh |
| 2017/0357561 A1 | 12/2017 | Kelly |
| 2017/0359072 A1 | 12/2017 | Hamilton |
| 2017/0364362 A1 | 12/2017 | Lidar |
| 2017/0370019 A1 | 12/2017 | Narayan |
| 2017/0372412 A1 | 12/2017 | Johnson |
| 2017/0372427 A1 | 12/2017 | Johnson |
| 2017/0372602 A1 | 12/2017 | Gilliland |
| 2017/0373044 A1 | 12/2017 | Das |
| 2017/0373153 A1 | 12/2017 | Narayan |
| 2017/0373369 A1 | 12/2017 | Abdo |
| 2017/0373658 A1 | 12/2017 | Thom |
| 2018/0003753 A1 | 1/2018 | Bishop |
| 2018/0005809 A1 | 1/2018 | Roukes |
| 2018/0005887 A1 | 1/2018 | Abraham |
| 2018/0011981 A1 | 1/2018 | El Naqa |
| 2018/0012932 A1 | 1/2018 | Oliver |
| 2018/0013022 A1 | 1/2018 | Lu |
| 2018/0013052 A1 | 1/2018 | Oliver |
| 2018/0013426 A1 | 1/2018 | Deurloo |
| 2018/0019269 A1 | 1/2018 | Klipstein |
| 2018/0024232 A1 | 1/2018 | Gilliland |
| 2018/0024254 A1 | 1/2018 | Roy |
| 2018/0026633 A1 | 1/2018 | Naaman |
| 2018/0032893 A1 | 2/2018 | Epstein |
| 2018/0032894 A1 | 2/2018 | Epstein |
| 2018/0033944 A1 | 2/2018 | Ladizinsky |
| 2018/0035067 A1 | 2/2018 | Tyrrell |
| 2018/0040800 A1 | 2/2018 | Chang |
| 2018/0040935 A1 | 2/2018 | Sliwa |
| 2018/0046933 A1 | 2/2018 | La Cour |
| 2018/0052806 A1 | 2/2018 | Hastings |
| 2018/0053112 A1 | 2/2018 | Bravyi |
| 2018/0053113 A1 | 2/2018 | Lutchyn |
| 2018/0053551 A1 | 2/2018 | Dayan |
| 2018/0053809 A1 | 2/2018 | Freedman |
| 2018/0054201 A1 | 2/2018 | Reagor |
| 2018/0056993 A1 | 3/2018 | Stettner |
| 2018/0067075 A1 | 3/2018 | Racz |
| 2018/0067182 A1 | 3/2018 | Clerk |
| 2018/0069288 A1 | 3/2018 | Minev |
| 2018/0075365 A1 | 3/2018 | Glaser |
| 2018/0075901 A1 | 3/2018 | Frank |
| 2018/0090200 A1 | 3/2018 | Soykal |
| 2018/0091115 A1 | 3/2018 | Abdo |
| 2018/0091141 A1 | 3/2018 | Abdo |
| 2018/0091142 A1 | 3/2018 | Abdo |
| 2018/0091143 A1 | 3/2018 | Abdo |
| 2018/0091244 A1 | 3/2018 | Abdo |

(56) References Cited

U.S. PATENT DOCUMENTS

| | | |
|---|---|---|
| 2018/0091440 A1 | 3/2018 | Dadashikelayeh |
| 2018/0094980 A1 | 4/2018 | Pezzaniti |
| 2018/0096085 A1 | 4/2018 | Rubin |
| 2018/0096257 A1 | 4/2018 | Lucarelli |
| 2018/0101784 A1 | 4/2018 | Rolfe |
| 2018/0101785 A1 | 4/2018 | Abdo |
| 2018/0101786 A1 | 4/2018 | Boothby |
| 2018/0101787 A1 | 4/2018 | Abdo |
| 2018/0102469 A1 | 4/2018 | Das |
| 2018/0102470 A1 | 4/2018 | Das |
| 2018/0107092 A1 | 4/2018 | Abdo |
| 2018/0107526 A1 | 4/2018 | Dadashikelayeh |
| 2018/0107938 A1 | 4/2018 | Morello |
| 2018/0107939 A1 | 4/2018 | Schoennenbeck |
| 2018/0109379 A1 | 4/2018 | Bitauld |
| 2018/0113373 A1 | 4/2018 | Witmer |
| 2018/0114138 A1 | 4/2018 | Monroe |
| 2018/0114713 A1 | 4/2018 | Drab |
| 2018/0121601 A1 | 5/2018 | Hahm |
| 2018/0122851 A1 | 5/2018 | Ettenberg |
| 2018/0123597 A1 | 5/2018 | Sete |
| 2018/0128739 A9 | 5/2018 | Ashrafi |
| 2018/0132393 A1 | 5/2018 | Schulte |
| 2018/0132394 A1 | 5/2018 | Schulte |
| 2018/0132395 A1 | 5/2018 | Schulte |
| 2018/0132396 A1 | 5/2018 | Schulte |
| 2018/0132397 A1 | 5/2018 | Schulte |
| 2018/0132398 A1 | 5/2018 | Schulte |
| 2018/0132399 A1 | 5/2018 | Schulte |
| 2018/0137428 A1 | 5/2018 | Abdo |
| 2018/0137429 A1 | 5/2018 | Chow |
| 2018/0137430 A1 | 5/2018 | Chow |
| 2018/0138987 A1 | 5/2018 | Sliwa |
| 2018/0144262 A1 | 5/2018 | Roetteler |
| 2018/0145631 A1 | 5/2018 | Berkley |
| 2018/0145664 A1 | 5/2018 | Herr |
| 2018/0150760 A1 | 5/2018 | Sarpeshkar |
| 2018/0151764 A1 | 5/2018 | Auroux |
| 2018/0152294 A1 | 5/2018 | Legre |
| 2018/0157775 A1 | 6/2018 | Ronagh |
| 2018/0160059 A1 | 6/2018 | Caulfield |
| 2018/0160068 A1 | 6/2018 | Kelly |
| 2018/0165601 A1 | 6/2018 | Wiebe |
| 2018/0174852 A1 | 6/2018 | Chang |
| 2018/0175230 A1 | 6/2018 | Droz |
| 2018/0175476 A1 | 6/2018 | Teshiba |
| 2018/0181685 A1 | 6/2018 | Roetteler |
| 2018/0189444 A1 | 7/2018 | Van Rooyen |
| 2018/0190705 A1 | 7/2018 | Kilcoyne |
| 2018/0196780 A1 | 7/2018 | Amin |
| 2018/0196916 A1 | 7/2018 | Van Rooyen |
| 2018/0197102 A1 | 7/2018 | Mohseni |
| 2018/0198016 A1 | 7/2018 | Piccione |
| 2018/0198427 A1 | 7/2018 | Narla |
| 2018/0211158 A1 | 7/2018 | Shainline |
| 2018/0212091 A1 | 7/2018 | Escarra |
| 2018/0218279 A1 | 8/2018 | Lechner |
| 2018/0218280 A1 | 8/2018 | Harris |
| 2018/0218281 A1 | 8/2018 | Reinhardt |
| 2018/0219150 A1 | 8/2018 | Lanting |
| 2018/0225186 A1 | 8/2018 | Kelly |
| 2018/0225586 A1 | 8/2018 | Chow |
| 2018/0226451 A1 | 8/2018 | Dzurak |
| 2018/0231868 A1 | 8/2018 | Grice |
| 2018/0232258 A1 | 8/2018 | Kendall |
| 2018/0232652 A1 | 8/2018 | Curtis |
| 2018/0232653 A1 | 8/2018 | Selvanayagam |
| 2018/0232654 A1 | 8/2018 | Epstein |
| 2018/0232655 A1 | 8/2018 | Chow |
| 2018/0238869 A1 | 8/2018 | Kauffman |
| 2018/0239928 A1 | 8/2018 | Kurian |
| 2018/0240032 A1 | 8/2018 | Van Rooyen |
| 2018/0240033 A1 | 8/2018 | Leek |
| 2018/0240034 A1 | 8/2018 | Harris |
| 2018/0240035 A1 | 8/2018 | Scheer |
| 2018/0241552 A1 | 8/2018 | Kurian |
| 2018/0246848 A1 | 8/2018 | Douglass |
| 2018/0247200 A1 | 8/2018 | Rolfe |
| 2018/0247217 A1 | 8/2018 | Heeres |
| 2018/0247236 A1 | 8/2018 | Castinado |
| 2018/0247974 A1 | 8/2018 | Oliver |
| 2018/0248103 A1 | 8/2018 | Ivry |
| 2018/0248104 A1 | 8/2018 | Bouzdine |
| 2018/0248894 A1 | 8/2018 | Greeter |
| 2018/0253552 A1 | 9/2018 | Castinado |
| 2018/0253599 A1 | 9/2018 | Shepard |
| 2018/0254369 A1 | 9/2018 | Droz |
| 2018/0254895 A1 | 9/2018 | Castinado |
| 2018/0255000 A1 | 9/2018 | Castinado |
| 2018/0255073 A1 | 9/2018 | Sifford |
| 2018/0259597 A1 | 9/2018 | Jeske |
| 2018/0260245 A1 | 9/2018 | Smith |
| 2018/0260729 A1 | 9/2018 | Abdo |
| 2018/0260730 A1 | 9/2018 | Reagor |
| 2018/0260731 A1 | 9/2018 | Zeng |
| 2018/0260732 A1 | 9/2018 | Bloom |
| 2018/0261752 A1 | 9/2018 | Ferguson |
| 2018/0262276 A1 | 9/2018 | Bishop |
| 2018/0262489 A1 | 9/2018 | Wadley |
| 2019/0229094 A1* | 7/2019 | White .................... H01L 24/81 |

* cited by examiner

SYSTEM AND METHOD FOR SUPERCONDUCTING MULTI-CHIP MODULE

CROSS REFERENCE TO RELATED APPLICATIONS

The present application is a
Continuation of U.S. patent application Ser. No. 17/472,821, filed Sep. 13, 2021, now U.S. Pat. No. 11,711,985, issued Jul. 25, 2023, which is a
Continuation of U.S. patent application Ser. No. 16/599,985, filed Oct. 11, 2019, now U.S. Pat. No. 11,121,302, issued Sep. 14, 2021, which is a
Non-provisional of, and claims benefit of priority under 35 U.S.C. § 119(e) of, U.S. Provisional Patent Application No. 62/744,494, filed Oct. 11, 2018,
the entirety of which are expressly incorporated herein by reference.

FIELD OF THE INVENTION

The present invention relates to the field of manufacturing of superconducting integrated circuit modules, and packages bonding a plurality of such circuits.

BACKGROUND OF THE INVENTION

All references cited herein are expressly incorporated herein by reference, for all purposes.

The technology of superconducting integrated circuits has been developing in recent years, although the integration scale remains somewhat below that of mainstream semiconductor technology. The most advanced superconducting integrated circuits are based on niobium (Nb) thin films, and Josephson junctions comprising a nanometer-thick aluminum oxide insulating layer between two Nb layers. These circuits function at temperatures below 9 K, and preferably below about 4 K. Large-scale integrated circuits have been fabricated with up to 10,000 Josephson junctions on a single chip, and up to 10 superconducting wiring layers. See, for example, the following US patents, incorporated in their entirety by reference:

Double masking technique for increasing fabrication yield in superconducting electronics (Tolpygo, U.S. Pat. Nos. 9,595,656; 9,136,457; 8,383,426; 7,615,385).

System and Method for Providing Multi-conductive Layer Interconnects for Superconducting Integrated Circuits (Tolpygo, U.S. Pat. Nos. 9,741,920; 9,130,116; 8,301,214).

Method for increasing the integration level of superconducting electronic circuits, and a resulting circuit (Yohannes, U.S. Pat. No. 9,741,918).

Systems and Methods for Fabrication of Superconducting Integrated Circuits (Ladizinsky, U.S. Pat. Nos. 8,951,808; 9,490,296; 9,978,809).

One developing application of superconducting integrated circuits is for classical computing and memory arrays based on rapid-single-flux-quantum (RSFQ) logic and related technologies, as disclosed in the following US patents, incorporated in their entirety by reference:

System and Method for Cryogenic Hybrid Technology Computing and Memory (Mukhanov, U.S. Pat. Nos. 9,887,000; 9,520,180).

Superconducting Devices with Ferromagnetic Barrier Junctions (Mukhanov, U.S. Pat. Nos. 9,627,045; 8,971,977).

Low Power Biasing Network for Superconducting Integrated Circuits (Mukhanov, U.S. Pat. Nos. 9,853,645; 9,473,124; 9,240,773; 8,571,614).

Magnetic RAM Array Architecture (Ohki, U.S. Pat. Nos. 9,552,862; 9,747,968).

Josephson magnetic random access memory system and method (Hen, U.S. Pat. No. 8,270,209).

See, U.S. patent and U.S. Pat. Nos. 5,140,324; 5,170,080; 5,198,815; 5,233,242; 5,233,243; 5,256,636; 5,289,400; 5,291,035; 5,327,130; 5,341,136; 5,388,068; 5,389,837; 5,598,105; 5,629,889; 5,781,009; 5,793,055; 5,818,373; 5,936,458; 5,963,351; 5,982,219; 6,023,161; 6,115,789; 6,175,749; 6,188,236; 6,242,939; 6,331,805; 6,345,189; 6,345,190; 6,353,330; 6,388,600; 6,420,895; 6,459,097; 6,479,139; 6,486,694; 6,486,756; 6,507,234; 6,509,853; 6,518,786; 6,526,491; 6,549,059; 6,563,310; 6,573,202; 6,576,951; 6,580,102; 6,608,581; 6,614,047; 6,626,995; 6,630,426; 6,703,857; 6,715,118; 6,724,216; 6,725,248; 6,728,131; 6,734,454; 6,734,699; 6,754,823; 6,756,925; 6,759,974; 6,763,363; 6,773,836; 6,781,435; 6,791,109; 6,797,341; 6,803,599; 6,809,734; 6,812,464; 6,812,484; 6,813,056; 6,822,255; 6,826,662; 6,838,749; 6,865,639; 6,909,109; 6,917,216; 6,917,537; 6,936,841; 6,946,428; 7,002,366; 7,049,593; 7,073,087; 7,078,694; 7,090,889; 7,093,104; 7,095,227; 7,124,259; 7,129,869; 7,129,870; 7,139,882; 7,170,960; 7,227,480; 7,231,500; 7,233,998; 7,236,998; 7,268,713; 7,280,623; 7,304,646; 7,313,199; 7,321,958; 7,360,102; 7,362,125; 7,365,663; 7,386,687; 7,389,508; 7,392,511; 7,395,411; 7,409,570; 7,415,703; 7,428,619; 7,437,536; 7,439,208; 7,440,490; 7,443,719; 7,444,525; 7,444,632; 7,457,939; 7,468,630; 7,475,257; 7,478,390; 7,496,673; 7,496,917; 7,498,832; 7,501,877; 7,502,928; 7,505,310; 7,508,230; 7,509,457; 7,516,334; 7,516,456; 7,523,157; 7,526,608; 7,546,405; 7,549,145; 7,554,369; 7,565,653; 7,570,075; 7,576,782; 7,598,897; 7,613,886; 7,614,053; 7,644,255; 7,653,908; 7,676,683; 7,680,474; 7,680,972; 7,685,601; 7,687,938; 7,689,783; 7,689,784; 7,689,814; 7,693,053; 7,694,306; 7,698,473; 7,701,286; 7,707,385; 7,714,605; 7,719,453; 7,720,982; 7,724,020; 7,724,083; 7,728,748; 7,730,456; 7,733,253; 7,748,006; 7,750,664; 7,768,287; 7,772,871; 7,774,512; 7,782,077; 7,783,584; 7,786,748; 7,786,786; 7,788,467; 7,802,023; 7,814,166; 7,816,940; 7,818,507; 7,818,724; 7,852,106; 7,868,645; 7,876,869; 7,882,310; 7,882,379; 7,886,112; 7,893,708; 7,903,456; 7,911,265; 7,917,667; 7,917,798; 7,921,151; 7,926,023; 7,928,875; 7,944,253; 7,956,640; 7,958,371; 7,969,178; 7,977,668; 7,991,013; 7,991,814; 7,999,813; 8,001,294; 8,001,377; 8,001,390; 8,001,592; 8,010,716; 8,022,012; 8,022,722; 8,028,288; 8,028,292; 8,045,660; 8,050,648; 8,055,235; 8,055,318; 8,091,078; 8,098,179; 8,108,564; 8,130,880; 8,138,784; 8,159,825; 8,176,481; 8,179,133; 8,188,901; 8,208,288; 8,219,981; 8,224,639; 8,247,799; 8,249,540; 8,260,143; 8,260,144; 8,260,145; 8,271,805; 8,290,553; 8,301,104; 8,301,214; 8,321,866; 8,347,165; 8,359,186; 8,362,220; 8,401,509; 8,401,600; 8,416,109; 8,434,091; 8,437,818; 8,462,889; 8,514,986; 8,521,117; 8,547,732; 8,549,521; 8,555,127; 8,565,345; 8,569,874; 8,571,614; 8,582,687; 8,593,141; 8,618,799; 8,629,729; 8,670,807; 8,726,041; 8,744,541; 8,751,212; 8,755,220; 8,769,495; 8,786,476; 8,787,873; 8,804,358; 8,806,316; 8,811,536; 8,861,619; 8,867,931; 8,872,690; 8,923,073; 8,930,786; 8,933,695; 8,937,255; 8,970,217; 8,971,977; 8,977,223; 9,020,079; 9,020,362; 9,058,164; 9,065,452; 9,110,771; 9,130,116; 9,160,593; 9,166,625; 9,183,051; 9,203,654; 9,235,811; 9,240,773; 9,252,825; 9,261,573; 9,276,615; 9,282,645; 9,312,878; 9,312,895; 9,344,069; 9,385,293; 9,401,823;

9,425,804; 9,425,838; 9,443,576; 9,455,391; 9,455,707; 9,473,124; 9,476,950; 9,509,315; 9,514,812; 9,520,180; 9,548,878; 9,552,862; 9,554,303; 9,565,045; 9,577,690; 9,582,695; 9,588,191; 9,614,532; 9,618,591; 9,627,045; 9,641,372; 9,647,194; 9,661,596; 9,686,112; 9,692,423; 9,699,266; 9,703,516; 9,710,586; 9,712,172; 9,722,589; 9,739,851; 9,741,918; 9,741,920; 9,742,429; 9,747,968; 9,748,937; 9,780,765; 9,787,312; 9,793,913; 9,793,933; 9,812,836; 9,818,064; 9,838,051; 9,853,645; 9,887,000; 9,906,191; 9,906,248; 9,982,935; 9,998,122; 20020060635; 20020105948; 20020118903; 20020119805; 20020135582; 20020138637; 20020138701; 20020138707; 20020156993; 20020169079; 20020179937; 20020179939; 20020188578; 20020189533; 20030011398; 20030034794; 20030057441; 20030102470; 20030111659; 20030111661; 20030115401; 20030146429; 20030146430; 20030179831; 20030207767; 20030219911; 20030229765; 20040016883; 20040022332; 20040120299; 20040134967; 20040150458; 20040167036; 20040170047; 20040220057; 20040234785; 20040266627; 20050023518; 20050035368; 20050036055; 20050071404; 20050071513; 20050071526; 20050071578; 20050071651; 20050071828; 20050074220; 20050078022; 20050078117; 20050081181; 20050081182; 20050081201; 20050081202; 20050081203; 20050081209; 20050081213; 20050086655; 20050091473; 20050095011; 20050097231; 20050097280; 20050097302; 20050116204; 20050120185; 20050120187; 20050120254; 20050138325; 20050160097; 20050188372; 20050188373; 20050216222; 20050216775; 20050228967; 20050231196; 20050243708; 20050251659; 20050251667; 20050268038; 20050268048; 20050273652; 20060038821; 20060049891; 20060069879; 20060075397; 20060092957; 20060093861; 20060107122; 20060112213; 20060126770; 20060129786; 20060129999; 20060143509; 20060149861; 20060155792; 20060155955; 20060155964; 20060161741; 20060177122; 20060179179; 20060179198; 20060179255; 20060179275; 20060179277; 20060179278; 20060179436; 20060190614; 20060190942; 20060195824; 20060206731; 20060206732; 20060212643; 20060251070; 20060255987; 20060259733; 20060259743; 20060270173; 20070049097; 20070075729; 20070075752; 20070077906; 20070083870; 20070168538; 20070176625; 20070180041; 20070186077; 20070194958; 20070240013; 20070277000; 20070283103; 20070288701; 20070293160; 20080040805; 20080048762; 20080048902; 20080049885; 20080052504; 20080077721; 20080077815; 20080091886; 20080098260; 20080101444; 20080101501; 20080101503; 20080103708; 20080107213; 20080112313; 20080126601; 20080146449; 20080155203; 20080162834; 20080162877; 20080168443; 20080186064; 20080209156; 20080229143; 20080231353; 20080235679; 20080250414; 20080256275; 20080271003; 20080276232; 20080279370; 20080282063; 20080282084; 20080282093; 20080282341; 20080282342; 20080290938; 20080297230; 20080301695; 20090002014; 20090008632; 20090057652; 20090068355; 20090073017; 20090086533; 20090125717; 20090153381; 20090232191; 20090232507; 20090232510; 20090237230; 20090244958; 20090322374; 20100026537; 20100066576; 20100133514; 20100148841; 20100149011; 20100312969; 20100329401; 20110087909; 20110133770; 20110167241; 20110288823; 20110302591; 20110303153; 20120030386; 20120088674; 20120096873; 20120108434; 20120184445; 20120266174; 20120274494; 20120328301; 20130004180; 20130043945; 20130079230; 20130258595; 20130272453; 20130303379; 20140056385; 20140113828; 20140175380; 20140245314; 20140286465; 20150078290; 20150119253; 20150125155; 20150146805; 20150146806; 20150178432; 20150229343; 20150300719; 20160012882; 20160028402; 20160028403; 20160035404; 20160036612; 20160080189; 20160093420; 20160197628; 20160351306; 20170012862; 20170038123; 20170069367; 20170133577; 20170134091; 20170141769; 20170163301; 20170178018; 20170186935; 20170237594; 20170265158; 20170295048; 20170324019; 20170345990; 20170359072; 20180005887; 20180101785; 20180102469; 20180102470; 20180145664; and 20180248103.

Another developing application of these circuits is for sensor arrays based on SQUIDs and similar devices, such as disclosed in the following US patents, incorporated in their entirety by reference:

High Linearity Superconducting Magnetic Field Detector (Kornev, U.S. Pat. Nos. 8,933,695; 8,179,133).

2D Arrays of Diamond Shaped Cells Having Multiple Josephson Junctions (Berggren, U.S. Pat. No. 9,664,751).

Linear voltage response of non-uniform arrays of Bi-SQUIDs (Longhini, U.S. Pat. No. 9,097,751).

Magnetic Resonance System and Method Employing a Digital SQUID (Radparvar, U.S. Pat. Nos. 9,618,591; 9,261,573; 8,618,799; 8,593,141).

Yet another application of superconducting integrated circuits that has been developing more recently is quantum computing using quantum bits (or qubits) made of Josephson junctions, as disclosed in the following patents:

System and Method for Controlling Superconducting Quantum Circuits Using Single Flux Quantum Logic Circuits (McDermott, U.S. Pat. No. 9,425,804).

System and Method for Circuit Quantum Electrodynamics Measurement (McDermott, U.S. Pat. No. 9,692,423).

Method and apparatus for controlling qubits with single flux quantum logic (Przybysz, U.S. Pat. No. 7,969,178).

Universal Adiabatic Quantum Computing with Superconducting Qubits (Harris, U.S. Pub. Patent Application No. 2015/0111754).

Superconducting quantum bit device based on Josephson junctions (Esteve, U.S. Pat. No. 6,838,694).

Superconducting shielding for use with an integrated circuit for quantum computing (Bunyk, U.S. Pat. No. 7,687,938).

See, U.S. patent and U.S. Pat. Nos. 5,917,322; 6,369,404; 6,437,413; 6,459,097; 6,472,681; 6,495,854; 6,504,172; 6,537,847; 6,563,310; 6,563,311; 6,573,202; 6,576,951; 6,580,102; 6,605,822; 6,614,047; 6,627,915; 6,627,916; 6,649,929; 6,670,630; 6,728,131; 6,753,546; 6,784,451; 6,791,109; 6,800,837; 6,803,599; 6,812,484; 6,822,255; 6,838,694; 6,879,012; 6,885,325; 6,897,468; 6,900,454; 6,900,456; 6,905,887; 6,910,382; 6,911,664; 6,919,579;

6,926,921; 6,930,318; 6,930,320; 6,936,841; 6,943,368; 6,960,780; 6,979,836; 6,984,846; 6,987,282; 6,988,058; 7,002,174; 7,015,499; 7,018,852; 7,042,005; 7,069,282; 7,109,593; 7,113,967; 7,122,837; 7,135,697; 7,135,701; 7,145,170; 7,180,087; 7,180,645; 7,184,555; 7,203,715; 7,230,266; 7,249,518; 7,250,624; 7,253,654; 7,268,576; 7,307,275; 7,310,623; 7,312,562; 7,321,884; 7,332,738; 7,334,008; 7,335,909; 7,359,928; 7,364,923; 7,394,092; 7,400,282; 7,402,835; 7,410,763; 7,418,283; 7,426,444; 7,428,562; 7,437,533; 7,443,720; 7,453,162; 7,456,702; 7,460,669; 7,474,010; 7,474,095; 7,479,652; 7,498,832; 7,518,138; 7,525,202; 7,529,717; 7,533,068; 7,547,932; 7,550,759; 7,566,896; 7,579,424; 7,579,699; 7,598,514; 7,605,600; 7,613,764; 7,613,765; 7,619,437; 7,624,088; 7,639,035; 7,687,938; 7,700,710; 7,714,605; 7,724,020; 7,724,083; 7,732,804; 7,749,922; 7,764,568; 7,767,976; 7,772,871; 7,779,228; 7,782,077; 7,786,748; 7,788,192; 7,791,430; 7,800,395; 7,836,007; 7,843,209; 7,844,656; 7,847,615; 7,852,106; 7,858,966; 7,863,892; 7,868,645; 7,870,087; 7,875,876; 7,876,145; 7,876,248; 7,877,333; 7,880,529; 7,889,992; 7,893,708; 7,895,142; 7,898,282; 7,899,852; 7,911,265; 7,912,656; 7,920,598; 7,925,614; 7,932,514; 7,932,515; 7,966,549; 7,969,178; 7,969,805; 7,977,668; 7,982,646; 7,984,012; 7,990,662; 8,008,942; 8,008,991; 8,014,424; 8,018,244; 8,022,703; 8,022,722; 8,032,474; 8,035,540; 8,053,754; 8,058,085; 8,058,638; 8,062,841; 8,063,657; 8,073,631; 8,073,795; 8,073,808; 8,089,286; 8,098,179; 8,102,185; 8,103,172; 8,111,083; 8,117,000; 8,138,756; 8,138,784; 8,138,880; 8,142,754; 8,144,589; 8,148,715; 8,159,313; 8,164,082; 8,169,231; 8,174,305; 8,175,995; 8,184,986; 8,190,548; 8,193,808; 8,195,596; 8,195,726; 8,219,871; 8,222,629; 8,222,899; 8,223,625; 8,228,688; 8,229,863; 8,234,103; 8,242,799; 8,244,650; 8,244,662; 8,247,799; 8,254,079; 8,259,848; 8,271,043; 8,275,428; 8,279,022; 8,283,943; 8,284,585; 8,294,138; 8,301,214; 8,304,758; 8,310,230; 8,315,969; 8,355,765; 8,363,606; 8,374,072; 8,386,554; 8,405,468; 8,421,053; 8,423,297; 8,437,168; 8,437,818; 8,441,329; 8,455,278; 8,457,093; 8,461,862; 8,464,542; 8,477,888; 8,485,427; 8,488,487; 8,494,993; 8,498,639; 8,504,497; 8,507,894; 8,508,280; 8,510,618; 8,513,647; 8,536,566; 8,547,090; 8,553,795; 8,560,282; 8,560,470; 8,571,614; 8,581,227; 8,583,903; 8,604,944; 8,605,288; 8,606,341; 8,611,974; 8,620,835; 8,630,256; 8,631,367; 8,642,998; 8,648,331; 8,654,578; 8,655,828; 8,659,007; 8,669,325; 8,670,777; 8,670,807; 8,675,768; 8,676,223; 8,686,751; 8,687,489; 8,700,689; 8,712,424; 8,735,326; 8,738,105; 8,744,075; 8,745,850; 8,748,196; 8,748,950; 8,772,759; 8,781,129; 8,786,476; 8,812,066; 8,816,325; 8,824,601; 8,830,818; 8,841,764; 8,849,580; 8,854,074; 8,861,619; 8,865,537; 8,872,360; 8,874,629; 8,891,489; 8,892,857; 8,897,057; 8,921,473; 8,922,239; 8,923,073; 8,928,391; 8,947,080; 8,951,808; 8,954,125; 8,972,921; 8,975,912; 8,977,576; 8,983,303; 8,995,797; 9,015,215; 9,026,574; 9,040,959; 9,041,427; 9,059,305; 9,059,674; 9,059,707; 9,069,928; 9,094,969; 9,111,230; 9,129,224; 9,130,116; 9,130,598; 9,134,047; 9,143,266; 9,152,923; 9,152,924; 9,159,033; 9,162,881; 9,170,278; 9,177,814; 9,178,154; 9,183,508; 9,192,085; 9,203,466; 9,207,672; 9,208,446; 9,218,567; 9,218,571; 9,219,298; 9,219,605; 9,224,783; 9,231,181; 9,235,811; 9,240,773; 9,256,834; 9,260,289; 9,270,071; 9,270,385; 9,296,609; 9,306,739; 9,331,020; 9,332,475; 9,335,385; 9,344,092; 9,350,460; 9,354,039; 9,355,362; 9,355,364; 9,355,365; 9,361,169; 9,363,766; 9,363,790; 9,367,288; 9,369,133; 9,379,303; 9,384,827; 9,385,293; 9,385,294; 9,396,440; 9,397,283; 9,400,499; 9,401,766; 9,405,876; 9,406,026; 9,420,603; 9,424,526; 9,425,377; 9,425,804; 9,432,024; 9,437,800; 9,438,245; 9,438,246; 9,443,200; 9,444,430; 9,454,061; 9,455,391; 9,455,392; 9,460,397; 9,461,588; 9,471,279; 9,471,280; 9,471,880; 9,473,124; 9,477,796; 9,489,634; 9,490,296; 9,495,644; 9,501,747; 9,501,748; 9,503,063; 9,509,274; 9,509,280; 9,509,478; 9,514,812; 9,515,247; 9,518,336; 9,520,180; 9,520,547; 9,524,470; 9,530,535; 9,530,873; 9,531,055; 9,537,953; 9,547,826; 9,548,742; 9,559,284; 9,564,573; 9,588,940; 9,589,236; 9,594,726; 9,595,969; 9,607,270; 9,613,905; 9,614,270; 9,614,532; 9,622,188; 9,633,314; 9,634,224; 9,634,835; 9,646,259; 9,647,662; 9,660,859; 9,663,358; 9,664,562; 9,665,539; 9,680,452; 9,683,766; 9,685,935; 9,691,962; 9,692,423; 9,692,595; 9,697,473; 9,699,266; 9,705,063; 9,710,758; 9,713,199; 9,716,219; 9,720,055; 9,721,209; 9,727,527; 9,727,823; 9,727,824; 9,729,152; 9,733,327; 9,735,776; 9,741,918; 9,741,920; 9,741,921; 9,748,976; 9,749,893; 9,753,102; 9,754,214; 9,755,133; 9,761,305; 9,762,200; 9,767,238; 9,768,371; 9,768,771; 9,773,208; 9,779,359; 9,779,360; 9,780,764; 9,780,765; 9,786,194; 9,787,278; 9,787,312; 9,791,258; 9,793,913; 9,798,083; 9,798,219; 9,799,817; 9,800,399; 9,806,711; 9,812,836; 9,817,081; 9,818,064; 9,818,796; 9,823,313; 9,823,314; 9,823,381; 9,824,597; 9,829,545; 9,835,693; 9,835,694; 9,836,699; 9,841,484; 9,843,312; 9,845,153; 9,847,121; 9,853,645; 9,853,837; 9,857,509; 9,857,609; 9,858,531; 9,858,532; 9,865,648; 9,870,273; 9,870,277; 9,870,536; 9,875,215; 9,875,444; 9,880,365; 9,881,256; 9,882,112; 9,885,888; 9,887,000; 9,891,297; 9,892,365; 9,893,262; 9,909,460; 9,910,104; 9,910,105; 9,913,414; 9,917,580; 9,922,289; 9,923,538; 9,927,636; 9,928,948; 9,929,334; 9,929,978; 9,934,468; 9,935,252; 9,940,212; 9,940,586; 9,941,459; 9,945,917; 9,946,973; 9,947,856; 9,947,861; 9,948,050; 9,948,254; 9,952,830; 9,953,268; 9,953,269; 9,966,720; 9,966,926; 9,971,970; 9,978,020; 9,978,809; 9,979,400; 9,983,336; 9,984,333; 9,985,193; 9,985,614; 9,991,864; 9,994,956; 9,996,801; 9,998,122; RE44,097; 20010020701; 20010023943; 20020097874; 20020117656; 20020117738; 20020121636; 20020130313; 20020130315; 20020177529; 20020179937; 20020179939; 20020180006; 20020188578; 20030005010; 20030021518; 20030023651; 20030027724; 20030038285; 20030042481; 20030057441; 20030068832; 20030071258; 20030094606; 20030098455; 20030102470; 20030107033; 20030111659; 20030111661; 20030121028; 20030146429; 20030146430; 20030164490; 20030169041; 20030173498; 20030173997; 20030193097; 20030207766; 20030224944; 20040000666; 20040012407; 20040016918; 20040077503; 20040095803; 20040098443; 20040119061; 20040135139; 20040140537; 20040165454; 20040167036; 20040170047; 20040173787; 20040173792; 20040173793; 20040238813; 20050001209; 20050045872; 20050062072; 20050082519; 20050098773; 20050101489; 20050107262; 20050123674; 20050131746; 20050133780; 20050143791; 20050162302; 20050167772; 20050184284; 20050184285; 20050197254; 20050224784; 20050250651; 20050256007; 20050273306; 20060022190; 20060033096; 20060033097; 20060043423; 20060045269; 20060091375; 20060097746; 20060097747; 20060115086; 20060123363; 20060147154; 20060151775; 20060157713; 20060179029; 20060225165; 20060248618; 20060260016;

| | | | | | |
|---|---|---|---|---|---|
| 20070048746; | 20070063700; | 20070073038; | 20130087766; | 20130107617; | 20130117200; |
| 20070080341; | 20070135676; | 20070162407; | 20130119351; | 20130136112; | 20130144925; |
| 20070170952; | 20070174227; | 20070180586; | 20130168233; | 20130190185; | 20130196855; |
| 20070194225; | 20070215862; | 20070239366; | 20130231249; | 20130246495; | 20130250926; |
| 20070241747; | 20070250280; | 20070258329; | 20130251145; | 20130258595; | 20130258869; |
| 20070263432; | 20070287015; | 20070295954; | 20130278283; | 20130279617; | 20130282636; |
| 20080052055; | 20080065573; | 20080086438; | 20130299783; | 20130308956; | 20130313526; |
| 20080089282; | 20080095110; | 20080109500; | 20130322873; | 20140025606; | 20140050475; |
| 20080116448; | 20080116449; | 20080117833; | 20140097405; | 20140113828; | 20140119537; |
| 20080120259; | 20080123520; | 20080129328; | 20140167811; | 20140167836; | 20140187427; |
| 20080132281; | 20080162613; | 20080176750; | 20140203838; | 20140214257; | 20140221059; |
| 20080185576; | 20080186918; | 20080214198; | 20140223224; | 20140228222; | 20140229705; |
| 20080215850; | 20080218519; | 20080224726; | 20140229722; | 20140235450; | 20140245249; |
| 20080225823; | 20080227624; | 20080233967; | 20140246652; | 20140246763; | 20140250288; |
| 20080238531; | 20080258753; | 20080258849; | 20140264283; | 20140264284; | 20140264285; |
| 20080260257; | 20080262989; | 20080274898; | 20140264286; | 20140264287; | 20140266496; |
| 20080284545; | 20080291945; | 20080297230; | 20140274725; | 20140279822; | 20140289583; |
| 20080310324; | 20080313114; | 20080313430; | 20140295907; | 20140314419; | 20140315723; |
| 20090003282; | 20090005260; | 20090008632; | 20140324933; | 20140329687; | 20140337612; |
| 20090010090; | 20090014714; | 20090015317; | 20140344322; | 20140354326; | 20140355998; |
| 20090028112; | 20090033369; | 20090042511; | 20140357493; | 20140368234; | 20150006443; |
| 20090046573; | 20090057652; | 20090070402; | 20150024964; | 20150028970; | 20150032991; |
| 20090075825; | 20090077001; | 20090078931; | 20150032993; | 20150032994; | 20150036967; |
| 20090078932; | 20090082209; | 20090085629; | 20150046681; | 20150055630; | 20150055961; |
| 20090086713; | 20090087084; | 20090097650; | 20150060756; | 20150097159; | 20150111754; |
| 20090097652; | 20090102580; | 20090121215; | 20150119252; | 20150119253; | 20150125829; |
| 20090122508; | 20090135944; | 20090167342; | 20150129089; | 20150155468; | 20150161524; |
| 20090168286; | 20090173936; | 20090177603; | 20150179436; | 20150179914; | 20150179915; |
| 20090182542; | 20090192041; | 20090206871; | 20150186791; | 20150187840; | 20150193692; |
| 20090214169; | 20090220082; | 20090241013; | 20150199178; | 20150200778; | 20150205759; |
| 20090259905; | 20090261319; | 20090265112; | 20150236235; | 20150241481; | 20150242758; |
| 20090278046; | 20090289638; | 20090299947; | 20150254571; | 20150260812; | 20150262072; |
| 20090316842; | 20090317089; | 20090319757; | 20150262073; | 20150263260; | 20150263736; |
| 20090321720; | 20090322374; | 20100026447; | 20150269124; | 20150288500; | 20150299894; |
| 20100027486; | 20100057653; | 20100062144; | 20150310350; | 20150311422; | 20150324705; |
| 20100085678; | 20100085827; | 20100094796; | 20150325774; | 20150332163; | 20150332164; |
| 20100105406; | 20100109638; | 20100133514; | 20150339417; | 20150340584; | 20150346291; |
| 20100148853; | 20100157310; | 20100157552; | 20150349780; | 20150354938; | 20150357550; |
| 20100182039; | 20100194466; | 20100224912; | 20150357783; | 20150358022; | 20150363707; |
| 20100241780; | 20100264921; | 20100270534; | 20150363708; | 20150372217; | 20150379418; |
| 20100281885; | 20100296591; | 20100303188; | 20160012346; | 20160012347; | 20160019468; |
| 20100306142; | 20100315079; | 20110009274; | 20160026183; | 20160035470; | 20160040288; |
| 20110010412; | 20110018612; | 20110022340; | 20160042294; | 20160055421; | 20160065693; |
| 20110022820; | 20110031994; | 20110047201; | 20160071021; | 20160079968; | 20160085616; |
| 20110049475; | 20110054876; | 20110055520; | 20160087598; | 20160087599; | 20160093420; |
| 20110057169; | 20110060710; | 20110060711; | 20160093790; | 20160104073; | 20160112031; |
| 20110060780; | 20110065585; | 20110065586; | 20160125309; | 20160125310; | 20160132785; |
| 20110074403; | 20110089405; | 20110121895; | 20160148112; | 20160156356; | 20160156357; |
| 20110133770; | 20110142242; | 20110152104; | 20160161411; | 20160191060; | 20160204330; |
| 20110156008; | 20110161638; | 20110175061; | 20160204331; | 20160210560; | 20160211438; |
| 20110175062; | 20110231462; | 20110238607; | 20160221825; | 20160233860; | 20160233965; |
| 20110249548; | 20110253906; | 20110287941; | 20160245639; | 20160254434; | 20160266220; |
| 20110287944; | 20110298489; | 20120005456; | 20160267032; | 20160276570; | 20160283197; |
| 20120023053; | 20120028806; | 20120045136; | 20160283857; | 20160292586; | 20160292587; |
| 20120058602; | 20120071333; | 20120072191; | 20160300155; | 20160308502; | 20160314407; |
| 20120075682; | 20120083302; | 20120091193; | 20160321559; | 20160322693; | 20160328208; |
| 20120094838; | 20120112168; | 20120123693; | 20160328659; | 20160329896; | 20160335558; |
| 20120124432; | 20120135867; | 20120144159; | 20160335559; | 20160335560; | 20160343932; |
| 20120149581; | 20120159272; | 20120172233; | 20160343934; | 20160343935; | 20160344414; |
| 20120187378; | 20120210111; | 20120212375; | 20160352515; | 20160364653; | 20160371227; |
| 20120213371; | 20120215821; | 20120254586; | 20160380026; | 20160380636; | 20170005255; |
| 20120258861; | 20120265718; | 20120278057; | 20170011305; | 20170017742; | 20170017894; |
| 20120319085; | 20120319684; | 20120320668; | 20170018312; | 20170033273; | 20170039481; |
| 20120326130; | 20120326720; | 20120328290; | 20170061317; | 20170062107; | 20170062228; |
| 20130005580; | 20130007087; | 20130009677; | 20170062692; | 20170062898; | 20170069819; |
| 20130016835; | 20130029848; | 20130036078; | 20170071082; | 20170072504; | 20170076787; |
| 20130039236; | 20130043945; | 20130048950; | 20170077380; | 20170077381; | 20170077382; |

20170077383; 20170077665; 20170084813;
20170085231; 20170089961; 20170090080;
20170091646; 20170091647; 20170091648;
20170091649; 20170091650; 20170092833;
20170092834; 20170093015; 20170093381;
20170094544; 20170098682; 20170104546;
20170104695; 20170109605; 20170116159;
20170116542; 20170123171; 20170132524;
20170133336; 20170133576; 20170138851;
20170140296; 20170141285; 20170141286;
20170141287; 20170147303; 20170148972;
20170160474; 20170162778; 20170167977;
20170170812; 20170170813; 20170170893;
20170177534; 20170177751; 20170178017;
20170178018; 20170179973; 20170186934;
20170193388; 20170199036; 20170201222;
20170201224; 20170206461; 20170212405;
20170212860; 20170213143; 20170214410;
20170220510; 20170222116; 20170223094;
20170223143; 20170227795; 20170228483;
20170229167; 20170229631; 20170229632;
20170229633; 20170230050; 20170237144;
20170248832; 20170255629; 20170255871;
20170255872; 20170256698; 20170257074;
20170261770; 20170261771; 20170262765;
20170264373; 20170270245; 20170286858;
20170286859; 20170293854; 20170300454;
20170300808; 20170300817; 20170300827;
20170308644; 20170308804; 20170316713;
20170317203; 20170317262; 20170323195;
20170323206; 20170329883; 20170330101;
20170337155; 20170344898; 20170345990;
20170350929; 20170351967; 20170351974;
20170357539; 20170357561; 20170359072;
20170364362; 20170370019; 20170372412;
20170372427; 20170373044; 20170373153;
20170373369; 20170373658; 20180003753;
20180005809; 20180011981; 20180012932;
20180013052; 20180013426; 20180026633;
20180032893; 20180032894; 20180033944;
20180040800; 20180040935; 20180046933;
20180052806; 20180053112; 20180053113;
20180053551; 20180053809; 20180054201;
20180067182; 20180069288; 20180075365;
20180075901; 20180090200; 20180091115;
20180091141; 20180091142; 20180091143;
20180091244; 20180091440; 20180096085;
20180096257; 20180101784; 20180101785;
20180101786; 20180101787; 20180102469;
20180102470; 20180107092; 20180107526;
20180107938; 20180107939; 20180109379;
20180113373; 20180114138; 20180121601;
20180123597; 20180128739; 20180137428;
20180137429; 20180137430; 20180138987;
20180144262; 20180145631; 20180150760;
20180152294; 20180157775; 20180165601;
20180174852; 20180181685; 20180189444;
20180196780; 20180196916; 20180197102;
20180198427; 20180211158; 20180218279;
20180218280; 20180218281; 20180219150;
20180225186; 20180225586; 20180226451;
20180231868; 20180232258; 20180232652;
20180232653; 20180232654; 20180232655;
20180238869; 20180239928; 20180240032;
20180240033; 20180240034; 20180240035;
20180241552; 20180246848; 20180247200;
20180247217; 20180247236; 20180247974;
20180248104; 20180248894; 20180253552;
20180253599; 20180254895; 20180255000;
20180255073; 20180259597; 20180260245;
20180260729; 20180260730; 20180260731;
20180260732; 20180261752; and 20180262276;
20180262489.

All of these superconducting systems, both classical and quantum, require careful packaging, particularly as the scale of the system increases, and cannot generally be disposed on, or confined to, a single integrated circuit device ("chip"). Furthermore, one might have different cryogenic chips optimized for different system applications, such as a quantum computing chip and a digital control chip, which must be closely interfaced during operation. These include flip-chip configurations and multi-chip modules.

There are several special requirements for bonding superconducting circuits. First, the voltage levels in superconducting circuits are very low, so that all contact resistances must be extremely low. Indeed, for some applications such as quantum computing, the contacts must be fully superconducting at the operating temperature. Second, a Josephson junction generally comprises an ultrathin tunnel barrier approximately 1 nm thick, which is very sensitive to diffusion at elevated temperatures, e.g., of impurities or volatile components in adjacent layers. Indeed, the superconducting critical current L at the operating temperature of a Josephson junction may be permanently shifted if the processing temperature is raised above about 150° C. for an extended period of time. This has long been known by some in the prior art, but perhaps not widely appreciated, or avoided during fabrication or processing. And third, superconducting circuits are fabricated close to room temperature, but operate at deep cryogenic temperatures around 4 K or below, and all contacts and packaging must withstand thermal cycling, ideally for multiple thermal cycles between 300 K and 4 K, without degradation of contacts mechanically or electrically. Thus, brittle materials with mismatched coefficients of thermal expansion should be avoided.

Several distinct approaches to boding superconducting circuit modules have been developed, with varying degrees of reliability, scalability, and optimization to superconducting circuits. See the following US Patents, incorporated in their entirety by reference:

Superconductive Multi-Chip Module for High Speed Digital Circuits (Dotsenko, U.S. Pat. No. 9,647,194).

Method for Fabrication of Electrical Contacts to Superconducting Circuits (Dotsenko, U.S. Pat. No. 8,159,825).

Method of Forming an Electronic Multichip Module (Dotsenko, U.S. Pat. No. 8,804,358).

Systems and Methods for Testing and Packaging a Superconducting Chip (Bunyk, U.S. Pat. No. 9,865,648).

Interconnect structures for assembly of semiconductor structures including superconducting integrated circuits (Oliver, U.S. Pub. Patent Application No. 2018/0012932).

Cryogenic electronic packages and methods for fabricating cryogenic electronic packages, (Das, U.S. Pub. Patent Application No. 2018/0102469).

Cryogenic electronic packages and assemblies (Das, U.S. Pub. Patent Application No. 2018/0102470).

Modular array of vertically integrated superconducting qubit devices for scaling quantum computing (Chow, U.S. Pat. No. 9,524,470).

There are also several recent articles in the non-patent literature that bear upon packaging of superconducting circuits. Note in particular the following:

Foxen, et al, "Qubit compatible superconducting interconnects", Quantum Science and Technology, vol. 3, no. 1, November 2017, available online at iopscience.iop.org/article/10.1088/2058-9565/aa94fc/meta, which discloses the use of pressed indium (In) bumps to form a cold weld at room temperature without heating. The indium bumps are partially compressed, without the use of any posts. It also discloses using a diffusion barrier layer of titanium nitride (TiN) between indium and superconducting aluminum.

McRae et al, "Thermocompression bonding technology for multilayer superconducting quantum circuits", Applied Physics Letters, vol. 111, 123501, September 2017. Available online at arxiv.org/pdf/1705.02435.pdf, which also discloses indium bump bonds, but here the bonds are heated to 190° C., above the melting temperature of the indium, for 100 minutes.

Reviewing the key aspects of this prior art in packaging of superconducting circuits, Dotsenko (U.S. Pat. Nos. 9,647,194; 8,159,825; 8,804,358) uses epoxy bonding, but contacts do not exhibit zero resistance, and repeated thermal cycling may degrade the quality of the contacts.

Bunyk (U.S. Pat. No. 9,865,648) discloses using metallic pillars and solder bumps, but does not address the issue of avoiding high temperatures in processing, and teaches the use of solder reflow based on lead-tin (Pb/Sn) solder, which would require temperatures of at least 190° C. Such a temperature should be avoided, to avoid changing the properties of the Josephson junctions.

Oliver (U.S. Pub. Patent Application No. 2018/0012932) and Das (U.S. Pub. Patent Application Nos. 2018/0102469; 2018/0102469) also teach the use of solder bumps with an underbump metal, using solder reflow. While a variety of solder compositions are disclosed, no specific processing temperatures are given, and there is no teaching of avoidance of high temperatures due to the sensitivity of Josephson junctions.

Chow (U.S. Pat. No. 9,524,470) discloses superconducting quantum computing components using spring-loading and clamps, as well as wire bonds, which do not correspond to a robust scalable technology.

There have also been earlier patents on indium bump bonding, not focused on superconducting circuits. See, for example, the following U.S. Patents, incorporated in their entirety by reference:

Reworkable Microelectronic Multichip Module (Yokoyama, U.S. Pat. No. 5,920,464). Yokoyama discloses cold-welding indium alloys of different compositions, in such a way that the weld breaks in a predictable manner, enabling rework.

Alloy Bonded Indium Bumps and Methods of Processing Same (Williams U.S. Pat. No. 4,930,001). Williams discloses cold welding at room temperature or up to 100° C., using indium bumps against gold layers. Interdiffusion of indium and gold creates the bond.

Indium alloy cold weld bumps (Helber, U.S. Pat. No. 5,186,379). Helber discloses welding an indium bump with an alloying material at an elevated temperature of about 150° C., just below the melting temperature of indium (157° C.), but above that of a mixed alloy, so that the two materials interdiffuse.

See also: U.S. patent and U.S. Pat. Nos. 4,039,833; 4,354,109; 4,447,291; 4,479,139; 4,551,629; 4,573,627; 4,614,960; 4,672,737; 4,706,166; 4,718,028; 4,740,700; 4,782,028; 4,803,363; 4,804,132; 4,807,000; 4,817,850; 4,833,515; 4,845,540; 4,865,245; 4,868,902; 4,905,265; 4,910,154; 4,912,545; 4,929,913; 4,930,001; 4,935,627; 4,956,695; 4,964,701; 4,965,649; 4,980,555; 4,998,688; 4,999,486; 5,001,532; 5,015,858; 5,021,854; 5,043,582; 5,045,681; 5,070,241; 5,075,201; 5,075,553; 5,091,288; 5,092,036; 5,111,050; 5,113,076; 5,120,960; 5,128,534; 5,132,763; 5,141,334; 5,146,302; 5,149,671; 5,149,954; 5,168,338; 5,185,613; 5,186,379; 5,201,582; 5,227,656; 5,235,176; 5,236,871; 5,245,191; 5,264,699; 5,269,453; 5,279,974; 5,290,423; 5,293,036; 5,294,789; 5,296,384; 5,300,777; 5,304,500; 5,306,386; 5,308,980; 5,311,010; 5,322,816; 5,327,005; 5,336,879; 5,340,984; 5,347,086; 5,365,088; 5,376,558; 5,376,793; 5,379,336; 5,380,669; 5,381,784; 5,382,542; 5,382,977; 5,384,267; 5,386,128; 5,389,792; 5,391,868; 5,393,696; 5,399,206; 5,401,986; 5,404,006; 5,406,701; 5,414,294; 5,426,072; 5,426,303; 5,426,304; 5,432,374; 5,436,450; 5,440,130; 5,444,280; 5,446,529; 5,449,908; 5,449,944; 5,457,318; 5,475,224; 5,477,173; 5,483,088; 5,485,010; 5,488,504; 5,489,776; 5,494,483; 5,495,114; 5,502,300; 5,512,750; 5,519,529; 5,523,570; 5,523,628; 5,525,867; 5,539,206; 5,541,914; 5,543,641; 5,559,332; 5,559,336; 5,561,593; 5,567,942; 5,567,975; 5,568,574; 5,572,029; 5,574,282; 5,578,826; 5,581,084; 5,582,485; 5,591,678; 5,604,977; 5,608,208; 5,621,227; 5,627,112; 5,629,524; 5,633,203; 5,646,426; 5,652,150; 5,661,267; 5,661,590; 5,672,545; 5,696,577; 5,701,010; 5,708,269; 5,721,429; 5,731,621; 5,732,706; 5,734,156; 5,742,060; 5,742,089; 5,751,049; 5,754,009; 5,773,831; 5,786,597; 5,794,331; 5,801,681; 5,808,329; 5,811,808; 5,825,033; 5,827,771; 5,832,599; 5,847,396; 5,880,010; 5,880,510; 5,900,630; 5,900,799; 5,904,495; 5,912,942; 5,930,330; 5,936,268; 5,949,081; 5,952,646; 5,959,339; 5,965,899; 5,985,692; 6,045,614; 6,054,718; 6,057,552; 6,068,818; 6,069,935; 6,080,984; 6,091,070; 6,104,046; 6,107,619; 6,121,618; 6,133,989; 6,157,042; 6,159,149; 6,166,370; 6,166,438; 6,172,362; 6,175,611; 6,184,538; 6,194,715; 6,194,726; 6,198,101; 6,211,529; 6,216,941; 6,225,059; 6,254,827; 6,255,643; 6,315,953; 6,320,177; 6,325,757; 6,328,421; 6,331,274; 6,335,622; 6,342,700; 6,346,700; 6,355,939; 6,393,327; 6,410,917; 6,417,514; 6,450,615; 6,455,908; 6,465,344; 6,501,092; 6,525,387; 6,531,700; 6,538,445; 6,540,961; 6,541,763; 6,545,289; 6,550,665; 6,552,343; 6,555,890; 6,566,679; 6,621,097; 6,630,735; 6,642,537; 6,647,297; 6,657,194; 6,689,628; 6,727,702; 6,734,452; 6,740,864; 6,743,657; 6,777,312; 6,803,557; 6,819,463; 6,821,729; 6,852,976; 6,864,552; 6,875,975; 6,885,002; 6,897,447; 6,926,190; 6,927,383; 6,930,319; 6,949,748; 6,967,345; 6,970,745; 7,001,794; 7,015,715; 7,052,927; 7,054,410; 7,095,028; 7,129,104; 7,129,489; 7,135,698; 7,145,721; 7,164,702; 7,180,066; 7,180,579; 7,190,165; 7,206,062; 7,217,926; 7,217,982; 7,218,184; 7,223,981; 7,241,419; 7,268,081; 7,333,181; 7,339,246; 7,351,972; 7,408,572; 7,425,308; 7,436,494; 7,453,129; 7,465,661; 7,468,504; 7,474,005; 7,492,399; 7,511,753; 7,512,297; 7,521,224; 7,531,809; 7,532,242; 7,541,584; 7,544,532; 7,551,059; 7,579,594; 7,586,074; 7,589,326; 7,592,593; 7,605,050; 7,608,824; 7,608,906; 7,626,460; 7,634,061; 7,652,252; 7,671,341; 7,723,815; 7,755,023; 7,777,186; 7,795,640; 7,795,650; 7,800,067; 7,808,528; 7,811,855; 7,820,971; 7,858,034; 7,863,741; 7,868,665; 7,919,762; 7,928,473; 7,972,885; 7,973,377; 7,999,869; 8,004,012; 8,009,420; 8,021,914; 8,022,349; 8,030,925; 8,035,184; 8,044,435; 8,097,857; 8,097,904; 8,107,777; 8,115,152; 8,120,683; 8,125,367; 8,143,687; 8,154,099; 8,163,094; 8,163,644; 8,179,296; 8,198,576; 8,243,876; 8,283,632; 8,296,940; 8,314,446; 8,343,807; 8,362,520; 8,399,910; 8,421,015; 8,441,089; 8,456,004; 8,471,204; 8,491,190; 8,514,284; 8,530,264; 8,547,170; 8,552,479; 8,552,480; 8,567,658; 8,586,936; 8,592,301; 8,610,171; 8,624,968; 8,629,726; 8,637,824; 8,653,461; 8,659,664; 8,664,739; 8,692,176; 8,709,949; 8,759, 873; 8,772,729; 8,780,418; 8,780,420; 8,816,268; 8,829,452; 8,835,851; 8,847,202; 8,847,409; 8,872,159; 8,900,986; 8,933,832; 8,946,638; 8,969,851; 8,970,706; 9,020,095; 9,024,359; 9,029,259; 9,029,833; 9,054,247; 9,064,992; 9,069,080; 9,105,548; 9,106,056; 9,110,169; 9,121,953; 9,123,607; 9,134,439; 9,142,585; 9,146,157; 9,184,194; 9,190,377; 9,225,920; 9,276,030; 9,276,161; 9,277,204; 9,294,690; 9,318,517; 9,324,745; 9,349,889; 9,385,738; 9,420,264; 9,426,397; 9,453,914; 9,491,389; 9,525,831; 9,530,820; 9,537,027; 9,549,158; 9,575,184; 9,593,907; 9,596,421; 9,613,924; 9,613,999; 9,618,648; 9,627,563; 9,635,284; 9,640,680; 9,664,562; 9,685,477; 9,698,134; 9,712,771; 9,716,085; 9,723,233; 9,743,024; 9,746,376; 9,748,214; 9,761,751; 9,774,795; 9,780,240; 9,797,995; 9,834,209; 9,843,741; 9,847,441; 9,866,773; 9,911,774; 9,923,013; 9,935,138; 9,935,151; RE36315; RE40249; RE43722; 20010025928; 20010026778; 20010026935; 20010029061; 20020001015; 20020008191; 20020011640; 20020011642; 20020028503; 20020106867; 20020111655; 20020125472; 20020135373; 20020135869; 20020144548; 20020146919; 20020148957; 20020161417; 20020179921; 20030000454; 20030015737; 20030020075; 20030102432; 20030160172; 20030178474; 20030183855; 20030194054; 20030199113; 20030205704; 20040008397; 20040016872; 20040017224; 20040021466; 20040031968; 20040061056; 20040063322; 20040095492; 20040106966; 20040108461; 20040108564; 20040124431; 20040142504; 20040144927; 20040169753; 20040172100; 20040188596; 20040189328; 20040195516; 20040195640; 20040228436; 20040240257; 20040241965; 20050044054; 20050045910; 20050070018; 20050082488; 20050116260; 20050167606; 20050189943; 20050205954; 20050255631; 20050261135; 20050263888; 20060038128; 20060056759; 20060108528; 20060118721; 20060118722; 20060181627; 20060232674; 20060232760; 20070001119; 20070012948; 20070025504; 20070052947; 20070075224; 20070075888; 20070131868; 20070197022; 20070209437; 20070210244; 20070224722; 20070235656; 20070235758; 20080019872; 20080032895; 20080079704; 20080089637; 20080090319; 20080111152; 20080135757; 20080231719; 20080277784; 20090001278; 20090004760; 20090050786; 20090051796; 20090072284; 20090078872; 20090079956; 20090101919; 20090108942; 20090109582; 20090121307; 20090122173; 20090173883; 20090244342; 20090256231; 20090290680; 20090321642; 20100025588; 20100035052; 20100038539; 20100101840; 20100116999; 20100140732; 20100226495; 20100246754; 20100295095; 20100295141; 20110011531; 20110032130; 20110042772; 20110079894; 20110084212; 20110101483; 20110114705; 20110147707; 20110147877; 20110156097; 20110169117; 20110169160; 20110176577; 20110198719; 20110215222; 20110218432; 20110221024; 20110221025; 20110233394; 20110233709; 20110248316; 20110253430; 20110261191; 20110272589; 20110315429; 20120001288; 20120028401; 20120043637; 20120068225; 20120068295; 20120138774; 20120161001; 20120161314; 20120187297; 20120205541; 20120262322; 20120273951; 20120285923; 20120306039; 20130000963; 20130028372; 20130044248; 20130076910; 20130082241; 20130107243; 20130126746; 20130153856; 20130175430; 20130187028; 20130193308; 20130214373; 20130244417; 20130250272; 20130250273; 20130270329; 20130273730; 20130341594; 20140061472; 20140061838; 20140061911; 20140063306; 20140091218; 20140102594; 20140160278; 20140173926; 20140175286; 20140197303; 20140217297; 20140225214; 20140263955; 20140267852; 20140291479; 20140312303; 20140340487; 20140350836; 20140367824; 20150115132; 20150123831; 20150136954; 20150136955; 20150163419; 20150202939; 20150243825; 20150258990; 20150280035; 20150287870; 20150301180; 20150319391; 20150331113; 20150355369; 20150364515; 20160003946; 20160043268; 20160087001; 20160104696; 20160142657; 20160148965; 20160150165; 20160155892; 20160181458; 20160195616; 20160218139; 20160220814; 20160231083; 20160255284; 20160266242; 20160295151; 20160307956; 20160341818; 20160344965; 20160372443; 20170006236; 20170010223; 20170025453; 20170026603; 20170033253; 20170040368; 20170041571; 20170062400; 20170069780; 20170077329; 20170084764; 20170084773; 20170133336; 20170179185; 20170179327; 20170211200; 20170250209; 20170299763; 20170330986; 20170372602; 20170373044; 20180013022; 20180013052; 20180019269; 20180024232; 20180024254; 20180035067; 20180056993; 20180067075; 20180094980; 20180114713; 20180122851; 20180132393; 20180132394; 20180132395; 20180132396; 20180132397; 20180132398; 20180132399; 20180151764; 20180160059; 20180160068; 20180175230; 20180175476; 20180190705; 20180198016; 20180212091; 20180247974; and 20180254369.

What is needed is a method to bond superconducting integrated circuits that is mechanically and electrically reliable, avoids damage to superconducting devices, and is scalable to large arrays of small contacts. Furthermore, a method that maintains fully superconducting contacts between superconducting circuits may be essential for quantum computing systems. A method with all of these characteristics does not seem to be present in the prior art.

SUMMARY OF THE INVENTION

The invention provides a method for manufacturing an array of superconducting bonds between superconducting circuits on different chips, such that the operating system of the superconducting circuits can comprise a plurality of chips in an extended three-dimensional package or multichip module (MCM).

In a preferred embodiment, the superconducting circuits comprise niobium Josephson junctions, and the superconducting bonds comprise indium. The superconducting critical temperature $T_c$ of Nb is 9.2° K, and that of In is 3.4° K, so that for combined superconducting operation, the MCM must be cooled below 3.4° K.

In a further preferred embodiment, each chip is manufactured with an array of copper posts covered with indium bumps, and the chips are pressed together in such a way that the compression of the indium bumps is stopped by the copper posts, corresponding to a chip separation of order 4 microns (μm) (see FIGS. 10-12).

In a still further preferred embodiment, a diffusion stopping layer (DSL) is present to prevent interaction of the indium with the copper or the niobium. This diffusion stopping layer is preferentially also superconducting, so that the conducting path between the chips Nb/DSL/In/DSL/Nb is fully superconducting.

Indium is well known for its unusual mechanical properties; in its pure form, it is a metal with a low melting point, only 157° C., which is somewhat soft and deformable at room temperature, and becomes increasingly softer as the temperature is increased toward the melting point. It is also a highly reactive metal at moderate temperatures, which tends to form alloys with even lower melting points, but these alloys tend to be brittle and less deformable.

The use of indium or indium alloys as low-temperature solders is well known in the prior art. However, the present invention teaches that processing temperatures should be kept less than 150° C., and preferably less than 130° C., to avoid altering the properties of the tunnel barrier that defines the critical current of the Nb Josephson junctions. As such, the indium (or indium alloy) preferably should not reach its melting temperature or liquification point.

In a preferred embodiment, compression is carried out at a temperature of about 75-125° C., whereby the indium is sufficiently soft that pressures of less than several thousand bars (1 bar=14.7 psi=100 kPa) can compress the package in a controlled and reliable manner in a time that is less than one hour, even for an assembly with thousands of bump bonds.

The use of the term "indium" in the present application does not necessarily require 100% purity, but rather that the electrical, thermal, and mechanical properties are substantially the same as those of pure indium. For example, addition of up to 1% of tin into indium goes in substitutionally on the atomic level, and remains soft with a similar melting point, resistivity, and superconducting critical temperature. In contrast, significant oxidation of indium leads to a material that is hard with poor electrical conduction.

A module made in this way is robust and stable, and can withstand thermal cycling and mechanical mounting multiple times between room temperature and an operating temperature of about 3 K. The superconducting critical current of a single indium bond of order 10-30 μm in diameter is typically about 10 mA or larger, sufficient to distribute bias currents among Josephson junction circuits. Further, an indium bond can also function to transport signals associated with single-flux-quantum (SFQ) voltage pulses, typically 1 mV high by 2 ps wide. In addition to small (zero) resistance, this also requires that the indium bonds do not have a large inductance (greater than a few pH, consistent with the short interchip spacing), so that these pulses are not substantially dispersed.

Bonding of chips with several thousand indium bonds has been fabricated and tested, showing that this process is scalable to higher levels of integration. This may be particularly valuable for application to a system for quantum computing, as shown conceptually in FIG. 16. One chip could comprise an array of superconducting quantum bits (qubits), while the bonded chip could comprise a matched array of SFQ-based control and readout circuitry. This represents an embodiment of a quantum-classical MCM assembly, comprising, for example, at least one quantum chip and at least one classical chip.

FIGS. 17A-17D show several preferred embodiments of configurations for bonding a quantum circuit (comprising qubits) to a classical circuit (comprising, e.g., SFQ circuits). The circuits from the two chips may be in close contact, or alternatively they may be located on opposite sides of their respective chips. In the latter case, through-chip vias (which may comprise superconducting connections) may provide coupling to the electrical contacts between the chips. Furthermore, high-frequency signal connections between the two chips may be enabled with inductive or capacitive coupling, rather than just direct electrical (galvanic) coupling.

There may be a further advantage for the use of copper posts in the context of quantum circuits. It is known in the literature that when a superconductor (such as niobium or indium) is in good electrical contact with a normal metal such as copper, hot electrons (also known as excited quasiparticles) may be trapped in the normal metal. This is particularly true at very low temperatures, when the superconducting energy gap is much greater than thermal energy kBT. Such excited quasiparticles may be generated by classical SFQ circuits, which include electrical resistors. It is also known in the literature that such excited quasiparticles may act to reduce the coherence time of qubits, thus limiting their functionality. The presence of copper posts in the electrical contacts between classical and quantum circuits may act to trap excited quasiparticles, thus reducing the leakage of such quasiparticles from the classical to the quantum circuits. This may tend to improve the performance of the quantum circuits, as compared to quantum circuits with bonds that do not include copper posts.

While the intention of preferred embodiments is generally to bond chips together permanently, in an alternative embodiment, the process may be altered slightly so that the two chips may be detached after preliminary testing, without significant damage to either chip. Such an alternative process may comprise slightly reduced temperature, pressure, and/or processing time. Furthermore, detachment (debonding) may be assisted by relatively gentle mechanical means such as a localized burst of high-pressure air, which would also not cause significant damage to the chips.

Further embodiments of the system and method for bonding superconducting chips are presented later in the Detailed Description section, together with a more complete explanation of the figures. These examples represent preferred embodiments of the invention, but the invention is not restricted to these examples, and other embodiments and applications that follow the same principles are also covered.

It is therefore an object to provide a method for interconnecting electronic circuits, comprising: depositing a plurality of metallic posts on each electronic circuit; depositing a respective indium bump on each respective metallic post; aligning the indium bumps of the respective electronic circuits; and applying heat at a temperature below a melting temperature of the indium, and sufficient pressure between the respective electronic circuits, to deform and cold-weld the plurality of aligned indium bumps on the respective electronic circuits, to form a bonded circuit having a plurality of cold-welded indium bonds.

The indium between the aligned metallic posts is plastically deformed and at least a portion is displaced from the space between the tips of the metallic posts. The indium forms a continuous sleeve around the metallic posts between the two electronic circuits. The heat softens the indium, to reduce its resistance to plastic deformation. The amount of compression is limited to avoid cracking of the indium film or undue pressure on the electronic circuits. The compression may continue until the aligned metallic posts contact, and the tips of the metallic posts may be shaped to facilitate such contact. The impedance between respective metallic posts may be measured to determine their contact status.

The heat may be applied at a temperature of between 50° C. and 150° C.

The sufficient pressure may be applied by a fixture configured to maintain the alignment of the indium bumps during application of the sufficient pressure. The fixture may be a flip chip bonder. The method may further comprise removing the bonded circuit from the fixture. The bonded circuit may be cooled to a temperature at which the indium is superconductive.

At least one electronic circuit may comprise a Josephson junction, the method further comprising cooling the at least one electronic circuit, and producing at least one pulse with the Josephson junction.

A diffusion barrier may be deposited under each respective indium bump. The diffusion barrier may comprise a superconducting compound, e.g., niobium nitride or titanium nitride.

The electronic circuits may be fabricated on a wafer, with at least one electronic circuit located on the opposite side of the wafer from the indium bumps. A through-wafer via may be provided which enables electrical connection from the electronic circuit to the indium bumps on the opposite side of the wafer.

The metallic post may comprise copper. Alternates are gold alloy (for hardness), silver, niobium, or other metals. In general, the metallic post should have substantially lower deformation under the compression, so that it remains dimensionally stable.

One of the electronic circuits may comprise a carrier for a multi-chip module. A plurality of electronic circuits may be bonded to the same carrier.

At least one of the electronic circuits may comprise niobium, aluminum, niobium-titanium, or niobium nitride.

At least one of the indium bonds may be electrically connected to a ground layer. The ground layer may be a superconducting ground layer.

At least one indium bump may be about 30 micrometers or less in diameter. For example, it may be 30, 25, 20, 15, 10, or 5 μm in diameter.

The method may further comprise cooling the bonded circuit to a deep cryogenic temperature less than or equal to 3.4° K, e.g., 3.4° K, 3.3° K, 3.2° K, 3.1° K, 3.0° K, 2.75° K, 2.5° K, 2.25° K, 2.0° K, 1.0° K, 0.5° K, 0.25° K, 0.1° K, etc.

The bonded circuit may comprise a superconducting electronic device, and the cold-welded indium bonds may be configured to carry an electrical current without resistance of at least about 10 mA.

At least one of the electronic circuits may comprise at least one qubit. At least one of the electronic circuits may comprise a single-flux-quantum logic circuit. At least one of the electronic circuits may comprise at least one superconducting electromagnetic sensor.

The heating at the temperature below the melting temperature of the indium may comprise heating the aligned bumps to a temperature less than about 150° C., e.g., 150° C., 140° C., 130° C., 120° C., 110° C., 100° C., 90° C., 80° C., 70° C., or 60° C.

The applying a sufficient pressure may comprise applying a uniaxial pressure less than five thousand bars applied across the plurality of bumps for a period of less than one hour. For example, the pressure may be 5000 bars, 4000 bars, 3000 bars, 2500 bars, 2000 bars, 1500 bars, 1200 bars, 1000 bars, or lower. The time of compression may be 100 minutes, 75 minutes, 60 minutes, 45 minutes, 30 minutes, 20 minutes, 15 minutes, 10 minutes, 8 minutes, 5 minutes, 4 minutes, 3 minutes, 2 minutes, or 1 minute.

The alignment of the indium bumps may be achieved using alignment marks in a flip-chip bonder.

The plurality of metallic posts may serve to maintain a uniform separation between the two electronic circuits after compression.

A respective pair of aligned metallic posts may be compressed to displace the indium on top of each respective metallic post.

The number of functional cold-welded indium bonds on at least one electronic circuit may exceed 1,000.

The electrical properties of the cold-welded indium bonds may permit the transmission between the electronic circuits of fast pulse trains of picosecond single-flux-quantum voltage pulses below a superconducting temperature of the indium.

The bonded circuits are adapted to be fully debonded without damaging the electronic circuits.

Another object provides a multi-chip module comprising at least two superconducting electronic chips bonded to a superconducting carrier via a plurality of indium bumps, each indium bump comprising an indium coating on a metallic post, wherein opposing indium bumps are compressed and heated below a melting temperature of the indium to form a cold-welded bond that functions as a superconducting interconnect between superconducting circuits on the respective electronic chips and carrier, when cooled to deep cryogenic temperatures. A diffusion barrier layer may be provided between the indium and the metallic post. The cold-welded bond permits the transmission of picosecond single-flux-quantum voltage pulses between the superconducting carrier and a superconducting chip bonded to the carrier.

In order to assist in maintaining the integrity of the cold-welded bonds, a cryogenically stable adhesive, such as an epoxy may be provided in a gap between the electronic circuits.

The module may comprise at least one quantum circuit and at least one classical circuit, wherein the at least one classical circuit functions, e.g., to control the quantum circuit and read out signals from the quantum circuit.

Other objects will become apparent through a review of the description provided herein.

BRIEF DESCRIPTION OF THE DRAWINGS

FIG. 1 shows the deposition of a superconducting ground plane.

FIG. 2 shows the deposition of an insulating layer above the ground plane shown in FIG. 1, with holes through to the ground plane.

FIG. 3 shows the deposition of a superconducting wiring layer on the insulating layer of FIG. 2, forming vias to the ground plane, and a large contact pad.

FIG. 4 shows the deposition of a gold contact pad connecting to the superconducting wiring layer of FIG. 3.

FIG. 5 shows the deposition of copper posts on top of the superconducting vias of FIG. 4.

FIG. 6 shows the deposition of a diffusion stopping layer on top of the copper posts of FIG. 5.

FIG. 7 shows the deposition of indium bumps on top of the diffusion stopping layer of FIG. 6.

DETAILED DESCRIPTION OF THE PREFERRED EMBODIMENTS

FIGS. 1 through 7 show steps of a preferred embodiment of the method for preparing indium bump bonds on superconducting Nb chips, integrated into a prior-art method for fabricating superconducting integrated circuits. All of these are designed to be carried out on an entire 150 mm silicon wafer, although only a 2-mm portion of a single chip is shown for simplicity.

Figure 1:
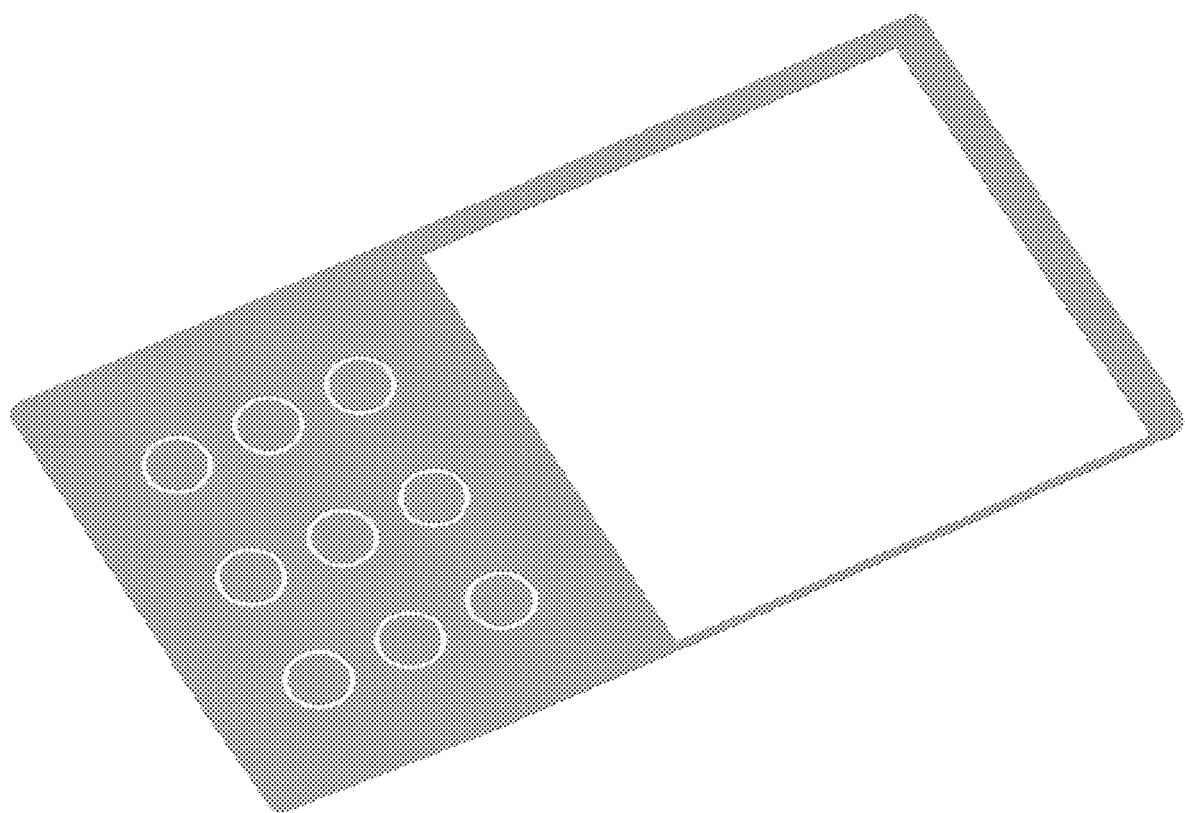
FIGS. 1-7 illustrate a preferred embodiment of the steps to fabricate an array of indium bumps on a superconducting circuit.

FIG. 1 shows Step 1, the deposition of a superconducting Nb ground plane comprising 100 nm of sputtered Nb on top of an oxidized silicon wafer, known in the Hypres standard process (www.hypres.com/foundry/niobium-process/; www.hypres.com/wp-content/uploads/2010/11/Design-Rules-6.pdf; Yohannes, D., et al., "Parametric Testing of HYPRES Superconducting Integrated Circuit Fabrication Processes", IEEE Trans. Applied Superconductivity, V. 17, No. 2, June 2007, pp. 181-186, www.hypres.com/wp-content/uploads/2010/12/Parameter-Testing.pdf) as the layer MO. The small circles show the ultimate locations of the indium bumps, which are not yet present.

Figure 2:
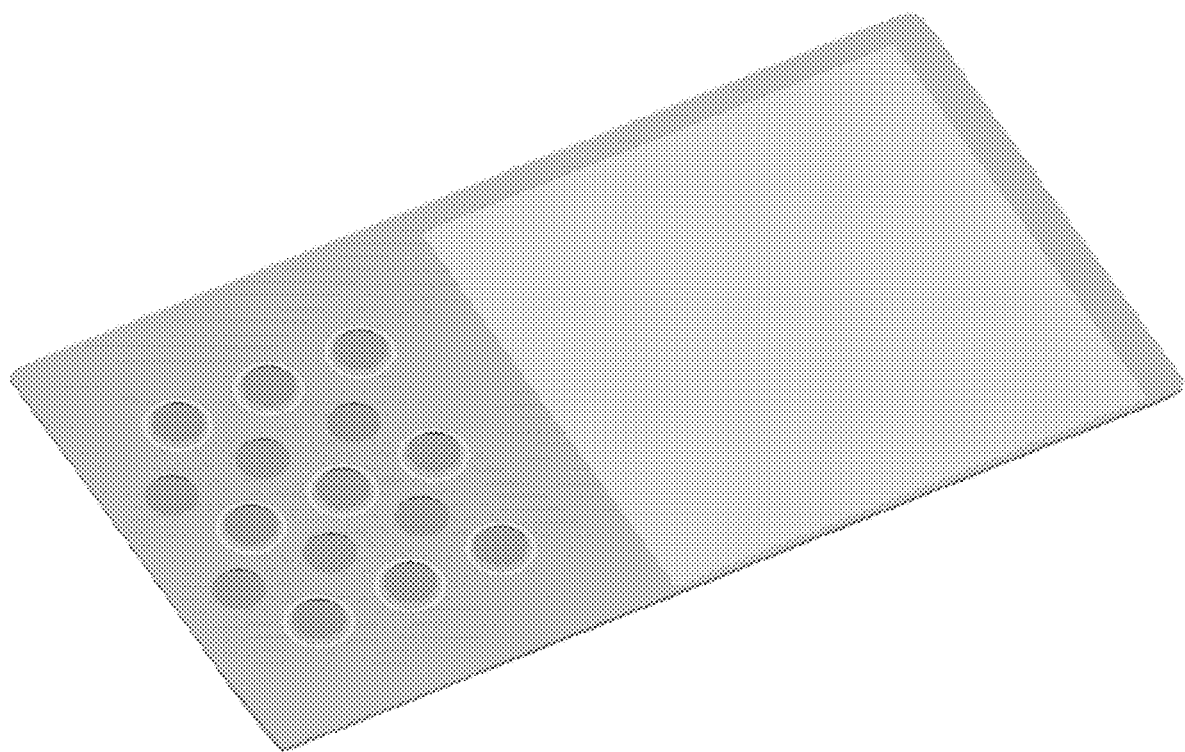

FIG. 2 shows Step 2, the deposition of 150 nm of insulating silicon dioxide ($SiO_2$, typically deposited using plasma-enhanced chemical vapor deposition, or PECVD) on top of the Nb, with an array of patterned holes to establish electrical conducting vias to the next conducting layer. The holes have diameters of about 30 μm or less.

Figure 3:
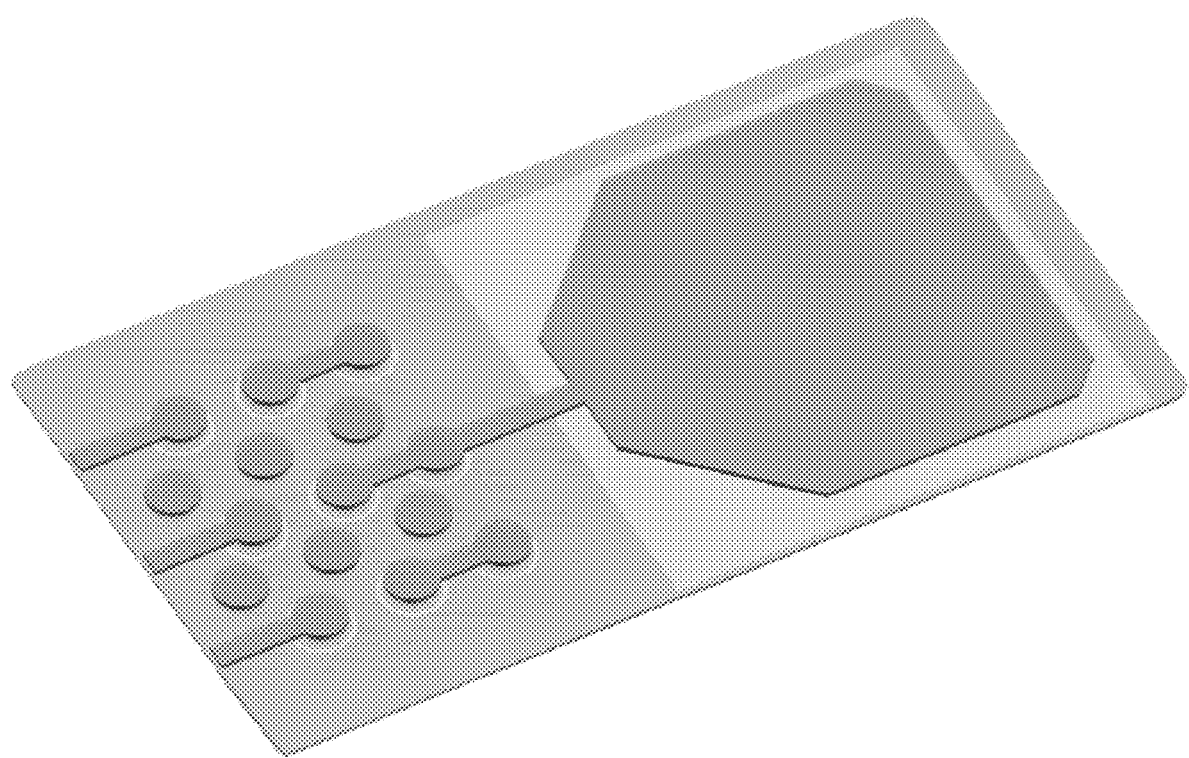

FIG. 3 shows Step 3, the deposition of 300 nm of superconducting Nb that can represent a superconducting signal or a via to ground. Also shown is a large pad on the right that connects to this layer.

Figure 4:
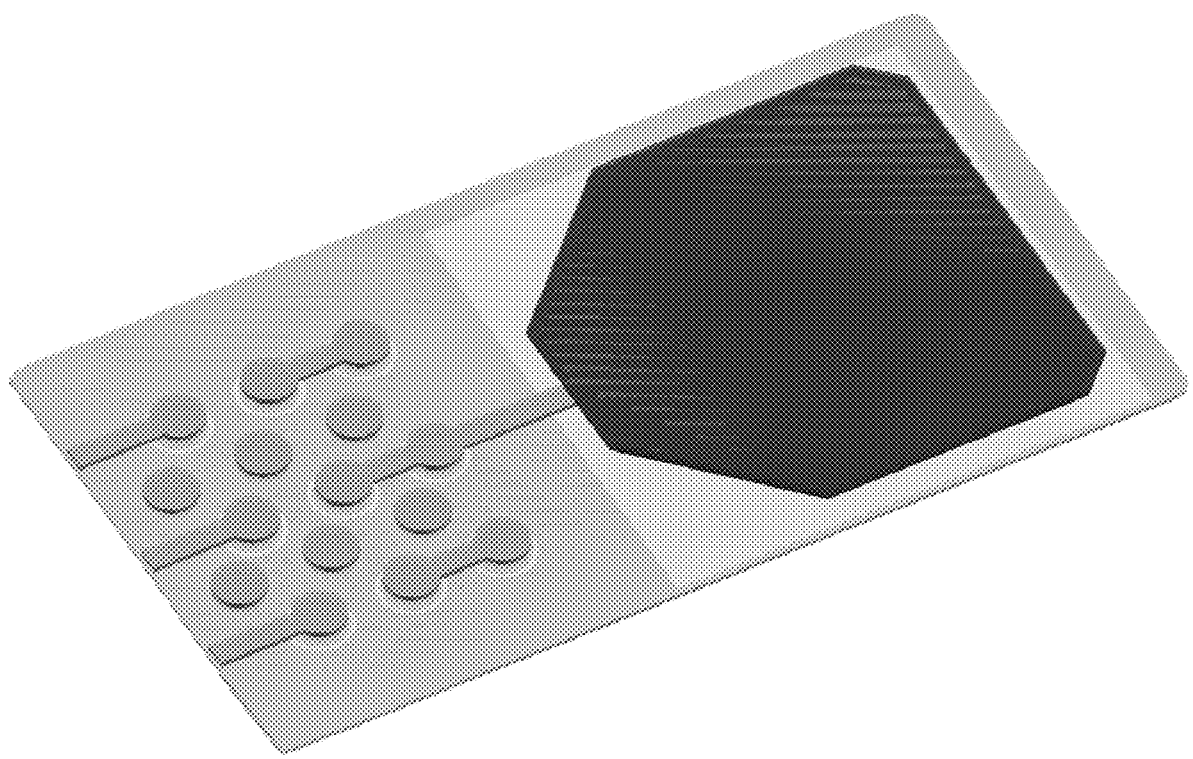

FIG. 4 shows Step 4, the deposition of a large contact pad for external connections, comprising 100 nm Ti and 100 nm Pd followed by 200 nm Au. This establishes a well-adhering pad for external contacts from gold-plated pins.

Steps 1 through 4 comprise steps similar to the fabrication of a prior-art superconducting integrated circuit. Not shown are other standard steps of the prior-art methods, including depositing and defining Josephson junctions of Nb/Al/AlOx/Nb, using controlled oxidation and anodization, depositing a resistive layer such as Mo, additional wiring layers, and steps of planarization. Also, in each case whenever a conducting film is deposited on a sample that has been patterned outside the vacuum system, an initial cleaning step in an argon plasma may be used to ensure unoxidized interfaces.

Figure 5:
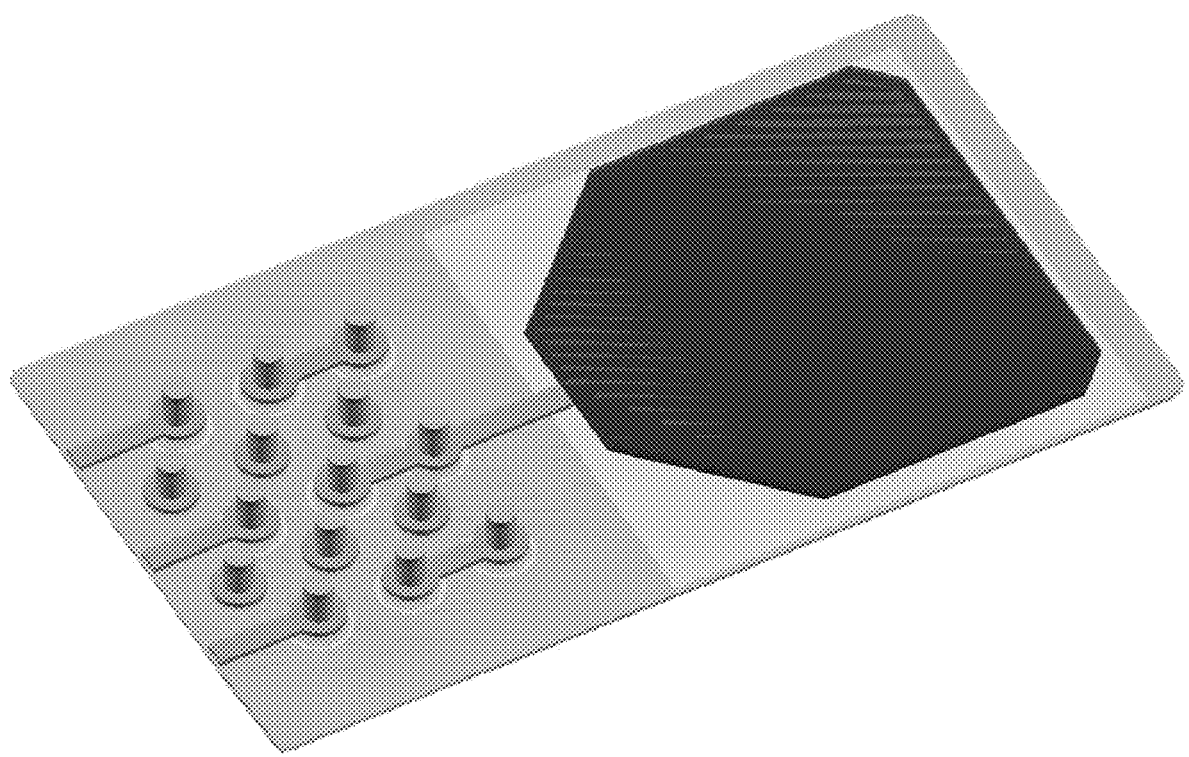

FIG. 5 shows Step 5, the evaporation deposition of an array of 2 μm thick Cu posts on top of the small Nb contacts. Note that the Cu post has a slightly smaller diameter than the Nb contact, leaving a Nb ring around it. These Cu posts can be on ground contacts or signal contacts. The use of Cu is not unique; another metal that is not deformable (or less deformable that the indium under the compression conditions) would also be acceptable, such as Nb, Mo, Ti, Au, etc.

Figure 6:
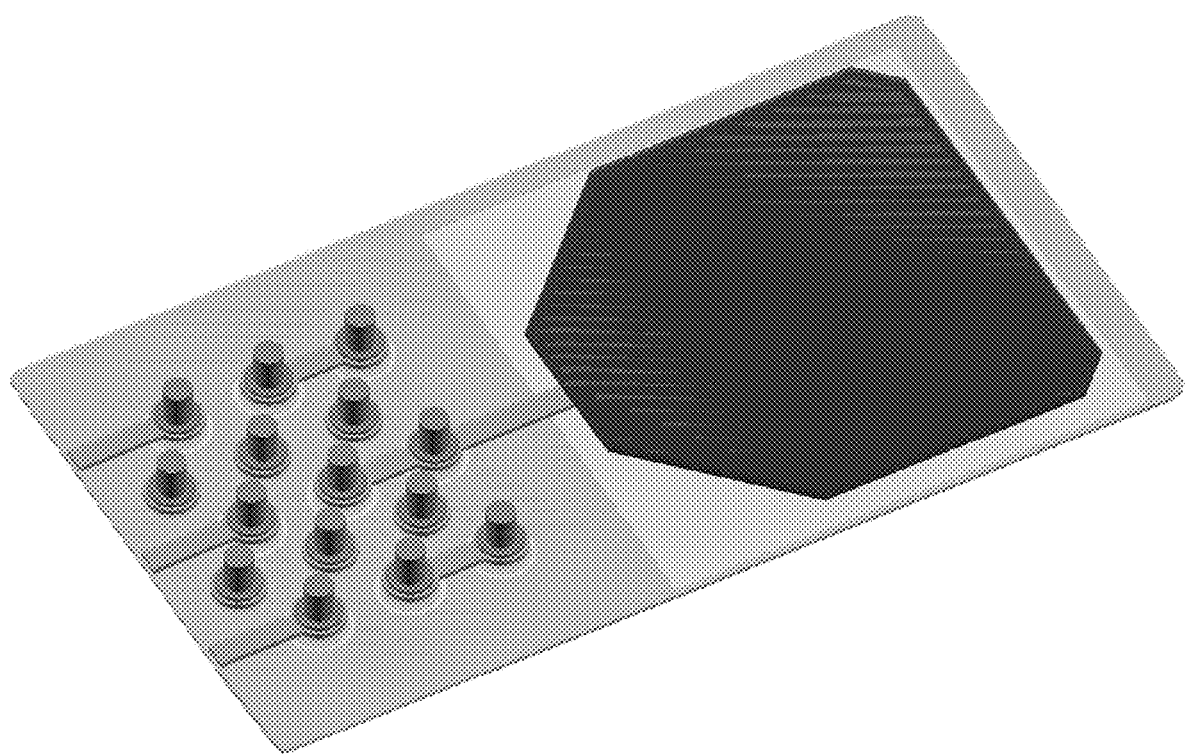

FIG. 6 show Step 6, the deposition of 100 nm of a diffusion stopping layer (DSL) on top of the Cu posts and the Nb ring around each post. Preferred DSL materials include NbN and TiN, both of which can be prepared by reactive sputtering in a gas that includes nitrogen.

Figure 7:
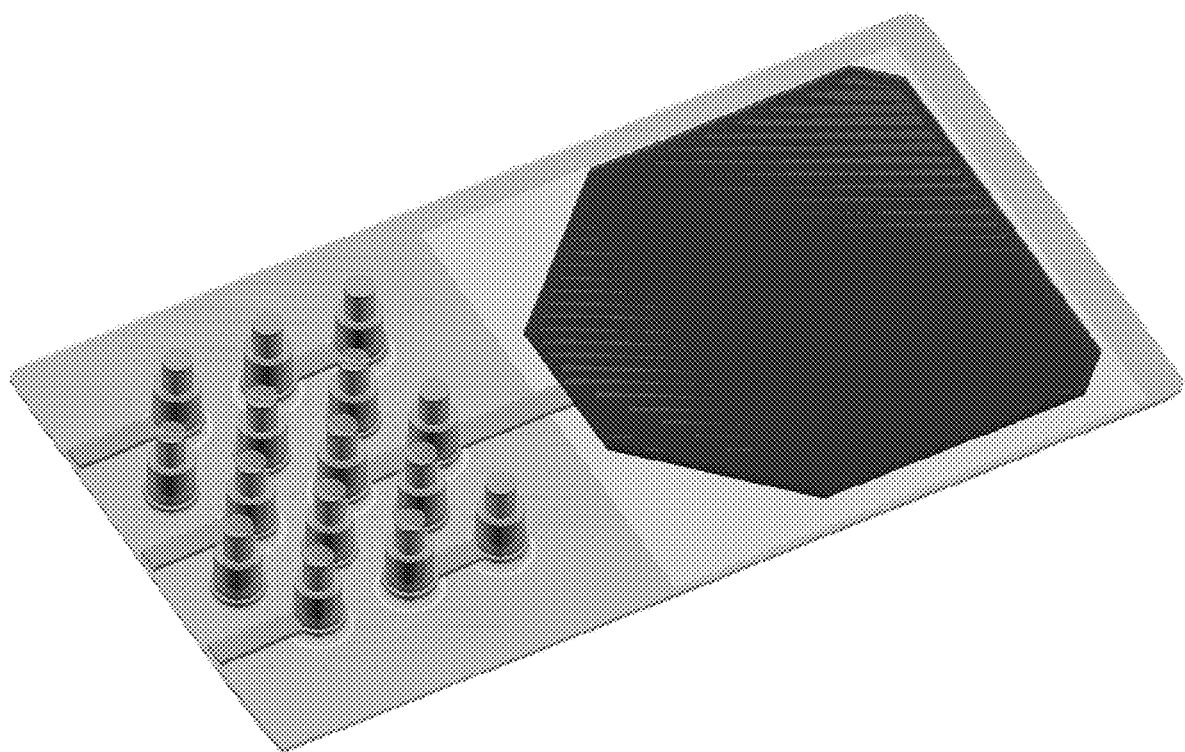

FIG. 7 shows Step 7, the evaporation deposition of 2 μm of indium on top of the DSL. Pure indium is preferred, since indium alloys tend to have a multi-phase microstructure that is harder and more brittle. The metallized patterns may be etched after deposition to form the isolated regions on top of other features.

Figure 8:
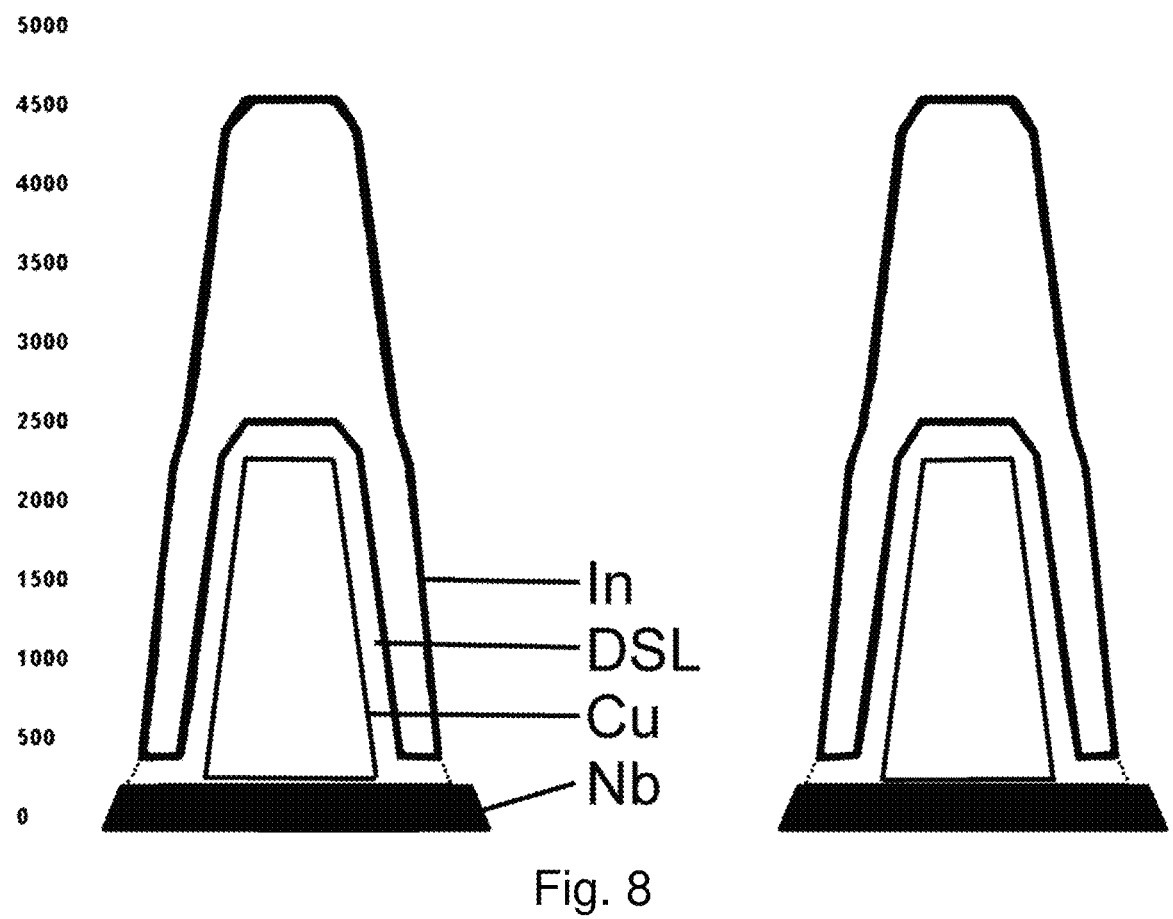
FIG. 8 shows the cross section of two bump bonds before bonding.

FIG. 8 shows the cross section of two of the bumps prepared according to Steps 5 through 7 above, before the chips are pressed together, showing the indium bump, diffusion stopping layer, and copper post on top of the Nb contact. The numbers on the left indicate the approximate layer thicknesses in nm for a preferred embodiment.

Figure 9:
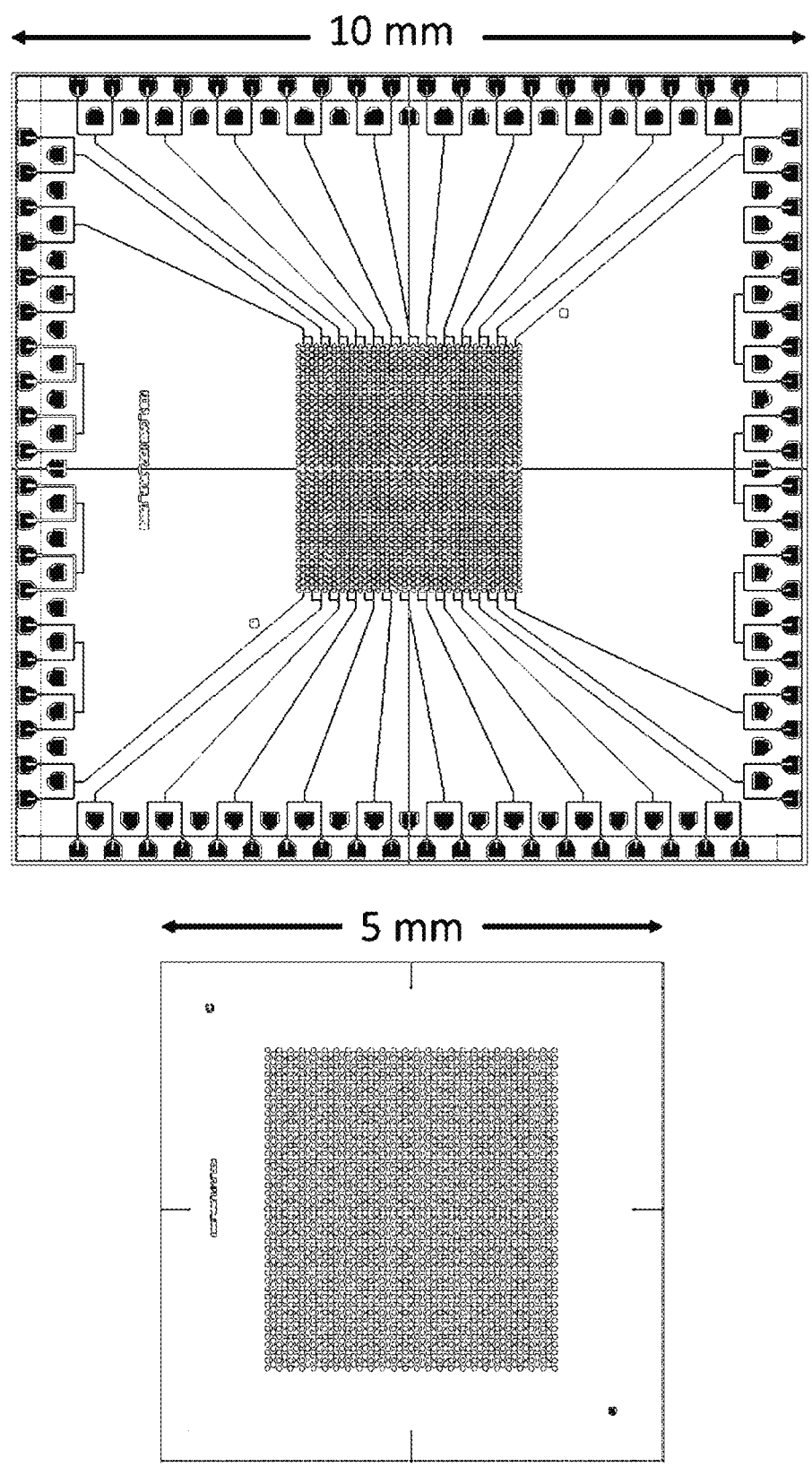
FIG. 9 shows a photograph of a carrier chip and a matching flip chip, each with an array of 2066 bumps.

FIG. 9 shows a photograph of a 10 mm carrier chip and a 5 mm flip chip, each with 2,066 bumps, matching on both chips. These bumps comprise 1,000 signal bumps (25 rows of 40 bumps each, 30 μm in diameter with 80 μm pitch) alternating with 1,066 ground bumps. The carrier chip has gold-plated ground and signal contacts around its periphery, for external biasing and signal measurement. All 1,000 signal bumps could be measured at the same time, or any of the 25 rows could be measured independently. Two other similar test structures were also tested using carrier and flip chips of the same size: The first structure had 300 signal bumps (15 rows of 20 bumps each, 30 μm in diameter with 130 μm pitch) alternating with 366 ground bumps, where all signal bumps could be measured together, or with independent rows. The second structure had 2,691 signal bumps (39 rows of 69 bumps each, 15 μm in diameter with 50 μm pitch) alternating with 3,353 ground bumps.

After removal of the wafer from the deposition system, the individual chips are separated (diced) using a commercial dicing machine. If there will be a significant delay before flip-chip bonding, the chips should be maintained in an environment that minimizes oxidation of the indium surfaces. The presence of significant oxide layers on indium surfaces may reduce the reliability of the method. For example, the chips may be immersed in a bath of methanol. Alternatively, just before bonding, the indium bumps may be subjected to an argon plasma etch to remove an accumulated surface oxide.

Figure 10:
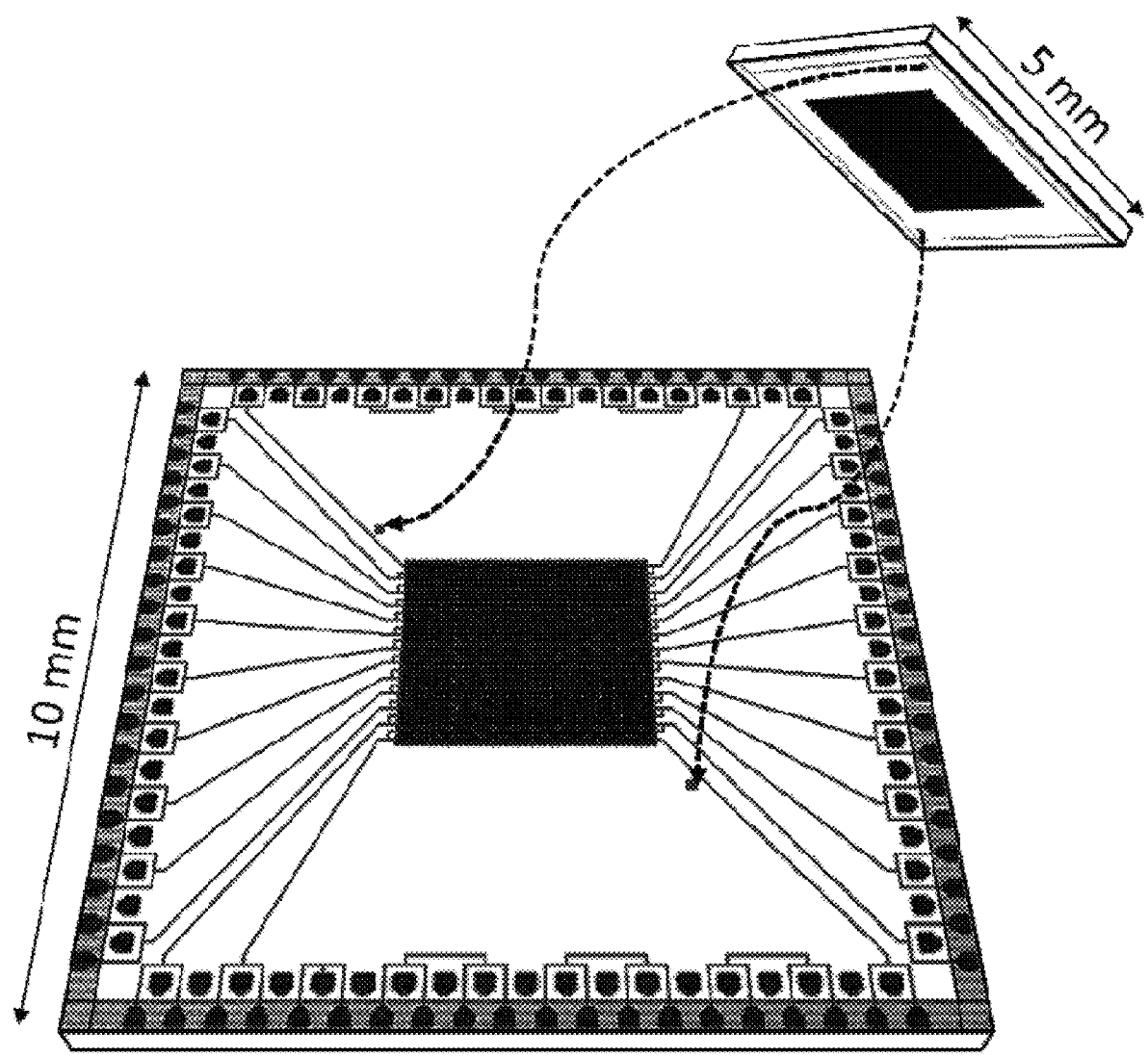
FIG. 10 shows the flip-chip alignment configuration for bonding to the carrier chip.

FIG. 10 shows how the bumps on the flip chip are aligned with the corresponding bumps on the carrier chip, with the help of the small alignment marks noted. This may be carried out using a commercial flip-chip bonder, such as the Karl Suss MicroTec FC-150, which permits micron alignment resolution. This bonder also allows controlled compression and temperature. For each structure, the chips were heated to about 75-125° C., using a force up to 20 kg (i.e., 200 Nt or 44 lb) for a period of about 15 minutes. Given the contact area of the bonds, this force corresponded to a uniaxial pressure up to several thousand bars.

Figure 11:
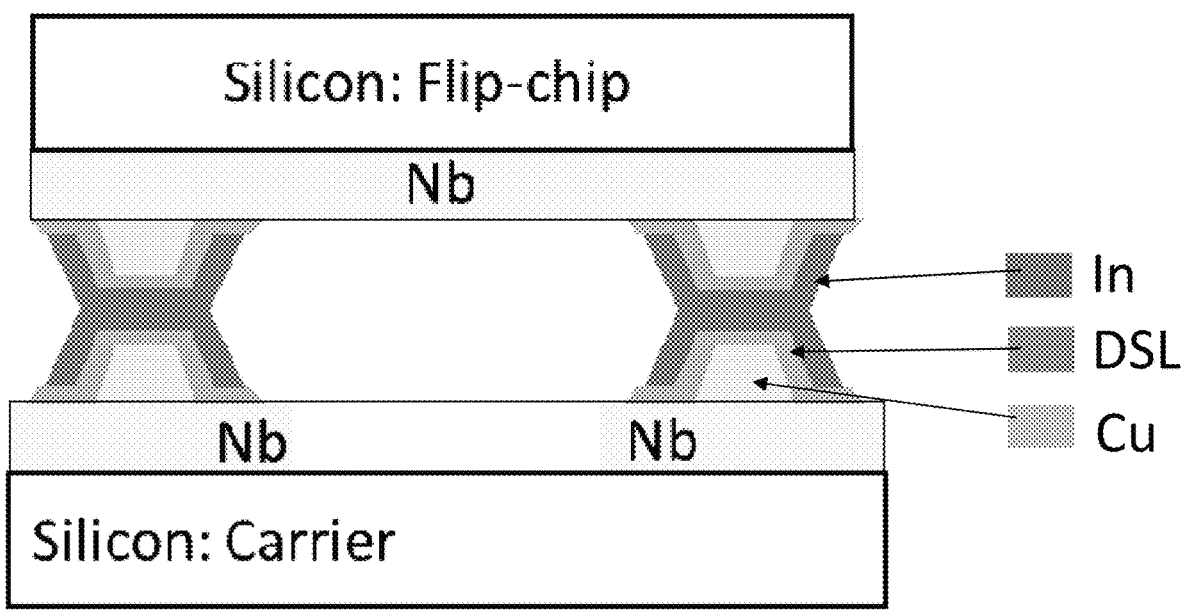
FIG. 11 shows a cross-sectional view of two aligned bonds before full compression.

FIG. 11 provides a cross-sectional view of aligned indium bumps as compression is initiated, with a thick layer of In between the two DSL/copper posts. Thicknesses of layers are not drawn to scale.

Figure 12:
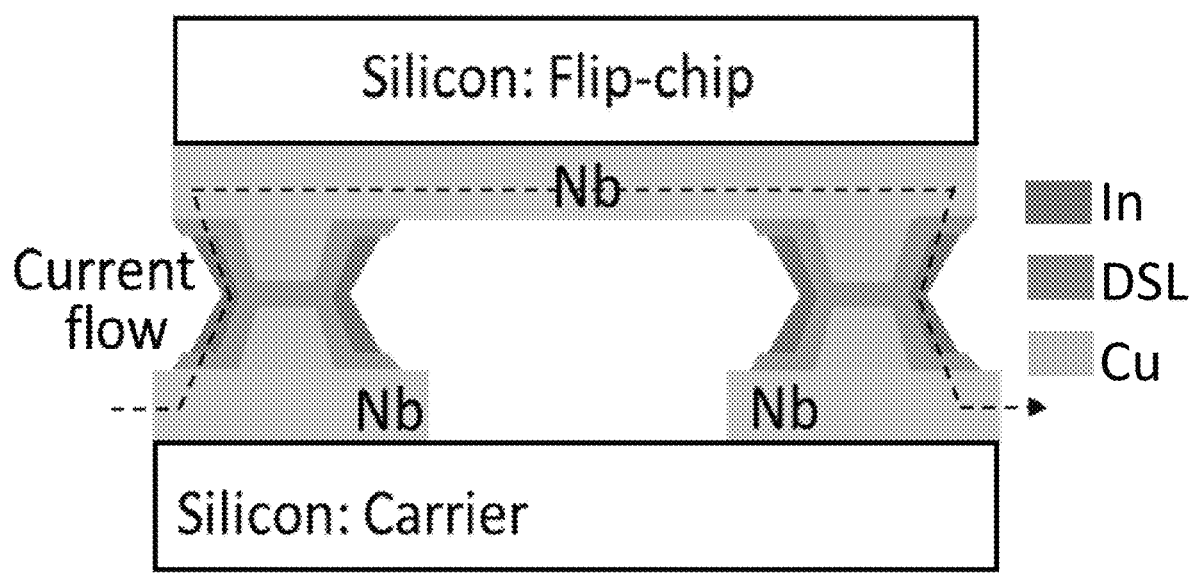
FIG. 12 shows a cross-sectional view of two aligned bonds after full compression.

FIG. 12 provides a cross-section of aligned bumps as compression is completed, with most of the indium between the two DSL/copper posts squeezed out. Since the DSL/Cu is not compressed, this provides a hard stop for the separation of the two chips, about 4 µm for the steps presented. While current can flow through the Cu posts in the resistive state, the superconducting indium shorts out the Cu below 3.4° K, providing a fully superconducting current path. Thicknesses of layers are not drawn to scale.

Figure 13:
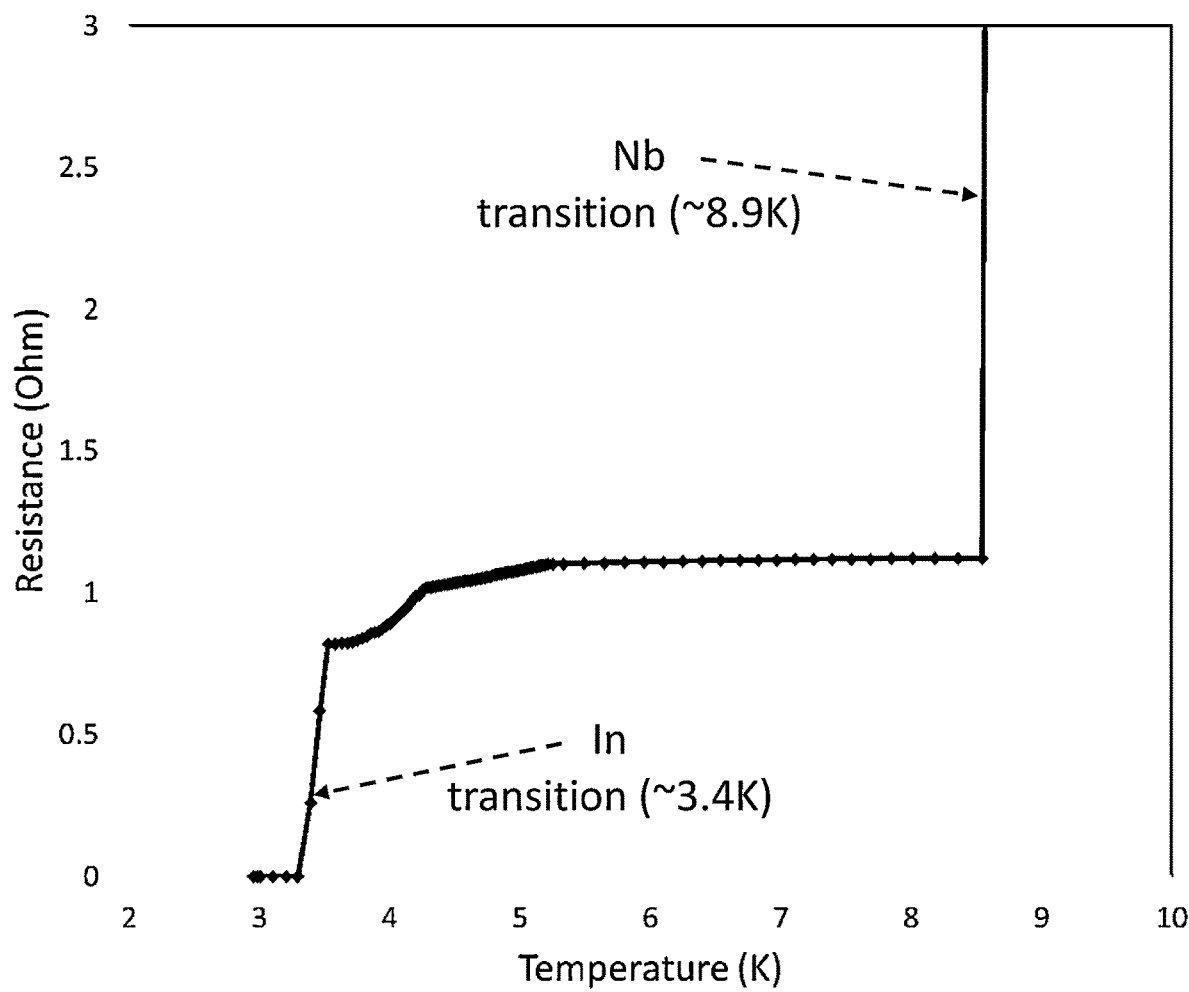
FIG. 13 shows a measurement of the resistance of a series of bonds as a function of cryogenic temperature.

FIG. 13 shows the resistance of a series of In bonds as a function of temperature. The resistance drops sharply when the Nb goes superconducting at 9° K, and drops to zero when the In goes superconducting at 3.4° K.

Figure 14:
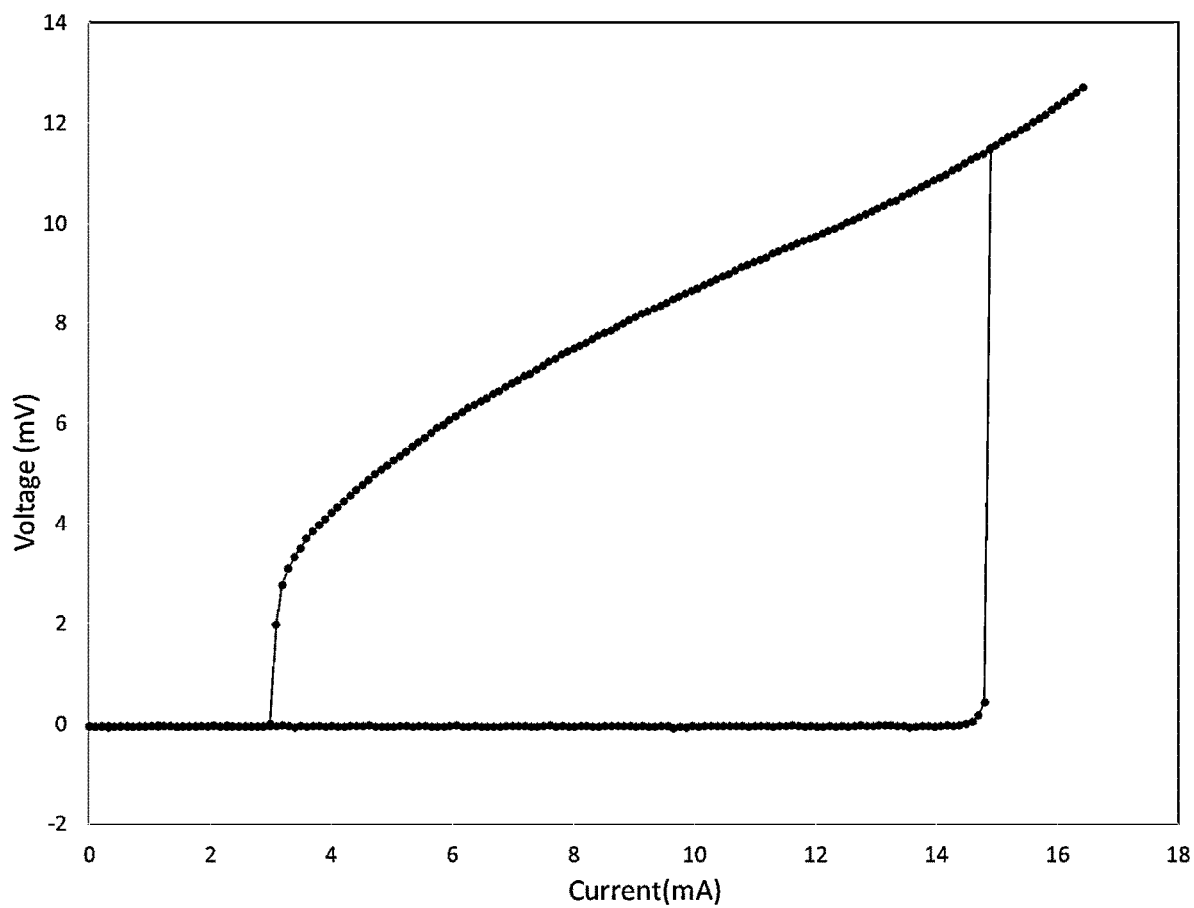
FIG. 14 shows a measurement of V(I) for a series of superconducting indium bonds, showing a large critical current.

FIG. 14 shows the current-voltage curve V(I) for a series of In bonds at 3° K, showing a sharp rise in voltage at the critical current of 15 mA. The large local power dissipation then heats up the In above its critical temperature 3.4° K, until the current is lowered down to 3 mA, when the voltage drops to zero. This sort of hysteresis related to local heating is characteristic of current-driven transitions in superconducting wires.

Figure 15:
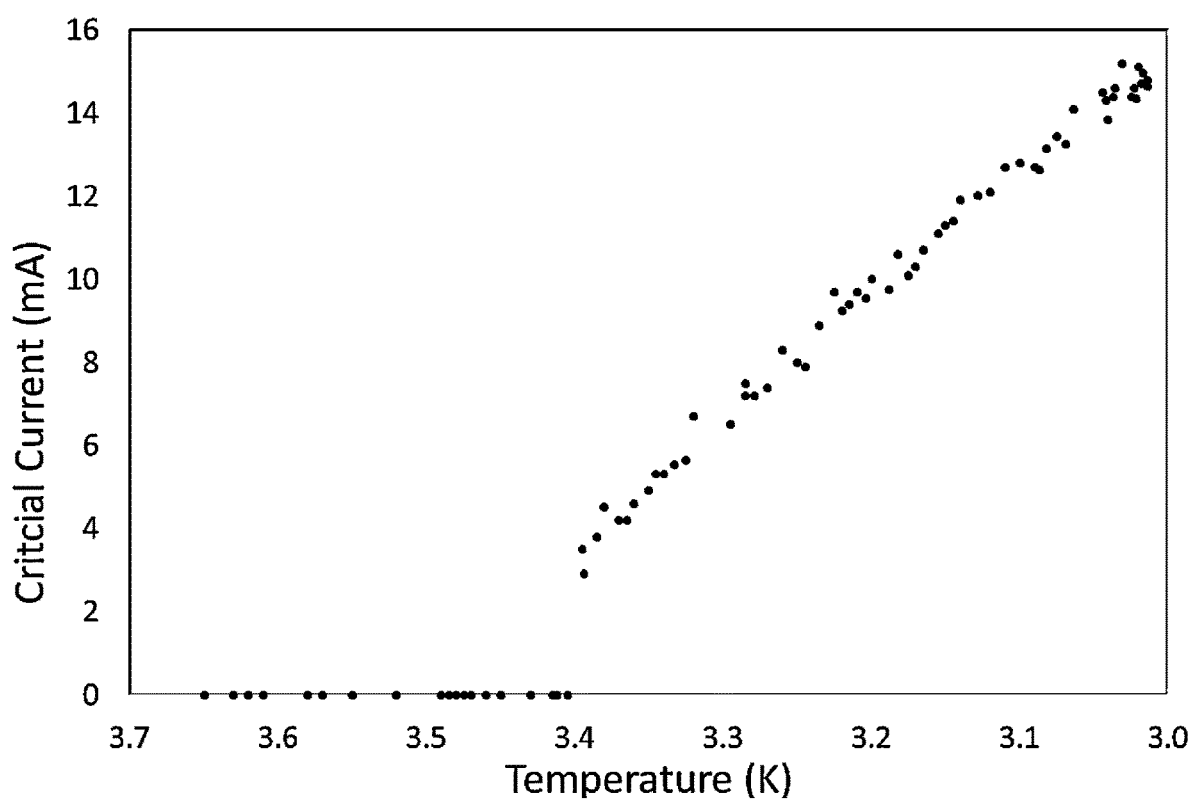
FIG. 15 shows a measurement of the superconducting critical current of a series of bonds as a function of cryogenic temperature.

FIG. 15 shows the critical current of In bonds as a function of temperature below 3.4° K, showing a typical dependence rising as the temperature is cooled further. Any operating temperature at about 3° K or below would be compatible with fully superconducting interconnects.

These tests were carried out for chips mounted on a cryocooler, a cryogenic refrigerator that uses helium as a working fluid, designed to cool down to temperatures as low as 3° K. Even lower temperatures can be achieved if the working fluid comprises the isotope helium-3, especially if the refrigerator is configured as a helium dilution refrigerator, which can achieve temperatures less than 0.1° K.

The tests based on the chips fabricated according to the disclosed optimized processes and parameters demonstrated very high yields on multiple chips, each with thousands of bonds. Further, the results were duplicated with multiple thermal cycles between room temperature and 3° K, indicating robust and reproducible contacts.

Figure 16:
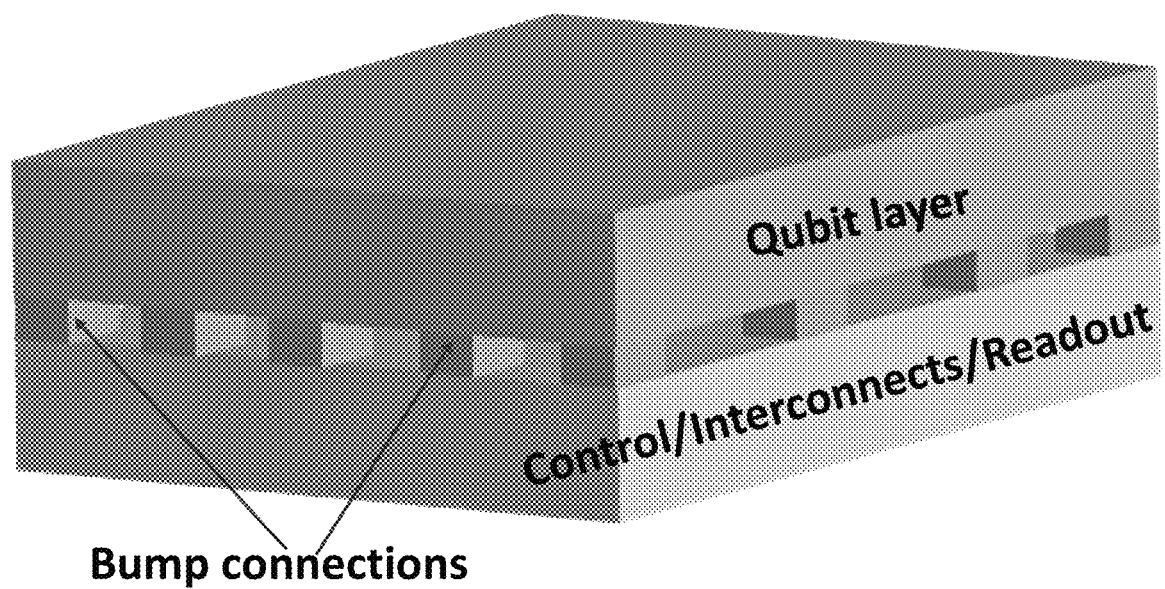
FIG. 16 shows a conceptual picture of a set of two bonded chips for a quantum computing application.

FIG. 16 provides a conceptual picture of a two-chip package, where one chip comprises superconducting quantum bits (qubits), and the other comprises single-flux-quantum control and readout circuits. Each of these chips might be manufactured with a distinct process, as long as both may be combined with indium bump bonds and copper posts. For example, the qubit chip might be prepared using aluminum Josephson junctions and NbTi wiring for transmon qubits, while the control chip might be prepared with Nb Josephson junctions and Nb wiring for energy-efficient SFQ circuits. The entire package could operate at very low temperatures (much less than 1° K) typical of superconducting quantum computing. Further, a three-dimensional quantum computing package need not be limited to two chips. One could also have a multi-chip module comprising a plurality of flip chips on a single carrier.

Figures 17A, 17B:
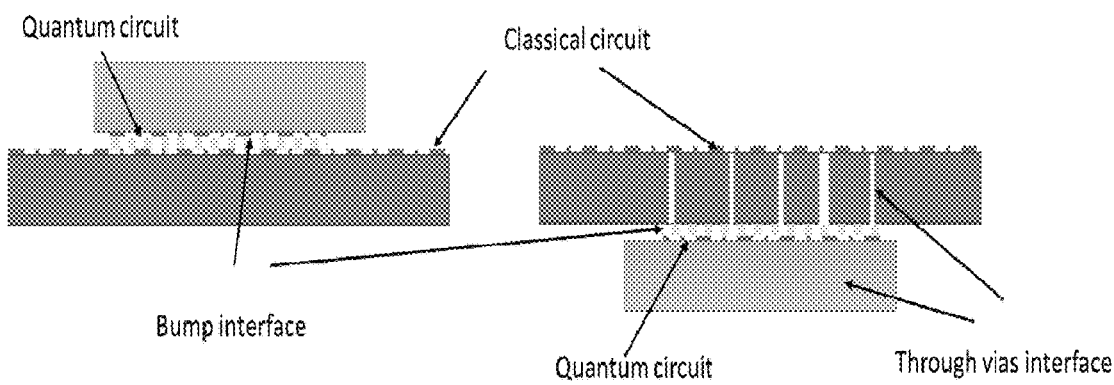
FIGS. 17A-17D show four alternative configurations for bonding a quantum circuit to a classical circuit.

A further set of preferred embodiments for quantum-classical MCMs is illustrated in FIGS. 17A-17D. The simplest of the configurations is shown in FIG. 17A, where the quantum circuits at the bottom of the quantum chip are in close proximity to the classical circuits of the classical chip. There may be a concern that classical SFQ circuits may generate some hot electrons (excited quasiparticles), which may migrate to the quantum circuits and degrade their performance. However, as mentioned above, the presence of the copper posts in the bonds between the classical and quantum circuits may tend to trap at least a significant fraction of the excited quasiparticles, keeping them from contaminating the quantum circuits.

Figures 17C, 17D:
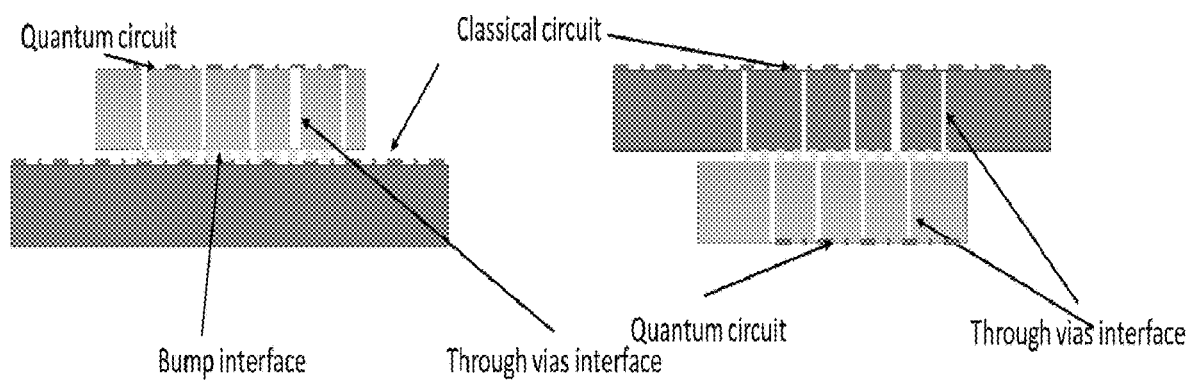

Furthermore, the classical and quantum circuits may be further separated by placing them on opposite sides of the chips, as shown in FIGS. 17B, 17C, and 17D. This would likely reduce further any remaining deleterious effects of the excited quasiparticles. These latter structures may be somewhat more complex to manufacture, requiring etching through-wafer vias, but similar vias are well known in silicon chip manufacturing. These through-wafer vias can be coated with a superconducting film, such as Nb, Al, or In, enabling a superconducting bias current or electrical signal to be transmitted from one side of the chip to the other, without loss or dissipation. Depending on the desired configuration, the through vias may be present in either the classical chip, or the quantum chip, or both. In some cases, it may be desirable to include circuits on both sides of one or more chips.

An alternative application of this packaging technology might be for classical supercomputers, with large numbers of superconducting microprocessors operating in parallel at frequencies of 50-100 GHz. This would also require close integration with cryogenic fast cache memory chips in the same cryogenic environment. One can envision, for example, a set of multi-chip modules, each comprising both cryogenic processors and memory, as well as cryogenic input-output chips that communicate to slower processors and memory at higher temperatures.

A further alternative application of this packaging technology might be for superconducting sensor arrays, which have been demonstrated for magnetic field detection, imaging arrays for astronomy and high-energy physics, and biomedical imaging. Such sensor arrays may further be integrated with superconducting digitizers, digital signal processors, and digital controllers, preferably in the same cryogenic environment as the sensors. This would require a set of multi-chip modules combining sensor chips with digital processing chips.

While superconducting multichip modules and indium bonding have been disclosed in the prior art, the present technology presents a substantial improvement. Much of the prior art focuses on solder reflow at moderately high temperatures, which would alter the precise parameters of the sensitive Josephson junctions on the chips. Other prior art uses unheated cold-welding of indium, which we have found is impractical for scaling to large numbers of bonds, because that would require pressures that are so large as to risk damaging or cracking the chips or substrates. We have found that a good compromise is an intermediate processing temperature about 75-125° C., but preferably less than 150° C., where the indium is somewhat softer, and neither the temperature nor the pressure risks damage to the chips.

Another aspect of the prior art of indium bonding is that diffusion and alloying was favored, because the alloy is harder and achieves a more rigid bond. On the contrary, the present invention attempts to reduce or eliminate diffusion and alloying using a diffusion stopping layer (DSL) between the indium and all other metals. This suppresses the formation of brittle intermetallics that would limit plastic flow of the In around the Cu post. Also, the preferred DSL is also superconducting (such as NbN and TiN), so that it may form a sharp superconducting interface between the In and the Nb.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

What is claimed is:

1. A superconducting multi-chip module, comprising:
   a first chip comprising a plurality of coupled superconducting qubits, superconducting electromagnetic sensors, or cryogenic memory elements;
   a second chip comprising a plurality of Josephson junctions configured to generate single-flux-quantum pulses to control and read out the qubits, sensors, or memory elements on the first chip; and
   a plurality of alignment posts and deformable metal contacts configured to form electrical bump bonds coupling the first chip and the second chip, the electrical bump bonds being formed by pressure on the deformable metal contacts below a melting temperature of the deformable metal,
   wherein the bonds remain stable with respect to repeated cycling between room temperature and a cryogenic operating temperature of the plurality of coupled superconducting qubits, superconducting electromagnetic sensors, or cryogenic memory elements.

2. The superconducting multi-chip module of claim 1, wherein the first chip comprises a quantum computing circuit.

3. The superconducting multi-chip module of claim 2, wherein the first chip comprises transmon qubits.

4. The superconducting multi-chip module of claim 2, wherein the first chip is configured to operate at a temperature less than 1 K.

5. The superconducting multi-chip module of claim 2, wherein the alignments posts are not superconducting at an operating temperature of the quantum computing circuit, and serve to thermalize excited quasiparticles in the quantum computing circuit.

6. The superconducting multi-chip module of claim 1, wherein the first chip comprises a cryogenic imaging array, and the second chip comprises a digital readout system matched to the cryogenic imaging array.

7. The superconducting multi-chip module of claim 6, wherein the cryogenic imaging array comprises a plurality of SQUIDs.

8. The superconducting multi-chip module of claim 6, wherein the cryogenic imaging array comprises an electromagnetic imaging sensor for astronomy or high-energy physics.

9. The superconducting multi-chip module of claim 1, wherein the first chip comprises a cryogenic memory array, and the second chip comprises a superconducting digital processor.

10. The superconducting multi-chip module of claim 1, wherein the second chip is mounted in a flip-chip configuration on the first chip.

11. The superconducting multi-chip module of claim 1, wherein at least one of the first chip and the second chip comprises through-chip superconducting vias, configured to bond without direct contact of the circuits on the first chip and the second chip.

12. The superconducting multi-chip module of claim 1, wherein the deformable metal contact comprises indium and the alignment posts comprise at least one of copper, gold, and silver.

13. The superconducting multi-chip module of claim 1, further comprising a superconducting diffusion-stopping layer deposited between the alignment posts and the deformable metal contact.

14. The superconducting multi-chip module of claim 13, wherein the superconducting diffusion-stopping layer comprises niobium nitride or titanium nitride.

15. The superconducting multi-chip module of claim 1, wherein the second chip comprises Josephson junctions comprising at least one of niobium, niobium nitride, niobium-titanium, aluminum, molybdenum, and titanium.

16. The superconducting multi-chip module of claim 1, wherein the plurality of alignment posts and deformable metal contacts comprise thousand of bonds, each less than 30 micrometers in diameter.

17. The superconducting multi-chip module of claim 1, wherein the electrical bump bonds are strengthened with epoxy.

18. The superconducting multi-chip module of claim 1, where the deformable metal contacts have a critical current of at least 10 mA at an operating temperature of less than 3 K.

19. A superconducting multi-chip module, comprising:
    a first chip comprising a plurality of coupled superconducting qubits, superconducting electromagnetic sensors, or cryogenic memory elements;
    a second chip comprising a plurality of Josephson junctions configured to generate single-flux-quantum pulses to control and read out the qubits, sensors, or memory elements on the first chip; and
    a plurality of bonds on alignment posts,
    wherein the plurality of bonds each comprise a deformable metal bonded under pressure at a temperature under 150° C. without melting of the deformable metal,
    wherein the bonds remain stable with respect to repeated cycling between room temperature and a cryogenic operating temperature of the a plurality of coupled superconducting qubits, superconducting electromagnetic sensors, or cryogenic memory elements.

20. The superconducting multi-chip module of claim 19, wherein the chips are reversibly unbonded and rebonded without damage to the first chip or the second chip.

21. The superconducting multi-chip module of claim 19, wherein the plurality of coupled superconducting qubits, superconducting electromagnetic sensors, or cryogenic memory elements comprise a plurality of transmon qubits configured to operate at a temperature less than 1 K; and the alignments posts are not superconducting at 1 K, and serve to thermalize excited quasiparticles in the first chip.

22. A method of forming a superconducting multi-chip module, comprising:
    providing a first chip comprising a plurality of coupled superconducting qubits, superconducting electromagnetic sensors, or cryogenic memory elements, and having a plurality of first alignment posts capped with a deformable metal;
    providing a second chip comprising a plurality of Josephson junctions configured to generate single-flux-quantum pulses to control and read out the qubits, sensors, or memory elements on the first chip, and having a plurality of second alignment posts capped with a deformable metal;

aligning the first alignment posts with the second alignment posts; and compressing the first chip against the second chip, with the first alignment posts with the second alignment posts aligned, at a temperature of less than 150° C., to form a bond wherein the plurality of electrically conductive mechanical bonds, each comprise a deformable metal bonded under pressure at a temperature under 150° C. without melting of the deformable metal, and wherein the plurality of electrically conductive mechanical bonds remain stable with respect to repeated cycling between room temperature and a cryogenic operating temperature of the a plurality of coupled superconducting qubits, superconducting electromagnetic sensors, or cryogenic memory elements.

* * * * *